United States Patent
Saito et al.

(10) Patent No.: US 7,858,415 B2
(45) Date of Patent: Dec. 28, 2010

(54) PRODUCTION METHODS OF PATTERN THIN FILM, SEMICONDUCTOR ELEMENT, AND CIRCUIT SUBSTRATE, AND RESIST MATERIAL, SEMICONDUCTOR ELEMENT, AND CIRCUIT SUBSTRATE

(75) Inventors: Yuichi Saito, Nara (JP); Takeshi Hara, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 315 days.

(21) Appl. No.: 11/918,398

(22) PCT Filed: Jan. 31, 2006

(86) PCT No.: PCT/JP2006/301581

§ 371 (c)(1),
(2), (4) Date: Oct. 12, 2007

(87) PCT Pub. No.: WO2006/117909

PCT Pub. Date: Nov. 9, 2006

(65) Prior Publication Data

US 2009/0078937 A1    Mar. 26, 2009

(30) Foreign Application Priority Data

Apr. 28, 2005  (JP) .............................. 2005-133244

(51) Int. Cl.
*H01L 21/84* (2006.01)
(52) U.S. Cl. .................. 438/34; 438/158; 257/E21.414
(58) Field of Classification Search .......... 257/E21.242, 257/E21.252, E21.256, E21.414, 59, E27.111; 438/160, 149, 586, 725, 708, 709, 669, 34, 438/158; 430/270.1, 319, 323, 324
See application file for complete search history.

(56) References Cited

U.S. PATENT DOCUMENTS 5,989,945 A    11/1999    Yudasaka et al.

(Continued)

FOREIGN PATENT DOCUMENTS

JP    64-37535 A    2/1989

(Continued)

OTHER PUBLICATIONS

C. W. Kim et al., SID 00 Digest, (U.S.), Society for Information Display, 2000, vol. 31. first edition, pp. 1006-1009.
Nikkei electronics, issued on Jun. 17, 2002, Nikkei Business Publications, Jun. 17, 2002, No. 824, pp. 67-78.
Takeo Kawase, et al., SID 01 Digest, (U.S.), Society for Information Display, 2001, vol. 32, first edition, pp. 40-43.

(Continued)

*Primary Examiner*—Evan Pert
(74) *Attorney, Agent, or Firm*—Birch, Stewart, Kolasch & Birch, LLP

(57) ABSTRACT

The present invention provides production methods of a pattern thin film, a semiconductor element and a circuit substrate, capable of eliminating the number of photolithography processes needed for patterning; and a semiconductor element, a circuit substrate, and an electron device obtained by the production methods. The production method of the pattern thin film of the present invention is a production method of a pattern thin film, comprising the steps of: forming a first resist pattern film on a thin film formed on a substrate; forming a second resist pattern film; patterning the thin film using at least the second resist pattern film, wherein in the step of forming the second resist pattern film, a fluid resist material or an organic solvent is applied on a groove of a bank pattern formed using the first resist pattern film.

17 Claims, 51 Drawing Sheets

U.S. PATENT DOCUMENTS

| | | |
|---|---|---|
| 2001/0048491 A1 | 12/2001 | Tanaka et al. |
| 2001/0053570 A1* | 12/2001 | Kido .................. 438/149 |
| 2002/0074547 A1 | 6/2002 | Yudasaka et al. |
| 2002/0100908 A1 | 8/2002 | Yudasaka et al. |
| 2002/0151171 A1* | 10/2002 | Furusawa ............. 438/660 |
| 2002/0179906 A1 | 12/2002 | Yudasaka et al. |
| 2003/0003231 A1 | 1/2003 | Kiguchi et al. |
| 2003/0134519 A1 | 7/2003 | Yudasaka et al. |
| 2004/0048001 A1 | 3/2004 | Kiguchi et al. |
| 2004/0129978 A1 | 7/2004 | Hirai |
| 2004/0147066 A1* | 7/2004 | Yamazaki et al. .......... 438/151 |
| 2004/0201048 A1 | 10/2004 | Seki et al. |
| 2004/0263564 A1 | 12/2004 | Maekawa et al. |
| 2005/0117082 A1 | 6/2005 | Tanaka et al. |
| 2005/0146588 A1 | 7/2005 | Kiguchi et al. |
| 2006/0086937 A1 | 4/2006 | Fujii et al. |
| 2007/0161163 A1 | 7/2007 | Hirai |

FOREIGN PATENT DOCUMENTS

| | | |
|---|---|---|
| JP | 11-204529 A | 7/1999 |
| JP | 2000-353594 A | 12/2000 |
| JP | 2002-55363 A | 2/2002 |
| JP | 2002-268235 A | 9/2002 |
| JP | 2004-247704 A | 9/2004 |
| JP | 2004-288880 A | 10/2004 |
| JP | 2004-349640 A | 12/2004 |
| JP | 2005-051216 A | 2/2005 |
| WO | WO-97/43689 A1 | 11/1997 |

OTHER PUBLICATIONS

Nikkei Micro Device edition, "Flat Panel Display 1999", Nikkei Business Publications, 1998, p. 129.

* cited by examiner (a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

PRODUCTION METHODS OF PATTERN THIN FILM, SEMICONDUCTOR ELEMENT, AND CIRCUIT SUBSTRATE, AND RESIST MATERIAL, SEMICONDUCTOR ELEMENT, AND CIRCUIT SUBSTRATE

TECHNICAL FIELD

The present invention relates to production methods of a pattern thin film, a semiconductor element, and a circuit substrate, and a resist material, a semiconductor element, a circuit substrate, and an electron display. More specifically, the present invention relates to: a pattern thin film-producing method preferable for production of a fine pattern thin film; a semiconductor element-producing method preferable for production of a thin film transistor and the like; a circuit substrate-producing method preferable for production of an active matrix substrate and the like; a resist material preferably applied with an injection device such as an ink jet device; a semiconductor element such as a thin film transistor; a circuit substrate such as an active matrix substrate; and an electron device such as an imaging device, an image input device, and a display device.

BACKGROUND ART

Photolithography is generally employed if a precise pattern wiring or a fine pattern thin film used in a display application and the like needs to be formed with high accuracy on substrates such as a semiconductor substrate typified by a silicon (Si) substrate, a glass substrate typified by an alkali glass substrate and a non-alkali glass substrate, a glass-epoxy substrate used as a print wiring substrate, a flexible substrate, and a plastic substrate widely used in a display application and the like.

In common photolithography, a resist material having photosensitivity (photoresist material) is first applied over the entire surface of the substrate and thermally treated to form a resist film. Then, the resist film is exposed using an exposure device such as a step type projection exposure device (stepper) and a photomask having a specific pattern. Then, development is performed using a developer containing an organic alkali and the like, and thereby a resist pattern film is formed on the substrate. Then, using this resist pattern film as a mask, the substrate is exposed to etching atmosphere by a wet-etching method or a dry-etching method. As a result, the thin film on the substrate is processed to have a specific pattern. The resist pattern film is removed by a remover containing an organic solvent and the like at an appropriate stage.

In such photolithography, it is advantageous for the production that the number of times the resist pattern is prepared is reduced as much as possible. Attempts to reduce the number of times the resist pattern film is prepared by optimizing a structure of a desired device, wiring, and the like, have been made so far, and attempts employing an exposure method also have been made.

For preparation of a TFT (Thin Film Transistor) array substrate used in a liquid crystal display device and the like, a method of locally thinning a resist pattern film using a photomask having a slit pattern (halftone exposure method) was proposed (for example, refer to Nonpatent Document 1). In this case, the resist pattern film is formed and then a first etching treatment is provided for the substrate. Then, the resist pattern film at a halftone exposure part is removed, and a second etching treatment is further performed. If the thin film on the substrate is subjected to the two-step process in such a manner, the number of photolithography processes which is generally twice can be reduced to one, although the pattern is restricted, in comparison to the case where the photolithography process is simply performed twice. Such a halftone exposure method is employed to form a TFT channel in Nonpatent Document 1.

A method using such a halftone exposure method and a reflow method in combination was also disclosed (for example, refer to Patent Document 1). This is a method in which a resist pattern is left to have an island shape near a source electrode and a drain electrode, and then deformed using organic solvent steam, thereby forming a semiconductor having an island shape.

It has been recently proposed that an ink-jet technology which has been developed in a printer application is used for preparation of circuit substrates. This is a technology of forming a metal film having a pattern and the like directly on a substrate by an ink-jet method. It has been proposed that this technology is used for preparation of wirings or passive elements (condenser, resistance, inductor, and the like). In this technology, a droplet containing metal fine particles for preparation of wirings or a droplet containing a metal oxide material and the like for preparation of condensers and the like, is added dropwise with an ink-jet device, and thereby wirings and/or passive elements are formed at a specific position on a substrate (for example, refer to Nonpatent Document 2).

A technology of forming an insulating layer or a passivation insulating layer in a TFT (thin film transistor) by applying a fluid material and performing heat treatment was disclosed (for example, refer to Patent Document 2).

In the ink-jet method, a method of providing a substrate with a pretreatment in advance before addition of a droplet also has been proposed. Such a method is aimed to reduce position accuracy when an added droplet is landed on the substrate (landing accuracy) or to improve the process speed by reducing the number of needed droplets. In this technology, a region showing lyophilicity for a material for forming a wiring and a region showing lyophobicity for it are formed on a substrate where the wiring is formed, and a droplet of the material for forming a wiring is added into the lyophilic region by an ink-jet method (for example, refer to Patent Document 3). An exposure device, a photomask, and the like are used for forming these lyophilic and lyophobic regions.

In addition, it is also disclosed that similarly in the wiring-forming technology by an ink-jet method, a bank is formed to surround a wiring-formed region and an upper part of this bank is provided with lyophobicity and the wiring-formed region is provided with lyophilicity, in order to suppress the material for the wiring from flowing out of the wiring-formed region (for example, refer to Patent Document 4). Also in preparation of this bank, a resist material having photosensitivity, an exposure device, a photomask, and the like, are used.

A technology of forming a TFT using only organic matters by an ink-jet method was also disclosed (for example, refer to Nonpatent Document 3).

If such an ink-jet method is used, a fluid material that is a material for a film to be formed is needed. However, a special production method is needed in order to obtain a film having characteristics equal to those of a film formed using a conventional vacuum deposition device, by a sputtering method or a CVD method. Therefore, such a method has not replaced the conventional method yet.

Further, it has been also proposed that using an ink-jet method, not the fluid material that is a material for a film to be formed but a resist material for forming a mask used when processing a thin film and the like on the substrate is added dropwise. This is a method of patterning a semiconductor layer of a TFT using a resist film which is formed by dropwise addition with an ink-jet method as a mask (for example, refer to Patent Document 5).

A TFT array substrate may be mentioned as a circuit substrate prepared through many photolithography processes, for example. The TFT array substrate includes a source wiring, a gate wiring, a TFT as a switching element connected to these wirings on a substrate, and is preferably used in a liquid crystal display device, and the like, for example. This TFT array substrate is produced through a series of steps shown in Nonpatent Document 4, and five or more photolithography processes are generally needed for production of the TFT array substrate.

[Patent Document 1]

Japanese Kokai Publication No. 2002-55363

[Patent Document 2]

WO 97/43689

[Patent Document 3]

Japanese Kokai Publication No. Hei-11-204529

[Patent Document 4]

Japanese Kokai Publication No. 2000-353594

[Patent Document 5]

Japanese Kokai Publication No. 2004-247704

[Nonpatent Document 1]

C. W. Kim, et al., "A Novel Four-Mask-Count Process Architecture for TFT-LCDs", SID 00 DIGEST, (U.S.), Society for Information Display, 2000, vol. 31, first edition, p. 1006 to 1009.

[Nonpatent Document 2]

Nikkei electronics, issued on Jun. 17, 2002, Nikkei Business Publications, Jun. 17, 2002, No. 824, p. 67 to 78.

[Nonpatent Document 3]

Takeo Kawase, et al., "Invited Paper: All-Polymer Thin Film Transistors Fabricated by High-Resolution Ink-jet Printing", SID 01 DIGEST, (U.S.), Society for Information Display, 2001, vol. 32, first edition, p. 40-43.

[Nonpatent Document 4]

Nikkei Micro Device edition, "Flat Panel Display 1999", Nikkei Business Publications, 1998, p. 129.

DISCLOSURE OF THE INVENTION

As mentioned above, the photolithography is generally used for production of a pattern thin film on a substrate, particularly if a fine pattern or high accuracy is needed. Examples of common disadvantages of use of the photolithography include that a large amount of chemicals such as a resist material, a developer for development, a resist remover is used because a resist material having photosensitivity is applied on the entire surface of a substrate; and that a high-accuracy device is needed as a device for applying the resist material, an exposure device, and the like. Therefore, the use of the commonly used photolithography involves increase in environmental loads, material costs, and/or large equipment investment costs. Therefore, reduction in the number of photolithography processes is an important problem in production of circuit substrates or devices.

Particularly in production of a TFT array substrate, reduction in the number of photolithography processes is an important issue because many thin films are formed on a large substrate. In such a TFT array substrate production, as mentioned above, reduction in the number of photolithography processes by a halftone exposure method has been proposed, for example, as in Nonpatent Document 1. However, in the halftone exposure method, it is difficult to stably form a resist film having a desired shape and film thickness at a halftone exposure part because exposure conditions and developing conditions are difficult to control. Therefore, if a TFT channel is formed by the halftone exposure method, as in Nonpatent Document 1, the shape of the TFT channel formed at the halftone exposure part tends to vary in the substrate surface and an internal capacitance of the TFT part, that is, a capacity between electrodes of the TFT, for example, a capacity between a gate electrode and a drain electrode, tends to vary. Further, the resist pattern film on the entire substrate is retreated when the resist film at the halftone exposure part is removed. This retreat degree tends to vary in the substrate surface. Accordingly, a width of a wiring such as a source wiring, formed using this retreated resist pattern film as a mask, also tends to vary. Such variation tends to cause display unevenness if a TFT array substrate is prepared by this method and used in a display device. Therefore, such a method has room for improvement. Therefore, a conventional halftone exposure method such as the method disclosed in Nonpatent Document 1 is not a method commonly used for forming a high-definition pattern thin film.

Also according to a method using the halftone exposure method and the reflow method in combination, as in Patent Document 1, the number of photolithography processes can be reduced, but sufficient pattern accuracy can not be obtained if a resist pattern film is formed by the halftone exposure method. Therefore, this method has a difficulty particularly in stable formation of a high-accuracy pattern in a TFT array substrate. Accordingly, if this method is used to produce a TFT, element characteristics vary among TFTs depending on position variation and/or shape variation. In this point, such a method has room for improvement.

In addition, in a system of adding dropwise a resist material by an ink-jet method, thereby forming a mask for process, as in Patent Document 5, the number of photolithography processes can be reduced, but can not provide sufficient landing accuracy of a resist droplet added using an ink-jet device, particularly if a fine pattern or high accuracy is needed in production of a TFT array substrate, and the like. Therefore, such a system is difficult to use. Accordingly, if this method is used for producing a TFT, element characteristics vary among TFTs depending on position variation and/or shape variation. In this point, such a method has room for improvement.

The present invention has been made in view of the above mentioned state of the art. The present invention has an object to provide: production methods of a pattern thin film, a semiconductor element and a circuit substrate, which can reduce the number of photolithography processes needed for patterning; a resist material used therein; and a semiconductor element, a circuit substrate, and an electron device, obtained using the production methods.

The present inventors made various investigations on production methods of a pattern thin film, which can reduce the number of photolithography processes needed for patterning. The inventors noted a first resist pattern film formed in a first photolithography process in the photolithography process which is conventionally performed twice, and noted that a thin film after etching performed using the first resist pattern film as a mask is used in a second photolithography process.

The inventors found that if a fluid resist material is applied on a groove of a bank pattern formed using the first resist pattern film in a step of forming a second resist pattern, the second resist pattern can be formed with high accuracy even by coating and the second photolithography process can be omitted. Therefore, the inventors found that in formation of a semiconductor element such as a thin film transistor, for example, if a resist pattern film is formed by applying a fluid resist material inside a channel groove formed above a channel region after channel etching or inside a resist groove formed using the first resist pattern film above a channel region before channel etching in a process of forming a multilayer structure of a source electrode, a drain electrode, and a semiconductor layer constituting the semiconductor element with a semiconductor layer, a conductive film and a semiconductor film are patterned through one photolithography process, and thereby a multilayer structure of the source electrode, the drain electrode, and the semiconductor layer can be formed, and in addition, the shape variation among the semiconductor layers can be sufficiently suppressed and the characteristic variation among the semiconductor elements can be sufficiently suppressed. As a result, the above-mentioned problems can be admirably solved, leading to completion of the present invention.

That is, the present invention is a production method of a pattern thin film, including the steps of: forming a first resist pattern film on a thin film formed on a substrate; forming a second resist pattern film; patterning the thin film using at least the second resist pattern film, wherein in the step of forming the second resist pattern film, a fluid resist material is applied on a groove of a bank pattern formed using the first resist pattern film.

In the present description, the pattern film is not especially limited as long as it is a film having some kinds of a planar shape (pattern) other than a film formed on the entire substrate, and may consist of one layer or two or more layers. It is sufficient that the above-mentioned resist pattern film is a pattern film which does not remain in the last state after completion of the production steps. Such a resist pattern film is formed on a thin film and can be used as a mask for processing (patterning) the thin film. The above-mentioned resist pattern film may not be necessarily prepared using a resist material having photosensitivity (photoresist material), a photomask, and the like. That is, the above-mentioned resist pattern film may be a film formed using a resist material having photosensitivity (photoresist material) or may be a film formed using a resist material not having photosensitivity. Therefore, for example, the first resist pattern film may be formed by a photolithography technology using a resist material having photosensitivity and a photomask or simply formed by a printing method such as a screen printing.

The pattern thin film produced in the present invention is not especially limited as long as at least one thin film formed on the substrate is formed by patterning using at least the second resist pattern film, that is, by a treatment of changing the planar shape (pattern), and is not limited by its thickness. Therefore, the pattern thin film produced in the present invention may have a film thickness smaller than that of the first resist pattern film or the second resist pattern film.

The above-mentioned bank pattern means one which includes a structure having a height (bank) and a depression (groove) formed between the structures and has a planar shape (pattern) capable of exhibiting a functional effect of suppressing the fluid material from spreading. Specifically, the above-mentioned bank pattern formed using the first resist pattern film includes: (1) a bank which is the first resist pattern film, (2) a bank which is a first resist pattern film-including pattern film formed by etching using the first resist pattern film as a mask, or (3) a bank which is a pattern film formed by performing etching using the first resist pattern film as a mask and removing the first resist pattern film; and a groove corresponding to such a bank.

According to the present invention, the shape of the second resist pattern film can be controlled using the first resist pattern film. The first resist pattern film can be a control pattern for controlling the pattern after the resist material is added dropwise if an appropriate first resist pattern is previously disposed near the position where the resist material for forming the second resist pattern film is added dropwise. In such a case, a region on the substrate where the first resist pattern film is formed and a region on the substrate where the second resist pattern film is formed have a mutually overlapping region and/or a mutually connecting region.

In the present invention, the first resist pattern film is prepared by a method such as photolithography, and the second resist pattern film is further formed by application on the substrate. Accordingly, the two-step patterning process can be provided for the thin film on the substrate, and therefore in some thin film patterns to be formed, a process that is equivalent to two photolithography processes can be performed. In addition, the second resist pattern film is formed by selectively applying the fluid resist material on the groove of the bank pattern on the substrate. Therefore, loss of the resist material can be reduced in comparison to the case where the resist film is formed on the entire surface of the substrate and then patterned to form a resist pattern film. Further, neither exposure step nor developing step is needed and therefore a photomask, an exposure device, and a developer can be reduced. That is, the pattern is restricted in some cases, but if a desired pattern can be formed by the method of the present invention, two photolithography processes can be reduced to one, which can also reduce the exposing steps and the developing steps to one. Therefore, the present invention permits reduction in environmental loads, material costs, and equipment investment costs, in the production (process) of the thin film.

Specific examples of the method according to the present invention include a method in which after the first resist pattern film is prepared, a patterning (etching) process is provided for the thin film on the substrate, and then the second resist pattern film is formed and a patterning (etching) process is performed. According to this, the thin film on the substrate can be processed to have a pattern having two portions with different film thicknesses. The second resist pattern film may be prepared to have a thickness smaller than that of the first resist pattern film, when the first resist pattern film is prepared and successively the second resist pattern film is prepared. In this case, a resist pattern film equivalent to a film formed by a half exposure method in which the substrate surface is exposed using different light amounts can be obtained. Also in this case, the two-step patterning process can be provided for the thin film on the substrate.

Preferable embodiments in the production method of the pattern thin film according to the present invention are mentioned below.

It is preferable that the bank pattern has an open end. That is, it is preferable that not the entire outer edge of the above-mentioned groove of the bank pattern is surrounded by the bank. In such a case, even if the fluid resist material applied on the groove of the bank pattern slightly flows outside of the groove of the bank pattern immediately after applied, the resist material can be kept inside the groove of the bank pattern by surface tension of the resist material when the resist material is dried. Preferable embodiments of the bank pattern having an open end include an embodiment in which the bank pattern has a pair of banks and an open end is disposed on the both ends side of the bank. In this case, the resist pattern film can be formed by a method of adding the fluid resist material into a space between the pair of electrodes. For example, a thin film element such as a thin film transistor (TFT) can be produced through a smaller number of steps in comparison to a conventional method.

It is preferable that the thin film formed on the substrate includes two or more layers. For example, a thin film formed by stacking a metal layer and a semiconductor layer is preferably used in production of a semiconductor element. Accordingly, a part of the element can be formed using a plurality of layers made of substances having different electrical characteristics.

It is preferable that in the step of forming the first resist pattern film, a resist material having photosensitivity is used and exposure is performed using a photomask. In this case, the first resist pattern film is formed by a very high-accuracy method, and therefore can function as a control pattern used in formation of the second resist pattern film, with accuracy. Therefore, the second resist pattern film with high accuracy can be formed. As a result, a semiconductor element such as a thin film transistor, which has high accuracy and characteristics hardly varied, can be prepared. A resist material having photosensitivity or a resist material not having photosensitivity may be used as a material for the second resist pattern film.

It is preferable that the production method of the pattern thin film includes a plasma surface treatment step between the step of forming the first resist pattern film and the step of forming the second resist pattern film. That is, in the present invention, the second resist pattern film is formed by selectively applying the resist material, and therefore it is preferable that a surface treatment is previously provided for the substrate before the application to adjust a lyophilic or lyophobic property for the resist material. As a result, the resist material that is a material for the second resist pattern film is prevented from conforming to the substrate surface and spreading excessively, and thereby the second resist pattern excellent in controllability can be formed. It is preferable that the plasma surface treatment step is performed in fluorine gas plasma. According to this, a surface having an excellent lyophobic property can be formed. The above-mentioned fluorine gas is not especially limited as long as it is a gas composed of a fluorine atom-containing compound. Carbon tetrafluoride and the like may be mentioned as such a fluorine gas.

It is preferable that the production method of the pattern thin film includes a step of patterning the thin film using the first resist pattern film between the step of forming the first resist pattern film and the step of forming the second resist pattern film. That is, the thin film on the substrate is patterned (etched) using the first resist pattern film before formation of the second resist pattern film. If the thin film on the substrate is subjected to the two-step process, such a method improves production efficiency because an etching treatment time can be reduced. It is preferable that the step of patterning the thin film using the first resist pattern film is performed by a dry-etching method. In this case, the surface treatment can be successively provided for the substrate in the same vacuum chamber after the dry etching, and therefore there is no need to additionally perform the surface treatment step. Therefore, such a method is efficient.

An embodiment in which the production method of the thin film includes a step of removing the first resist pattern film between the step of patterning the thin film using the first resist pattern film and the step of forming the second resist pattern film may be mentioned as a preferable embodiment of the present invention. If the second resist pattern is formed to be contact with or very closely to the first resist pattern film, the first resist pattern film may be deformed or dissolved by a solvent contained in the resist material for forming the second resist pattern film. Therefore, in some cases, the first resist pattern film should be removed. For formation of the second resist pattern film, the thin film processed to have a shape of the first resist pattern film can be used as a pattern for controlling the resist material selectively added dropwise, by utilizing the difference in thickness or material. Therefore, the controllability of the second resist pattern film can be improved even if the first resist pattern film is removed.

An embodiment in which the production method of the pattern thin film includes the steps of: after the step of forming the first resist pattern film and the step of forming the second resist pattern film, patterning the thin film using the first resist pattern film and the second resist pattern film; and removing the second resist pattern film. In this case, particularly if the second resist pattern film has a film thickness smaller than that of the first resist pattern film, a resist pattern film equivalent to a film formed by a half exposure method in which the substrate surface is exposed using different light amounts can be obtained and the thin film on the substrate can be subjected to the two-step patterning process. The first resist pattern film is removed after the second resist pattern film is removed.

It is preferable that in the step of forming the second resist pattern film, the fluid resist material is applied using an application device including a multi-nozzle injection head and a substrate stage. That is, if a plurality of the second resist pattern films is formed on the substrate, use of a device having, as a mechanism of injecting the resist material, a multi-nozzle injection head including many nozzles is advantageous because a process time for one substrate can be shortened. The substrate stage is not especially limited as long as the substrate can be placed on the substrate stage. The substrate stage preferably holds the substrate horizontally, and also preferably has a mechanism of moving and/or rotating the substrate.

It is preferable that the application device is an ink-jet device. Among them, more preferred are those in a piezo system and a bubble jet system (thermal jet system). The ink-jet device has been widely used particularly as a printer, and its technology has been built up. Therefore, the ink-jet device is preferably used for applying the resist material at a specific position on the substrate and selectively preparing the second resist pattern film.

In this case, it is preferable that the fluid resist material contains at least one ether, ester, diester, and/or ether ester selected from the group consisting of an ethylene glycol, a diethyleneglycol, a triethyleneglycol, a polyethylene glycol, a propyleneglycol, a dipropyleneglycol, a tripropylene glycol, a polypropylene glycol, and a butylene glycol, or a hydrocarbon, having a boiling point of 180° C. or more at 1 atmosphere. Among them, preferred examples of the above-mentioned ether, ester, diester, ether ester or hydrocarbon, having a boiling point of 180° C. or more at 1 atmosphere include tetralin (tetrahydronaphthalene), ethylene glycol, ethylene glycol diacetate, ethylene glycol diethyl ether, ethylene glycol dibutyl ether, ethylene glycol monoacetate, ethylene glycol monoethyl ether acetate, ethylene glycol monobutyl ether acetate, ethylene glycol monohexyl ether, 1,3-octylene glycol, glycerol triacetate, diethylene glycol, diethylene glycol ethyl methyl ether, diethylene glycol chlorohydrin, diethylene glycol diethyl ether, diethylene glycol dibutyl ether, diethylene glycol monoethyl ether, diethylene glycol monoethyl ether acetate, diethylene glycol monobutyl ether, diethylene glycol monobutyl ether acetate, diethylene glycol monomethyl ether, dipropylene glycol, dipropylene glycol monoethyl ether, dipropylene glycol monobutyl ether, dipropylene glycol monopropyl ether, dipropylene glycol monomethyl ether, tetraethylene glycol, triethylene glycol, triethylene glycol-di-2-ethyl butyrate, triethylene glycol dimethyl ether, triethylene glycol monoethyl ether, triethylene glycol monomethyl ether, triglycol dichloride, tripropyrene glycol, tripropylene glycol monomethyl ether, tripropylene glycol monoethyl ether, tripropylene glycol monobutyl ether, trimethylene glycol, 1,3-butanediol, propylene glycol, propylene glycol phenyl ether, hexylene glycol, and 1,5-pentanediol. The resist material containing such a solvent is hardly dried at near normal temperatures (20° to 30° C.) and therefore preferably applied by the ink-jet device. If the above-mentioned ether, ester, diester, and/or ether ester, or a hydrocarbon is used as a solvent of the resist material, the resist material containing such a solvent hardly dissolves or deforms another resist pattern film which is on the substrate to which the resist material is added dropwise. This is because the solvent has a relatively small dissolving power for the resin.

It is preferable that the fluid resist material contains novolak resin. The above-mentioned novolak resin is widely used as a component of a photoresist material coated on the entire surface. Also in the case where the coating is selectively performed as in the present invention, such a resin is used as a component, and thereby a common resist remover and a common removing process can be used. Therefore, the production method of the pattern thin film according to the present invention can be easily employed.

It is preferable that the fluid resist material contains novolak resin, and at least one ether, ester, diester, and/or ether ester selected from the group consisting of an ethylene glycol, a diethylene glycol, a triethylene glycol, a polyethylene glycol, a propylene glycol, a dipropylene glycol, a tripropylene glycol, a polypropylene glycol, and a butylene glycol, or a hydrocarbon. These resist materials are preferably applied selectively on the substrate to form the resist pattern film.

The present invention is also a fluid resist material containing novolak resin and at least one ether, ester, diester, and/or ether ester selected from the group consisting of an ethylene glycol, a diethylene glycol, a triethylene glycol, a polyethylene glycol, a propylene glycol, a dipropylene glycol, a tripropylene glycol, a polypropylene glycol, and a butylene glycol, or a hydrocarbon. These resist materials are preferably applied selectively on the substrate to form the resist pattern film.

The present invention is a fluid resist material containing novolak resin and at least one ether, ester, diester, and/or ether ester selected from the group consisting of an ethylene glycol, a diethylene glycol, a triethylene glycol, a polyethylene glycol, a propylene glycol, a dipropylene glycol, a tripropylene glycol, a polypropylene glycol, and a butylene glycol, or a hydrocarbon, having a boiling point of 180° C. or more at 1 atmosphere. In such a resist material of the present invention, examples of the above-mentioned ether, ester, diester, ether ester, or hydrocarbon, having a boiling point of 180° C. or more at 1 atmosphere include tetralin (tetrahydronaphthalene), ethylene glycol, ethylene glycol diacetate, ethylene glycol diethyl ether, ethylene glycol dibutyl ether, ethylene glycol monoacetate, ethylene glycol monoethyl ether acetate, ethylene glycol monobutyl ether acetate, ethylene glycol monohexyl ether, 1,3-octylene glycol, glycerol triacetate, diethylene glycol, diethylene glycol ethyl methyl ether, diethylene glycol chlorohydrin, diethylene glycol diethyl ether, diethylene glycol dibutyl ether, diethylene glycol monoethyl ether, diethylene glycol monoethyl ether acetate, diethylene glycol monobutyl ether, diethylene glycol monobutyl ether acetate, diethylene glycol monomethyl ether, dipropylene glycol, dipropylene glycol monoethyl ether, dipropylene glycol monobutyl ether, dipropylene glycol monopropyl ether, dipropylene glycol monomethyl ether, tetraethylene glycol, triethylene glycol, triethylene glycol-di-2-ethyl butyrate, triethylene glycol dimethyl ether, triethylene glycol monoethyl ether, triethylene glycol monomethyl ether, triglycol dichloride, tripropyrene glycol, tripropylene glycol monomethyl ether, tripropylene glycol monoethyl ether, tripropylene glycol monobutyl ether, trimethylene glycol, 1,3-butanediol, propylene glycol, propylene glycol phenyl ether, hexylene glycol, and 1,5-pentanediol. These resist materials are preferably applied selectively on the substrate to form the resist pattern film.

The present invention is also a production method of a semiconductor element, wherein a semiconductor layer, a source electrode, and a drain electrode are formed by patterning a semiconductor film and a metal film formed on a substrate, using the above-mentioned production method of the pattern thin film (hereinafter, also referred to as first production method of a semiconductor element). According to the first production method of the semiconductor element of the present invention, a semiconductor layer, a source electrode, and a drain electrode can be formed from a semiconductor film and a metal film using the production method of the pattern film according to the present invention. Therefore, environmental loads, material costs, and equipment investment costs in production of a semiconductor element such as a thin film transistor can be reduced.

For example, a thin film transistor is formed through a step of forming a semiconductor film and a metal film on a substrate, a step of forming a first resist pattern film on the metal film, a step of applying a fluid resist material on a groove of a bank pattern formed using the first resist film, thereby forming a second resist pattern film. As a result, a thin film transistor, in which a source electrode and a drain electrode formed by processing the metal film into a shape of the first resist pattern film and a semiconductor layer formed by processing the semiconductor film into a combination shape of the first resist pattern film with the second resist pattern film are included and a channel region of the thin film transistor is formed at a position where the second resist pattern film, is formed. In such a thin film transistor, if the first resist pattern film is prepared by photolithography technique, for example, the source electrode and the drain electrode, and the channel region are generally prepared through one photolithography process and a step of applying the resist material on the substrate. Conventionally, the process for the metal film and the process for the semiconductor layer are performed separately through different photolithography processes. Therefore, in comparison to such a conventional method, one photolithography process is omitted, and one each of the exposure steps and the development steps using a photomask is omitted. Therefore, the environmental loads, the material costs, and the equipment investment costs in the production of the thin film transistor can be reduced.

The present invention is also a production method of a semiconductor element having a channel, including a step of forming a resist pattern film on a thin film formed on a substrate and pattering the thin film by etching, wherein the production method includes a step of forming a second resist pattern film by applying a fluid resist material inside a channel groove after channel etching or inside a resist groove formed above a channel region before channel etching (hereinafter, also referred to as second production method of the semiconductor element).

The above-mentioned channel etching is not especially limited as long as it is an etching for forming the channel groove. Such a channel etching may be a wet etching or a dry etching, and a wet etching is preferable in view of reduction in production costs.

The above-mentioned channel groove means a groove which is constituted by a bank including essential components constituting the semiconductor element and formed at the channel region. The embodiment of the channel groove is not especially limited, and examples thereof include a groove formed between the source electrode and the drain electrode; and a groove formed between a multilayer film of the source electrode and the resist pattern film, and a multilayer film of the drain electrode and the resist pattern film. If the semiconductor layer is a stacked body including an upper semiconductor layer and a lower semiconductor layer, examples of the channel groove include: a groove formed between a multilayer film including an upper semiconductor layer on the source side and the source electrode, and a multilayer film including an upper semiconductor layer on the drain side and the drain electrode; and a groove formed between a multilayer film including an upper semiconductor layer on the source side, the source electrode, and the resist pattern film, and a multilayer film including an upper semiconductor layer on drain side, the drain electrode, and the resist pattern film.

That is, the resist pattern film used as a mask in the channel etching may be removed before application of the fluid resist material, or may be left. The above-mentioned resist groove means a groove which is constituted by the resist pattern film and formed at the channel region.

The size of the above-mentioned channel groove and resist groove is generally determined in such a way that the semiconductor element shows specific performances when used as a product, and also determined in view of a droplet amount of the resist material to be applied and other set production conditions. If the semiconductor element is a TFT in a TFT array substrate used in a display device, as one example, it is preferable that the size of the channel groove and the resist groove has a length of 5 µm or more and 100 µm or less, and a width of 1 µm or more and 10 µm or less, and a depth of 0.01 µm or more and 10 µm or less. The above-mentioned length of the channel groove and the resist groove means a length in the extending direction of the channel groove and the resist groove. The above-mentioned width of the channel groove and the resist groove means a distance between the source electrode and the drain electrode.

The number of the channel groove and the resist groove may be one or two or more in each semiconductor element.

According to the second production method of the semiconductor element of the present invention, one each of the photolithography process and the selective application of the resist material is performed, and thereby the two-step patterning process can be performed. According to this production method, the channel groove or the resist groove function as a groove of the bank pattern for controlling the shape of the droplet, and therefore variation in shape of the resist pattern films is reduced. As a result, variation in characteristics among the semiconductor elements can be reduced.

Preferred embodiments of the second production method of the semiconductor element according to the present invention include an embodiment in which the production method of the semiconductor element includes the steps of: including the steps of: successively forming a gate electrode, a gate insulating film, a semiconductor film, and a conductive film on an insulating substrate; forming a first resist pattern film having the resist groove on the conductive film; patterning the conductive film using the first resist pattern film, thereby forming the channel groove; applying the fluid resist material inside the channel groove, thereby forming the second resist pattern film; and patterning the semiconductor film using at least the second resist pattern film (hereinafter, also referred to as "first embodiment"). According to this, one each of the photolithography process for channel etching and the selective application of the resist material is performed, and thereby the two-step patterning process can be performed. That is, through the patterning process using the photolithography at the first step, the source electrode and the drain electrode are formed from the conductive film. Further, through the patterning process using selective application of the resist material at the second step, the semiconductor layer is formed from the semiconductor film. Accordingly, through two photolithography processes including formation of the gate electrode, a basic structure of an inverse stagger type semiconductor element can be formed. The semiconductor layer is formed by removing the semiconductor film in the first resist pattern film-formed region (source electrode and drain electrode-formed region) and a region other than the second resist pattern film-formed region by etching. At this time, if the source electrode and the drain electrode have resistance for etching of the semiconductor film, it can be possible to perform the etching after the first resist pattern film is removed. In this case, the second resist pattern film, the source electrode, and the drain electrode are used as a mask.

According to the above-mentioned first embodiment, it is preferable that the semiconductor film includes an upper semiconductor film and a lower semiconductor film; the channel groove is formed by patterning the conductive film and the upper semiconductor film using the first resist pattern film; and the lower semiconductor film is patterned using at least the second resist pattern film. That is, the preferable embodiments of the second production method of the semiconductor element according to the present invention include an embodiment in which the production method of the semiconductor element, includes the steps of: including the steps of: successively forming a gate electrode, a gate insulating film, a lower semiconductor film, an upper semiconductor film, and a conductive film on an insulating substrate; forming a first resist pattern film having the resist groove on the conductive film; patterning the conductive film and the upper semiconductor film using the first resist pattern film, thereby forming the channel groove; applying the fluid resist material inside the channel groove, thereby forming the second resist pattern film; and patterning the lower semiconductor film using at least the second resist pattern film. According to this, through one each of the photolithography process for channel etching and the selective application of the resist material, the two-step patterning process can be performed. That is, through the patterning process using the photolithography process at the first step, the source electrode and the drain electrode are formed from the conductive film, and an upper semiconductor layer on the source side and an upper semiconductor layer on the drain side are formed from the upper semiconductor film. Further, through the patterning process using selective application of the resist material at the second step, a lower semiconductor layer is formed from the lower semiconductor film. Accordingly, through two photolithography processes including formation of the gate electrode, a basic structure of an inverse stagger type semiconductor element can be formed. The lower semiconductor layer is formed by removing the lower semiconductor film in the first resist-pattern film-formed region (source electrode and drain electrode-formed region) and a region other than the second resist pattern film-formed region by etching. At this time, if the source electrode and the drain electrode have resistance for etching of the lower semiconductor film, it can be possible to perform the etching after the first resist pattern film is removed. In this case, the second resist pattern film, the source electrode, and the drain electrode are used as a mask.

Preferable embodiments of the second production method of the semiconductor element according to the present invention include an embodiment in which the production method of the semiconductor element includes the steps of: successively forming a gate electrode, a gate insulating film, a semiconductor film, and a conductive film on an insulating substrate; forming a first resist pattern film having the resist groove on the conductive film; applying the fluid resist material inside the resist groove, thereby forming the second resist pattern film; patterning the semiconductor film and the conductive film using the first and second resist pattern films; removing the second resist pattern film; and patterning the conductive film using the first resist pattern film after removal of the second resist pattern film (hereinafter, also referred to as "second embodiment"). According to this, using the first and second resist pattern films, a resist pattern film having portions with different film thicknesses (halftone pattern) is formed on the multilayer film, and the two step-patterning process can be performed. That is, through the patterning process at the first step, the semiconductor film and the conductive film are patterned, and thereby the semiconductor layer can be formed from the semiconductor film. Further, through the patterning process at the second step after the selective removal of the second resist pattern film, the conductive film is further processed to form the source electrode and the drain electrode. Accordingly, through two photolithography processes including formation of the gate electrode, a basic structure of an inverse stagger type semiconductor element can be formed. The step of removing the second resist pattern film may serve as a step of thinning the first resist pattern film. If the second resist pattern film has a thickness smaller than that of the first resist pattern film, for example, the second resist pattern film can be selectively removed by thinning the first and second resist pattern films.

According to the above-mentioned second embodiment, it is preferable that the semiconductor film includes an upper semiconductor film and a lower semiconductor film; and after removal of the second resist pattern film, the conductive film and the upper semiconductor film are patterned using the first resist pattern film. That is, the preferable embodiments of the production method of the second semiconductor element according to the present invention includes the steps of: successively forming a gate electrode, a gate insulating film, a lower semiconductor film, an upper semiconductor film, and a conductive film on an insulating substrate; forming a first resist pattern film having the resist groove on the conductive film; applying the fluid resist material inside the resist groove, thereby forming the second resist pattern film having a film thickness smaller than that of the first resist pattern film; patterning the lower semiconductor film, the upper semiconductor film, and the conductive film using the first and second resist pattern films; removing the second resist pattern film by thinning the first and second resist pattern films; and patterning the upper semiconductor film and the conductive film using the thinned first resist pattern film. According to this, using the first and second resist pattern films, a resist pattern film with portions having different film thicknesses (halftone pattern) is formed on the multilayer film, and the two-step patterning process can be performed. That is, through the patterning process at the first step, the lower semiconductor layer, the upper semiconductor layer, and the conductive film are patterned, and thereby the lower semiconductor layer can be formed from the lower semiconductor film. Further, through the patterning process at the second step after the selective removal of the second resist pattern film, the conductive film is further processed to form the source electrode and the drain electrode, and the upper semiconductor film is further processed to form an upper semiconductor layer on the source side and an upper semiconductor layer on the drain side. Accordingly, through two photolithography processes including formation of the gate electrode, a basic structure of an inverse stagger type semiconductor element can be formed.

If the above-mentioned halftone pattern is formed, it is preferable that the film thickness of the second resist pattern film accounts for 50% or less of that of the first resist pattern film. It is also preferable that the second resist pattern film has a film thickness of 1000 Å or more. The first resist pattern film may be a resist having a lyophobic property for the fluid resist material (lyophobic resist) in view of reduction in addition accuracy of the fluid resist material.

The present invention is also a production method of a semiconductor element having a channel, including a step of forming a resist pattern film on a thin film formed on a substrate and pattering the thin film by etching, wherein the production method includes a step of adding dropwise a solvent inside a channel groove formed above a channel region after channel etching using a first resist pattern film, or inside a resist groove formed from the first resist pattern film above the channel region before channel etching to dissolve the first resist pattern film around the channel groove or the resist groove, thereby forming a second resist pattern film (hereinafter, also referred to as third production method of the semiconductor element).

The size of the above-mentioned channel groove and resist groove is generally determined in such a way that the semiconductor element shows specific performances when used as a product, and also determined in view of a droplet amount of the resist material to be applied and other set production conditions. If the semiconductor element is a TFT in a TFT array substrate used in a display device, as one example, it is preferable that the size of the channel groove and the resist groove has a length of 5 µm or more and 100 µm or less, and a width of 1 µm or more and 10 µm or less, and a depth of 0.01 µm or more and 10 µm or less. The above-mentioned length of the channel groove and the resist groove means a length in the extending direction of the channel groove and the resist groove. The above-mentioned width of the channel groove and the resist groove means a distance between the source electrode and the drain electrode. The number of the channel groove and the resist groove may be one or two or more in each semiconductor element. A solvent capable of dissolving the first resist pattern film is appropriately selected and used as the solvent added dropwise into the channel groove and the resist groove. Examples of organic solvents include: hydrocarbons such as decalin (decahydronaphthalene) and decane; alcohols such as ethanol, methanol, and isopropyl alcohol; ketones such as acetone, methyl isobutyl ketone, and methyl ethyl ketone; and esters such as butyl acetate, ethyl acetate, butyl lactate, and ethyl lactate. Among them, preferably used are organic solvents having a boiling point of 180° C. or more, such as tetralin (tetrahydronaphthalene), ethylene glycol, ethylene glycol diacetate, ethylene glycol diethyl ether, ethylene glycol dibutyl ether, ethylene glycol monoacetate, ethylene glycol monoethyl ether acetate, ethylene glycol monobutyl ether acetate, ethylene glycol monohexyl ether, 1,3-octylene glycol, glycerol triacetate, diethylene glycol, diethylene glycol ethyl methyl ether, diethylene glycol chlorohydrin, diethylene glycol diethyl ether, diethylene glycol dibutyl ether, diethylene glycol monoethyl ether, diethylene glycol monoethyl ether acetate, diethylene glycol monobutyl ether, diethylene glycol monobutyl ether acetate, diethylene glycol monomethyl ether, dipropylene glycol, dipropylene glycol monoethyl ether, dipropylene glycol monobutyl ether, dipropylene glycol monopropyl ether, dipropylene glycol monomethyl ether, tetraethylene glycol, triethylene glycol, triethylene glycol di-2-ethyl butyrate, triethylene glycol dimethyl ether, triethylene glycol monoethyl ether, triethylene glycol monomethyl ether, triglycol dichloride, tripropyrene glycol, tripropylene glycol monomethyl ether, tripropylene glycol monoethyl ether, tripropylene glycol monobutyl ether, trimethylene glycol, 1,3-butanediol, propylene glycol, propylene glycol phenyl ether, hexylene glycol, and 1,5-pentanediol. Such a solvent is hardly dried at near normal temperatures (20° to 30° C.) and therefore preferably applied by the ink-jet device.

According to such a third production method of the semiconductor element of the present invention, one each of the photolithography process and the selective application of the solvent is performed, and thereby the two-step patterning process can be performed. According to this production method, the channel groove or the resist groove function as a groove of the bank pattern for controlling the shape of the droplet, and therefore variation in the shape of the resist pattern film is reduced. As a result, variation in characteristics among the semiconductor elements can be reduced.

Preferable embodiments of the third production method of the semiconductor element include an embodiment in which the production method of the semiconductor element includes the steps: successively forming a gate electrode, a gate insulating film, a semiconductor film, and a conductive film on an insulating substrate; forming a first resist pattern film having the resist groove on the conductive film; patterning the conductive film using the first resist pattern film, thereby forming the channel groove; adding dropwise the solvent inside the channel groove to dissolve the first resist pattern film around the channel groove, thereby forming the second resist pattern film; and patterning the semiconductor film using the first and second resist pattern films (hereinafter, also referred to as "third embodiment"). According to this, one each of the photolithography process for channel etching and the selective application of the solvent is performed, and thereby the two-step patterning process can be performed. That is, through the patterning process using the photolithography at the first step, the source electrode and the drain electrode are formed from the conductive film. Further, through the patterning process using the selective application of the solvent at the second step, the semiconductor layer can be formed from the semiconductor film. Accordingly, through two photolithography processes including formation of the gate electrode, a basic structure of an inverse stagger type semiconductor element can be formed. The lower semiconductor layer is formed by removing the semiconductor film in the first resist pattern film-formed region (source electrode and drain electrode-formed region) and a region other than the second resist pattern film-formed region by etching.

In the above-mentioned third embodiment, it is preferable that the semiconductor film includes an upper semiconductor film and a lower semiconductor film; the channel groove is formed by patterning the conductive film and the upper semiconductor film using the first resist pattern film; and the lower semiconductor film is patterned using the first and second resist pattern films. That is, the preferable embodiments of the third production method of the semiconductor element according to the present invention include the production method of the semiconductor element, includes the steps of: successively forming a gate electrode, a gate insulating film, a lower semiconductor film, an upper semiconductor film, and a conductive film on an insulating substrate; forming a first resist pattern film having the resist groove on the conductive film; patterning the conductive film and the upper semiconductor film using the first resist pattern film, thereby forming the channel groove; adding dropwise the solvent inside the channel groove to dissolve the first resist pattern film around the added solvent, thereby forming the second resist pattern film; and patterning the lower semiconductor film using the first and second resist pattern films. According to this, one each of the photolithography process for channel etching and the selective application of the solvent is performed, and thereby the two-step patterning process can be performed. That is, through the patterning process using the photolithography process at the first step, the source electrode and the drain electrode are formed from the conductive film, and an upper semiconductor layer on the source side and an upper semiconductor layer on the drain side are formed from the upper semiconductor film. Further, through the patterning process using the selective application of the solvent at the second step, a lower semiconductor layer is formed from the lower semiconductor film. Accordingly, through two photolithography processes including formation of the gate electrode, a basic structure of an inverse stagger type semiconductor element can be formed. The lower semiconductor layer is formed by removing the lower semiconductor film in the first resist pattern film-formed region (source electrode and drain electrode-formed region) and a region other than the second resist pattern film-formed region by etching.

Preferable embodiments of the third production method of the semiconductor element according to the present invention include an embodiment in which the production method of the semiconductor element includes the steps of: successively forming a gate electrode, a gate insulating film, a semiconductor film, and a conductive film on an insulating substrate; forming the first resist pattern film having the resist groove on the conductive film; adding dropwise the solvent inside the resist groove to dissolve the first resist pattern film around the resist groove, thereby forming the second resist pattern film; patterning the semiconductor film and the conductive film using the first and second resist pattern films; removing the second resist pattern film; after removal of the second resist pattern film, patterning the conductive film using the first resist pattern film (hereinafter, also referred to as "fourth embodiment"). According to this, using the first and second resist pattern films, a resist pattern film with portions having different film thicknesses (halftone pattern) is formed on the multilayer film, and thereby the two-step patterning process can be performed. That is, through the patterning process at the first step, the semiconductor film and the conductive film are patterned, and the semiconductor layer is formed from the semiconductor film. Further, through the patterning process at the second step after the selective removal of the second resist pattern film, the conductive film is further processed to form the source electrode and the drain electrode. Accordingly, through two photolithography processes including formation of the gate electrode, a basic structure of an inverse stagger type semiconductor element can be formed.

According to the above-mentioned fourth embodiment, it is preferable that the semiconductor film includes an upper semiconductor film and a lower semiconductor film; and after removal of the second resist pattern film, the conductive film and the upper semiconductor film are patterned using the first resist pattern film. That is, the preferable embodiments of the third production method of the semiconductor element include an embodiment in which the production method of the semiconductor element includes the steps of: successively forming a gate electrode, a gate insulating film, a lower semiconductor film, an upper semiconductor film, and a conductive film on an insulating substrate; forming the first resist pattern film having the resist groove on the conductive film; adding dropwise the solvent inside the resist groove to dissolve the first resist pattern film around the added solvent, thereby forming the second resist pattern film; patterning the lower semiconductor film, the upper semiconductor film, and the conductive film using the first and second resist pattern films; removing the second resist pattern film; after removal of the second resist pattern film, patterning the conductive film and the upper semiconductor film using the first resist pattern film. According to this, using the first and second resist pattern films, a resist pattern film having portions with different film thicknesses (halftone pattern) is formed on the multilayer film, and thereby the two-step patterning process can be performed. That is, through the patterning process at the first step, the lower semiconductor film, the upper semiconductor film, and the conductive film are patterned, and the lower semiconductor layer is formed from the semiconductor film. Further, through the patterning process at the second step after the selective removal of the second resist pattern film, the conductive film is further processed to form the source electrode and the drain electrode, and the upper semiconductor film is further processed to form an upper semiconductor layer on the source side and an upper semiconductor layer on the drain side. Accordingly, through two photolithography processes including formation of the gate electrode, a basic structure of an inverse stagger type semiconductor element can be formed.

It is preferable that the second and third production methods of the semiconductor element according to the present invention each include a step of bonding a fluorine atom and/or a fluorine compound to a surface of the substrate, before the step of forming the second resist pattern film. If at least the periphery of the channel groove or the resist groove on the substrate surface is provided with a lyophobic property for the fluid resist material or the solvent, spread (size) of the droplet of the resist material or the solvent immediately after landed can be controlled and variation in characteristics among the elements can be effectively reduced. It is preferable that the above-mentioned fluorine-bonding step is performed just before dropwise addition of the fluid resist material or the solvent. A plasma surface treatment such as fluorine plasma treatment is preferably used, for example, as a method of the above-mentioned fluorine bonding.

It is preferable that the fluid resist material or the solvent is added dropwise with an ink-jet device. Material costs and the like can be reduced, which more improves productivity. In addition, the ink-jet device is preferable because a droplet as small as several pl can be added dropwise, and therefore the fluid resist material or the solvent can be selectively injected into the channel groove or the resist groove with several to several tens of micrometers.

If a plurality of channel grooves or resist grooves is arrayed in a matrix pattern and a distance between adjacent channel grooves or resist grooves in the horizontal direction is smaller than that in the vertical direction, it is preferable that the ink-jet head is moved in the horizontal direction in view of easiness of nozzle process and reduction in process time.

It is preferable that the resist material has a viscosity of 5 cP or more and 30 cP or less. Within this viscosity range, such a resist material is suitably applied with the ink-jet device, and the dropwise addition from the ink-jet head can be stabilized.

The viscosity of the resist material tends to increase with increase in solid contents in the resist material, and therefore it is preferable that the concentration of the solid contents is adjusted in such a way that the material has a desired viscosity.

Further, the addition amount per injection is preferably 0.5 pl or more and 10 pl or less if a TFT in a TFT array-substrate used in a display device is produced, although it depends on the shape of the channel groove or the resist groove, the size thereof, and the like.

The present invention is a production method of a circuit substrate, wherein a semiconductor element is formed on a substrate using the first to third production method of the semiconductor element according to the present invention. A thin film transistor (TFT), a thin film diode, and the like may be mentioned as the above-mentioned semiconductor element. The above-mentioned circuit substrate is not especially limited as long as it has a circuit including a semiconductor element on a substrate, and a TFT array substrate and the like may be mentioned. According to the production method of the circuit substrate of the present invention, one photolithography process can be omitted, and therefore environmental loads, material costs, equipment investment costs in the production of the production of the circuit substrate can be reduced.

In the production method of the circuit substrate of the present invention, it is preferable that the circuit substrate constitutes a display device or an imaging device; a semiconductor element in a display region or an imaging region and a semiconductor element in a non-display region or a non-imaging region are disposed on a group of parallel lines extending in an extending direction of a gate wiring and/or a source wiring; and in the step of forming the second resist pattern film, a fluid resist material or a solvent is applied by continuously moving an injection head or a substrate stage in the extending direction of the gate wiring and/or the source wiring in the display region or the imaging region and the non-display region or the non-imaging region. According to such a method, using the production method of the semiconductor element of the present invention, the resist material or the solvent is added dropwise by scanning the injection head in the extending direction of the gate wiring and/or the source wiring. As a result, the semiconductor element in the display region and the semiconductor element in the non-display region can be simultaneously prepared in production of the circuit substrate constituting a display device, and the semiconductor element in the imaging region and the semiconductor element in the non-imaging region can be simultaneously prepared in production of the circuit substrate constituting an imaging device. Therefore, environmental loads, material costs, and equipment investment costs in the production of the circuit substrate can be reduced, and the process time also can be shortened. The above-mentioned display region or imaging region is generally positioned in the center of the circuit substrate, and for example, a TFT as a switching for voltage application to a pixel electrode is positioned in each pixel. The above-mentioned non-display region or non-imaging region is generally positioned in the periphery (frame part) of the circuit substrate, and in such a region, a thin film diode for preventing electrostatic breakdown of the TFT formed in the display region or the imaging region and/or the wiring, a TFT for a driving circuit, and the like, are disposed, for example. The above-mentioned circuit substrate may have a configuration in which the semiconductor element in the display region or the imaging region and the semiconductor element in the non-display region or the non-imaging region are disposed on a common group of parallel lines extending in the extending direction of the gate wiring and/or the source wiring, and simultaneously have a configuration in which a semiconductor element is disposed on another group of parallel lines extending in the extending direction of the gate wiring and/or the source wiring. In the above-mentioned circuit substrate, other semiconductor elements may be disposed, in addition to the semiconductor element formed on the group of parallel lines extending in the extending direction of the gate wiring or the source wiring.

In this case, it is preferable that the above-mentioned injection head is continuously moved in the extending direction of the gate wiring. In the circuit substrate such as a TFT array substrate, a plurality of gate wirings and source wirings is disposed to be perpendicular to each other, and the distance between adjacent gate wirings (gate wiring pitch) is generally larger than that between adjacent source wirings (source wiring pitch). Therefore, the second resist pattern film is successively applied and formed in the gate wiring direction, and thereby the number of the nozzle machinery formed in the injection head can be reduced. Therefore, the injection head is easily prepared, which leads to reduction in equipment investment costs.

The present invention is also a semiconductor element including a semiconductor layer on a substrate side of a source electrode and a drain electrode, the semiconductor layer being disposed at a space between the source electrode and the drain electrode to form a channel and further being disposed on a substrate side of a source wiring connected to the source electrode, wherein the channel of the semiconductor element has a curved end between the source electrode and the drain electrode (hereinafter, also referred to as first semiconductor element) The first semiconductor element according to the present invention has the same characteristics as in the semiconductor element in which the resist pattern film at the channel is formed of a fluid resist material, and can be produced by the first to third production method of the semiconductor element in the present invention. That is, if the resist pattern film at the channel is formed by adding the fluid resist material or the solvent between the source electrode and the drain electrode using such electrodes as a bank, the resist material or the solvent added dropwise between the source electrode and the drain electrode has a curved shape because of its surface tension. Accordingly, if the resist material or the solvent is used to form the resist pattern film at the channel, the obtained semiconductor element has a curve-shaped channel end positioned between the source electrode and the drain electrode. Examples of the curve-shape of the end of the functional layer include an ellipse shape projecting in the end direction and an ellipse shape projecting in the direction opposed to the end. In the first semiconductor element of the present invention, the element structure can be formed through a smaller number of photolithography processes. Therefore, environmental loads, material costs, and equipment investment costs in the production of the semiconductor element can be reduced. If the semiconductor element is formed by the first to third production method of the semiconductor element according to the present invention, the source wiring connected to the source electrode of the semiconductor element also has a semiconductor layer on the substrate side. Such a semiconductor element generally has an embodiment in which the semiconductor layer is formed over the entire surface on the substrate side of the source wiring connected to the source electrode.

The number of the above-mentioned channel of the semiconductor element is not especially limited and may be one or two or more in each semiconductor element.

The present invention is also a semiconductor element including a semiconductor layer on a substrate side of a source electrode and a drain electrode, the semiconductor layer being disposed at a space between the source electrode and the drain electrode to form a channel and further being disposed on a substrate side of a source wiring connected to the source electrode, wherein at least one of the source electrode and the drain electrode has a notch at an end on a channel side (hereinafter, also refer to second semiconductor element). The second semiconductor element of the present invention has a structure advantageous for the case where the resist pattern film at the channel is formed of a fluid material. That is, if at least one of the source electrode and the drain electrode has a notch at the end on the channel side (facing the channel), the channel groove or the resist groove have a liquid-saving part and thereby its capacity can be increased. As a result, it becomes easier for the fluid material added dropwise into the channel groove or the resist groove to be kept inside the groove, and thereby the resist pattern film can be formed with accuracy. The second semiconductor element of the present invention is preferably produced by the first to third production method of the semiconductor element of the present invention. Such a semiconductor element has an embodiment in which the semiconductor layer is formed over the entire surface on the substrate side of the source wiring connected to the source electrode. The above-mentioned notch is not especially limited as long as it can enlarge the channel groove or the resist groove. The shape of the notch is not especially limited, and examples thereof include a triangle, a square, and a semicircle. The number of the notch is not especially limited and may be one or two or more in each semiconductor element.

The present invention is also a semiconductor element including a semiconductor layer on a substrate side of a source electrode and a drain electrode, the semiconductor layer being disposed at a space between the source electrode and the drain electrode to form a channel and further being disposed on a substrate side of a source wiring connected to the source electrode, wherein the semiconductor element has a dummy channel near the channel (hereinafter, also referred to as third semiconductor element). The third semiconductor element of the present invention has a structure advantageous for the case where the resist pattern film at the channel is formed of a fluid material. That is, if the semiconductor element has a dummy channel near the channel, a liquid-saving part can be formed near the channel groove or the resist groove. As a result, the fluid material added dropwise into the channel groove or the resist groove is kept also at the liquid-saving part and thereby easily kept inside the groove. Therefore, the resist pattern film can be formed with accuracy.

The third semiconductor element of the present invention is preferably produced by the first to third production method of the semiconductor element of the present invention. Such a semiconductor element generally has an embodiment in which the semiconductor layer is formed on the entire surface on the substrate side of the source wiring connected to the source electrode.

The above-mentioned dummy channel is not especially limited as long as it is a region formed on the semiconductor layer by a notch of the source electrode and/or the drain electrode and functions as the liquid-saving part. It is preferable that the dummy channel is disposed within 20 μm from the channel in order to more effectively function as the liquid-saving part. The shape of the dummy channel is not especially limited. The number of the dummy channel is not especially limited and may be one or two or more in each semiconductor element.

The present invention is also a semiconductor element including a semiconductor layer on a substrate side of a source electrode and a drain electrode, the semiconductor layer being disposed at a space between the source electrode and the drain electrode to form a channel and further being disposed on a substrate side of a source wiring connected to the source electrode, wherein the semiconductor element has a dummy electrode between the source electrode and the drain electrode (hereinafter, also referred to as fourth semiconductor element). The fourth semiconductor element of the present invention has a structure advantageous for the case where the resist pattern film at the channel is formed of a fluid material. That is, if the channel groove or the resist groove has a width that is too large for the size of the landed droplet of the fluid material added into the groove, a dummy electrode is formed between the source electrode and the drain electrode to divide the channel groove or the resist groove into plural portions, and thereby, the fluid material added dropwise into the groove can be divided and kept. As a result, the fluid material added dropwise into the groove can be easily kept inside the groove and the resist pattern film can be formed with accuracy. The fourth semiconductor element of the present invention is preferably produced by the first to third production method of the semiconductor element of the present invention. Such a semiconductor element generally has an embodiment in which the semiconductor layer is formed on the entire surface on the substrate side of the source wiring connected to the source electrode.

The above-mentioned dummy electrode is not especially limited as long as it is effective for controlling the shape of the droplet added between the source electrode and the drain electrode and it is a structure formed separately from other electrodes. However, it is more preferable that the dummy channel is disposed within 20 μm from the source electrode and the drain electrode in order to more effectively function as the liquid-saving part. The material for the dummy electrode is not especially limited, and is preferably the same as that for the source electrode and the drain electrode. In this case, the dummy electrode can be simultaneously prepared in the step of forming the source electrode and the drain electrode. The shape of the dummy electrode is not especially limited. The number of the dummy electrode is not especially limited and may be one or two or more in each semiconductor element.

The preferable embodiments of the second to fourth semiconductor elements of the present invention include an embodiment in which the channel has a flared part on the source electrode side and/or the drain electrode side; an embodiment in which the channel has a flared part outward; an embodiment in which at least one of the source electrode and the drain electrode has two or more comb-shaped parts (notches) and between such comb-shaped parts, the dummy channel is formed; an embodiment in which at least one of the source electrode and the drain electrode has a structure divided into two or more portions by a notch, and between the divided portions, the dummy channel is formed; an embodiment in which the semiconductor element has a dummy electrode, and the dummy channel is formed between the source electrode and the dummy electrode, between the drain electrode and the dummy electrode, and/or between the dummy electrode and the dummy channel. Among them, an embodiment in which the notch has a linewidth equivalent to the channel length of the semiconductor element (TFT) is preferably employed.

The present invention is also a semiconductor element including a semiconductor layer on a substrate side of a source electrode and a drain electrode, the semiconductor layer being disposed at a space between the source electrode and the drain electrode to form a channel, and further being disposed on a substrate side of a source wiring connected to the source electrode, wherein the channel of the semiconductor element has a shape with two or more bent portions (hereinafter, also referred to as fifth semiconductor element). The fifth semiconductor element of the present invention has a structure advantageous for the case where the resist pattern film at the channel is formed of a fluid material. That is, if the channel of the semiconductor element is bent at two or more points, the entire channel can be within a smaller circle even if the whole length of the channel is the same. Therefore, the resist pattern film can be easily formed by addition of the droplet. In addition, a proportion of the channel area to the area of the portion where the semiconductor element is formed in the semiconductor layer can be increased, and therefore the capacity of the channel groove or the resist groove can be increased. As a result, the fluid material added dropwise into the channel groove or the resist groove can be easily kept inside the groove, and therefore the resist pattern film can be formed with accuracy. The fifth semiconductor element of the present invention can be preferably produced by the first to third production method of the semiconductor element of the present invention. Such a semiconductor element generally has an embodiment in which the semiconductor layer is formed on the entire surface on the substrate side of the source wiring connected to the source electrode. The bent portion of the channel may be a portion bent at a right angle or may be a curved portion.

The more preferable embodiments of the fifth semiconductor element of the present invention include an embodiment in which the channel has a square U-shape; an embodiment in which the channel has a U-shape; and an embodiment in which the channel has a Z shape. It is particularly preferable that the channel has a square U-shape or a U-shape.

The present invention is a semiconductor element including a semiconductor layer on a substrate side of a source electrode and a drain electrode, the semiconductor layer being disposed at a space between the source electrode and the drain electrode to form a channel, and further being disposed on a substrate side of a source wiring connected to the source electrode, wherein the source electrode and the drain electrode have corners on both sides of ends of the channel (hereinafter, also referred to as sixth semiconductor element). The sixth semiconductor element of the present invention has a structure advantageous for the case where the resist pattern film at the channel is formed of a fluid material. If the end of the channel groove or the resist groove is formed at a portion where the corner of the source electrode and that of the drain electrode are disposed to face each other, the fluid material can be suppressed from being wetly spread to the outside of the channel groove or the resist groove along the bank positioned at both sides of the channel groove or the resist groove. As a result, the fluid material added dropwise into the channel groove or the resist groove can be easily kept inside the groove, and therefore the resist pattern film can be formed with accuracy. That is, the resist pattern film can be formed with accuracy by the first to third production method of the semiconductor element of the present invention, if the semiconductor element having an embodiment in which the source electrode and the drain electrode have corners on both sides of ends of the channel (the end of the channel is positioned at the portion where the corner of the source electrode and the corner of the drain electrode are disposed to face to each other). The sixth semiconductor element of the present invention is preferably produced by the first to third production method of the semiconductor element of the present invention. Such a semiconductor element generally has an embodiment in which the semiconductor layer is formed on the entire surface on the substrate side of the source wiring connected to the source electrode.

In the sixth semiconductor element of the present invention, a contour of the above-mentioned corner of the source electrode and the drain electrode may have a shape formed with a curved line, but preferably has a shape formed with two straight lines. The angle of the corner of the source electrode and the drain electrode is preferably 135° or less, and more preferably 90° or less, and still more preferably 90°. If the dummy channel is formed, it is preferable that the source electrode and the drain electrode have corners on both sides of ends of the dummy channel.

The semiconductor element of the present invention has any of the first to sixth semiconductor elements, or an embodiment in which such embodiments are combined.

If the fluid material may possibly flow out of the channel groove or the resist groove when the semiconductor element of the present invention is produced, it is preferable that a treatment for determining the direction where the fluid material flows is previously performed. Specifically, a method of controlling the shape of the source electrode and the drain electrode, the conditions of the addition of the fluid material, and the like, may be mentioned. For example, if a capacity (Cg-d) between the gate electrode and the drain electrode varies in a TFT in a TFT array substrate used in a liquid crystal display device, influence on display quality becomes larger in comparison to the case where a capacity (Cg-d) between the gate electrode and the source electrode varies. Therefore, it is better that the treatment is performed in such a way that the fluid material flows to the source electrode side.

It is preferable that the semiconductor element of the present invention is a thin film transistor (TFT) or a thin film diode (TFD). The preferable embodiments of the TFT or TFD include an embodiment in which a gate electrode, a gate insulating layer, and a semiconductor layer are successively formed on an insulating substrate, and on the semiconductor layer, a source electrode is stacked via a contact layer on the source electrode side, and a drain electrode is stacked via a contact layer on the drain electrode side. Such a TFT or TFD is used as an inverse stagger type. In the present invention, the TFD is generally formed by electrically connecting the gate electrode to the source electrode, or connecting the gate electrode to the drain electrode.

The present invention is also a circuit substrate including a semiconductor element produced by the first to third production method of the semiconductor element according to the present invention, or including the first to sixth semiconductor element according to the present invention (hereinafter, also referred to as first circuit substrate). In such a first circuit substrate according to the present invention, environmental loads, material costs, and equipment investment costs in the production steps can be reduced.

The present invention is also a circuit substrate including a gate wiring, a source wiring, and a semiconductor element on a substrate, wherein the circuit substrate constitutes a display device or an imaging device; the circuit substrate includes a configuration in which a semiconductor element in a display region or an imaging region is disposed on a group of parallel lines extending in an extending direction of the gate wiring and/or the source wiring and a configuration in which a semiconductor element in a non-display region or a non-imaging region is disposed on the group of parallel lines (hereinafter, also referred to as second circuit substrate). In such a second circuit substrate of the present invention, the resist material or the solvent is added dropwise by scanning the injection head in the extending direction of the gate wiring and/or the source wiring, using the production method of the semiconductor element of the present invention. As a result, the semiconductor elements in the display region and those in the non-display region can be simultaneously produced in production of the circuit substrate constituting a display device, and the semiconductor elements in the imaging region and those in the non-imaging region can be simultaneously produced in production of the circuit substrate constituting an imaging device. Therefore, environmental loads, material costs, and equipment investment costs in the production of the circuit substrate can be reduced, and the process time can be also shortened. The above-mentioned circuit substrate may have a configuration in which the semiconductor element in the display region or the imaging region and the semiconductor element in the non-display region or the non-imaging region are disposed on a common group of parallel lines extending in the extending direction of the gate wiring and/or the source wiring, and simultaneously have a configuration in which a semiconductor element is disposed on another group of parallel lines extending in the extending direction of the gate wiring and/or the source wiring. In the above-mentioned circuit substrate, other semiconductor elements may be disposed, in addition to the semiconductor element disposed on the group of parallel lines extending in the extending direction of the gate wiring or the source wiring. Preferable embodiments of the above-mentioned circuit substrate include an active matrix substrate in which semiconductor elements that are active elements are arrayed in a matrix pattern in the display region or the imaging region.

If the second circuit substrate of the present invention is produced by the first to third production method of the semiconductor element of the present invention, the source wiring connected to the source electrode of the semiconductor element also has a semiconductor layer on the substrate side. Such a circuit substrate generally has an embodiment in which the semiconductor layer is formed on the entire surface on the substrate side of the source wiring connected to the source electrode.

The present invention is also a circuit substrate including a gate wiring, a source wiring, and a semiconductor element on a substrate, wherein the circuit substrate constitutes a display device or an imaging device; the circuit substrate includes a configuration in which a semiconductor element in a display region or an imaging region is disposed on a group of parallel lines extending in the extending direction of the gate wiring and/or the source wiring (also referred to as first group of parallel lines) and a configuration in which a semiconductor element in a non-display region or a non-imaging region is disposed on a group of straight lines determined based on a unit fraction of a distance between the parallel lines (also referred to as second group of parallel lines) (hereinafter, also referred to as third circuit substrate). Also in such a third circuit substrate of the present invention, the resist material or the solvent is added dropwise by scanning the injection head in the extending direction of the gate wiring and/or the source wiring, using the production method of the semiconductor element of the present invention, as in the second circuit substrate of the present invention. As a result, the semiconductor elements in the display region and those in the non-display region can be simultaneously produced in production of the circuit substrate constituting a display device, and the semiconductor elements in the imaging region and those in the non-imaging region can be simultaneously produced in production of the circuit substrate constituting an imaging device. Therefore, environmental loads, material costs, and equipment investment costs in the production of the circuit substrate can be reduced, and the process time can be also shortened. In the above-mentioned circuit substrate, other semiconductor elements may be disposed, in addition to the semiconductor element disposed on the group of parallel lines extending in the extending direction of the gate wiring or the source wiring.

Preferable embodiments of the above-mentioned circuit substrate include an active matrix substrate in which semiconductor elements that are active elements are arrayed in a matrix pattern in the display region or the imaging region.

If the third circuit substrate of the present invention is produced by the first to third production method of the semiconductor element of the present invention, the source wiring connected to the source electrode of the semiconductor element also has a semiconductor layer. Such a circuit substrate generally has an embodiment in which the semiconductor layer is formed on the entire surface on the substrate side of the source wiring connected to the source electrode.

It is preferable that the second and third circuit substrates of the present invention have a configuration in which the semiconductor element in the display region or the imaging region is disposed on a group of parallel lines extending in the extending direction of the gate wiring. As a result, if the production method of the semiconductor element according to the present invention is used, the injection head is scanned in the extending direction of the gate wiring and thereby the resist material or the solvent can be added dropwise. In the circuit substrate such as a TFT array substrate, many gate wirings and source wirings are disposed to be perpendicular to each other. The distance between adjacent gate wirings (gate wiring pitch) is generally larger than that between adjacent source wirings (source wiring pitch). Therefore, the second resist pattern film is successively applied and formed in the gate wiring direction, and thereby the number of the nozzle machinery formed in the injection head can be reduced. Therefore, the injection head is easy to prepare, which leads to reduction in equipment investment costs.

In the second and third circuit substrates according to the present invention, it is preferable that a plurality of semiconductor elements disposed in the display region or the imaging region are disposed at every intersection of the gate wiring with the source wiring; and the plurality of semiconductor elements disposed at every intersection are configured to be disposed on one group of parallel lines extending in the extending direction of the gate wiring or the source wiring. As a result, even if more than one semiconductor element is disposed in each pixel, the semiconductor elements on the circuit substrate can be produced with efficiency.

In the second and third circuit substrates according to the present invention, it is preferable that the semiconductor element disposed in the display region or the imaging region is a thin film transistor. The thin film transistor can be preferably produced by the production method of the semiconductor element of the present invention. Excellent display quality or imaging quality can be obtained by switching a voltage applied to an electrode formed in the display region or the imaging region using the thin film transistor. It is also preferable that the semiconductor element disposed in the non-display region or the non-imaging region is a thin film diode. The thin film diode can be preferably produced by the production method of the semiconductor element of the present invention. If the thin film diode is disposed in the non-display region, electrostatic discharge damage in a switching element such as a thin film transistor formed in the display region or the non-display region can be prevented and excellent display quality can be obtained.

The present invention is also an electron device including a circuit substrate produced by the production method of the circuit substrate of the present invention or including the circuit substrate of the present invention. According to such an electron device of the present invention, environmental loads, material costs, and equipment investment costs in the production steps can be reduced. Preferable examples of the electron device of the present invention include an imaging device, a display device, and an image input device. A flat panel X-ray image sensor device and the like may be mentioned as the imaging device. The flat panel X-ray image sensor device has a structure, for example, in which an X-ray receiving layer and a circuit for reading a charge accumulated in an imaging region are disposed on a TFT array substrate, and is used in a medical application, an X-ray examination application, and the like. A liquid crystal display device, an organic electroluminescent display device and the like are preferably used as the display device.

EFFECT OF THE INVENTION

According to the production method of the thin film pattern of the present invention, in the step of forming the second resist pattern film, the fluid resist material is applied on the groove of the bank pattern formed using the first resist pattern film. As a result, the second resist pattern film can be formed with high accuracy even by coating, and the number of photolithography processes needed for patterning can be reduced. Therefore, such a production method of the thin film pattern can be preferably used for production of a semiconductor element formed on a circuit substrate and the like.

BEST MODES FOR CARRYING OUT THE INVENTION

The present invention is mentioned in more detail below with reference to Embodiments, but the present invention is not limited to only these Embodiments.

Embodiment 1

As one Embodiment of the present invention, a production method of an inverse stagger type amorphous silicon TFT (thin film transistor) according to Embodiment 1 is mentioned with reference to FIGS. 1 to 11.

The production method of the TFT according to the present Embodiment includes, as shown in FIG. 1, a gate electrode-forming step 1, a gate insulating film and semiconductor film-forming step 2, a source metal film and resist film-forming step 3, a source metal film and semiconductor film-etching step 4, a resist film at channel-forming step 5, and a channel-forming step 6. The characteristic of the present Embodiment is that a source electrode and a drain electrode are formed and then, a droplet of a resist material is added into the center between these electrodes with an ink-jet device to form an additional resist pattern film (a second resist pattern film) and that a semiconductor film is patterned using the second resist pattern film as a mask.

FIG. 2(*a*) is a planar view schematically showing a TFT prepared by the production method of the present Embodiment and a configuration near the TFT; and FIG. 2(*b*) is a cross-sectional view schematically showing the configuration taken along line A-A in FIG. 2(*a*).

A TFT 7 prepared in the present Embodiment has a bottom gate structure, as shown in FIGS. 2(a) and (b), and has a configuration in which a gate electrode 10 branched from a gate wiring 9, a gate insulating film 11, an amorphous silicon layer 12, an n$^+$ type amorphous silicon layer 13, a source electrode 15 branched from a source wiring 14, a drain electrode 17 connected to a drain connecting wiring 16 are stacked on a glass substrate 8.

In the amorphous silicon layer 12, a portion between the source electrode 15 and the drain electrode 17 is a TFT channel 18. The drain connecting wiring 16 is formed for connecting a pixel electrode (not shown) and the drain electrode 17, for example, in a display application. On the upper side of the source electrode and the drain electrode in a commonly used TFT such as the TFT according to the present Embodiment, a passivation film is often formed to cover the TFT channel, which is not shown in FIG. 2.

For preparation of the TFT 7 of the present embodiment, an ink-jet device was used as a pattern-forming device capable of selectively injecting or adding dropwise a fluid material as a droplet on the substrate surface. This ink-jet device, as shown in FIG. 3, includes a mounting base (substrate stage) 20 on which a substrate 19 (corresponding to a glass substrate 8 in FIG. 2) is placed, and also includes an ink-jet head 21 as droplet-injecting means for injecting or adding dropwise a fluid material as a droplet on the substrate 19 placed on this mounting base, an X direction driving part 22 moving the ink-jet head 21 in X direction, and an Y direction driving part 23 moving the ink-jet head 21 in Y direction.

The ink-jet device also includes an ink feeding system 24 for supplying the fluid material into ink-jet head 21, and a control unit 25 which performs various controls such as injection control of the ink-jet head 21 and driving control of the X direction driving part 22 and the Y direction driving part 23. From the control unit 25, information on injection position is output into the X direction driving part 22 and the Y direction driving part 23 and injection information is output into a head driver (not shown) of the ink-jet head 21. As a result, the ink-jet head 21 is driven in conjunction with the X direction driving part 22 and the Y direction driving part 23, and thereby a desired amount of the droplet is added into a desired position on the substrate 19.

A piezo system ink-jet head using a piezo actuator and a bubble system ink-jet head including a heater may be used as the ink-jet head 21. The amount of the droplet injected from the ink-jet head 21 is controlled by control of an applied voltage and the like.

The system of injecting the droplet in the pattern formation device used in the present invention is not limited to the ink-jet method, as long as it is a system capable of injecting or adding the fluid material as a droplet. A system of simply adding a droplet may be used.

In the present Embodiment, a fluid resist material including a resin and an organic solvent was used as the fluid material injected or added dropwise with the ink-jet device. In the present Embodiment, a resist material without photosensitivity was used, but a resist material with photosensitivity may be used. According to the present Embodiment, it is preferable that a film formed of the resist material has a resistance property for a dray-etching treatment and a property of being easily removed by a chemical and the like. Therefore, it is preferable that a resist material capable of showing such properties is used.

In the present invention, the fluid material is not limited to these materials, and it may be a fluid resist material containing a resin and an inorganic solvent such as water, a fluid material containing some solid contents and an organic or inorganic solvent, or a fluid material composed of an organic solvent and/or an inorganic solvent. The fluid material may contain an additive such as a photosensitizing agent.

The production method of the TFT 7 according to the present Embodiment is mentioned below in more detail with reference to each step shown in FIG. 1.

"Gate Electrode-Forming Step 1"

FIG. 4(a) is a planar view schematically showing a configuration after the gate electrode-forming step 1 in the production process of the TFT 7; and FIG. 4(b) is a cross-sectional view schematically showing the configuration taken along line B-B in FIG. 4(a). In FIG. 4, a gate electrode 10 and the like is formed on a glass substrate 8.

In this step, a titanium (Ti) film was formed on the glass substrate 8 to have a thickness of 0.2 μm by sputtering at a film formation temperature of 100° C. As a result, a gate metal film made of titanium was obtained. Then, on this gate metal film, a resist pattern film was formed using a resist material, and by a series of methods in which patterning was performed using this resist pattern film as a mask, that is, a photolithography process, the gate electrode 10 and the like was formed. A dry-etching method was adopted as a method of etching the gate metal film at this time. Chlorine ($Cl_2$) gas and boron trichloride ($BCl_3$) gas were used in combination as an etching gas. Then, the photoresist film was removed using an organic solvent and the like.

In the present Embodiment, a first photolithography process was performed in this step.

In the present invention, the metal forming the gate metal film is not especially limited. For example, metals and metal compounds such as aluminum (Al), copper (Cu), chromium (Cr), tantalum (Ta), molybdenum (Mo), indium tin oxide (ITO), titanium, and molybdenum (Mo) may be used. The gate metal film may be composed of a single layer, or may have a multilayer structure. The method of forming the gate metal film is not especially limited, and a deposition method and the like may be used, in addition to the sputtering. The film thickness of the gate metal film is not especially limited. The method of etching the gate metal film is not especially limited, and a wet-etching method and the like may be used.

"Gate Insulating Film and Semiconductor Film-Forming Step 2"

FIG. 5(a) is a planar view schematically showing a configuration after the gate insulating film and semiconductor film-forming step 2 in the production process of the TFT 7; and FIG. 5(b) is a cross-sectional view schematically showing the configuration taken along line C-C in FIG. 5(a). In FIG. 5, on the glass substrate 8 after the gate electrode-forming step 1, a gate insulating film 11, an amorphous silicon film 27, and an n$^+$ type amorphous silicon film 28 are formed. The gate insulating film 11 was made of silicon nitride ($SiN_x$). These films were successively formed by a plasma enhanced chemical vapor deposition (CVD) method at 300° C. in a vacuum chamber. Each thickness of the films was 0.4 μm (the gate insulating film 11), 0.2 μm (the amorphous silicon film 27), and 0.1 μm (the n$^+$ type amorphous silicon film 28). In the present invention, the forming method and the thickness of each film are not especially limited.

"Source Metal Film and Resist Film-Forming Step 3"

FIG. 6(a) is a planar view schematically showing a configuration after the source metal film and resist film-forming step 3 in the production process of the TFT 7; and FIG. 6(b) is a cross-sectional view schematically showing the configuration taken along line D-D in FIG. 6(a). In FIG. 6, on the glass substrate 8 after the gate insulating film and semiconductor film-forming step 2, a source metal film 29 and a resist pattern film 30 are formed.

In this step, a titanium (Ti) film was formed to have a thickness of 0.2 μm by the same method as in the gate metal film, and thereby the source metal film 29 was formed. The source metal film 29 is patterned later to serve as a source electrode 15 and a drain electrode 17. The source metal film 29 is not especially limited to the embodiment of the present Embodiment, as in the gate metal film.

Then, as one step of the photolithography process, the resist pattern film 30 was formed on the source metal film 29 using a resist material having photosensitivity (photoresist material). The resist pattern film 30 had a film thickness of 2.5 μm.

"Source Metal Film and Semiconductor Film-Etching Step 4"

FIG. 7(*a*) is a planar view schematically showing a configuration after the source metal film and semiconductor film-etching step 4 in the production process of the TFT 7; and FIG. 7(*b*) is a cross-sectional view schematically showing the configuration taken along line E-E in FIG. 7(*a*). In FIG. 7, the source metal film 29 and the $n^+$ type amorphous silicon film 28 were successively subjected to etching treatment using the resist pattern film 30 formed in the source metal film and resist film-forming step 3 as a mask, and thereby a source wiring 14, a source electrode 15, a drain electrode 17, an $n^+$ type amorphous silicon layer 13, and the like were formed. Then, a surface treatment was further performed. Accordingly, the TFT 7 of the present Embodiment includes semiconductor layers (an amorphous silicon layer 12 and an $n^+$ type amorphous silicon layer 13) on the entire surface on the substrate side of the source electrode 15, the drain electrode 17, and the source wiring 14 connected to the source electrode 15.

In this step, a space 31 (also referred to as a TFT gap or channel groove) formed between the source electrode 15 and the drain electrode 17 was formed in such a way that a distance L between the source electrode 15 and the drain electrode 17 was 3 μm and a width W of each of the source electrode 15 and the drain electrode 17 was 60 μm.

In this step, a dry etching method was adopted as a method of etching treatment for the source metal film 29 and the $n^+$ type amorphous silicon film 28, and chlorine ($Cl_2$) gas and boron trichloride ($BCl_3$) gas were used in combination as an etching gas. The above-mentioned etching treatment method is not especially limited, and a wet-etching method and the like may be used. In order to prevent a leak current between the source electrode 15 and the drain electrode 17, the $n^+$ type amorphous silicon film 28 at the TFT gap 31 must be sufficiently removed by the above-mentioned etching treatment. Accordingly, in the present Embodiment, an over-etching treatment may be performed to etch a part on the upper layer side of the amorphous silicon 27, which is not shown in FIG. 7(*b*).

In this step, after completion of the dry etching treatment for the $n^+$ type amorphous silicon layer 13, a treatment of providing the surface of the resist pattern film 30 and the amorphous silicon film 27 and the like with a lyophilic or lyophobic property for a resist liquid used in the following step was performed. The lyophilic or lyophobic property means a wettability or repellent property which a liquid shows when in contact with a solid surface. In the present Embodiment, in a vacuum chamber after completion of the dry etching treatment for the $n^+$ type amorphous silicon layer 13, the surface treatment was performed by a plasma treatment method using oxygen ($O_2$) gas and carbon tetrafluoride ($CF_4$) gas.

After this surface treatment, the surface was measured for contact angle to determine the lyophilic or lyophobic property. A method of calculating a contact angle by approximating it as a part of a sphere, which is a commonly used method, was employed as a method of measuring the contact angle. As a result, the contact angle on the resist pattern film 30 exposed on the substrate surface was 40° to 80° and the contact angle on the amorphous silicon film 27 was 20° to 30°. In contrast, if the surface treatment was not performed, each contact angle was 0° to 10°. As mentioned above, the surface treatment provided the surface of the resist pattern film 30 and the amorphous silicon film 27 with the lyophilic or lyophobic property.

Each contact angle on the end surface exposed on the TFT gap 31 side of the $n^+$ type amorphous silicon layer 13, the source electrode 15, and the drain electrode 17 is estimated to be about 20° to 80° based on measurement results of a film surface which is made of the same material and treated under the same conditions as in the present Embodiment.

The surface treatment method employed in the present invention is not especially limited to the method of the present Embodiment, and any methods may be used as long as the lyophilic or lyophobic property can be adjusted. The above-mentioned contact angle is mentioned just as one example, and therefore it is not especially limited in the present invention.

In the present Embodiment, a second photolithography process was performed in this step and the previous step, that is, the source metal film and the resist film-forming step 3.

"Resist Film at Channel-Forming Step 5"

This step is mentioned with reference to FIGS. 8 to 10.

On the glass substrate 8 after the source metal film and semiconductor film-etching step 4, a droplet of a resist material (resist droplet) 32 was injected into the center of the TFT gap 31 by an ink-jet method. FIG. 8(*a*) is a planar view schematically showing an image when the resist droplet is landed on the TFT gap 31; and FIG. 8(*b*) is a cross-sectional view schematically showing the configuration taken along line F-F in FIG. 8(*a*).

In this step, the pattern forming device capable of selectively injecting or adding a droplet of a fluid material on the substrate surface is used. In the present Embodiment, the ink-jet device was used, as mentioned above. A material mainly including novolak resin and diethylene glycol monobutyl ether was used as the resist material. The resist droplet 32 injected at this time had a volume of 1 to 2 pl.

As shown in FIG. 8(*a*), the resist droplet 32 has an almost circular planar shape when landed. However, this planar shape depends on the droplet shape while the resist droplet 32 is injected from the ink-jet head 21 of the ink-jet device and then dropped, and therefore it is sufficiently possible that the resist droplet 32 has a shape other than the circular shape. After landed, the resist droplet 32 contacts with the surface of the resist pattern film 30 and the surfaces of ends of the resist pattern film 30, the source electrode 15, the drain electrode 17, and the $n^+$ type amorphous silicon layer 13, each consisting the TFT gap 31, and the surface of the amorphous silicon film 27, as shown in FIG. 8(*b*).

In the present Embodiment, the ink-jet device was used as the pattern forming device, but the pattern forming device is not especially limited in the present invention. The resist material used in the present Embodiment had no photosensitivity, but in the present invention, the kind of the fluid material serving as the resist droplet and whether or not the fluid material has photosensitivity are not especially limited. The number of the resist droplet injected into each TFT gap 31 is not necessarily one, and two or more droplets may be injected. The above-mentioned volume of the resist droplet is mentioned just as one example, and it is not especially limited in the present invention. The volume of the resist droplet needs to be properly determined depending on size of a desired pattern.

FIG. 9(a) is a planar view schematically showing a configuration in which the resist droplet 32 shown in FIG. 8(a) is deformed after landed because of its fluidity; and FIG. 9(b) is a cross-sectional view schematically showing the configuration taken along line G-G in FIG. 8(a).

The resist droplet 32 was deformed to have a shape like a resist droplet 33 shown in FIG. 9, after landed. Specifically, the resist droplet 32 spread to fill the TFT gap 31 and had a shape having an intersurface near both ends 34 of the TFT gap 31. The shape of such a resist droplet 33 was controlled and realized by the pattern shape (bank pattern) of the bank formed by the resist pattern film 30 and the like and the lyophilic or lyophobic property provided by the surface treatment in the previous step.

The shape change of the resist droplet after landed is mentioned in more detail. First, the resist droplet 32 immediately after landed gets wet and spreads over the surfaces of the resist pattern film 30 and the amorphous silicon film 27 because the contacting portion of the films 30 and 27 shows a contact angle of 90° or less. The direction of the wet spread at this time is controlled by the unevenness formed by the multilayer structure of the resist pattern film 30, the source electrode 15, the drain electrode 17, and the $n^+$ type amorphous silicon layer 13, each constituting both sides of the TFT gap 30, that is, a bank. This bank controls the direction of the wet spread of the resist droplet and the resist droplet gets wet and spreads inside the TFT gap 31. In the present Embodiment, the contact angle on the resist pattern film 30 was higher than that on the amorphous silicon film 27, and therefore the resist droplet preferentially enters the TFT gap 31.

As mentioned above, the resist droplet spreads inside the TFT gap 31, but its movement is stopped when the surface tension of the resist droplet and the wet spread force are balanced. The resist droplet tends to remain inside the TFT gap 31 and its vicinity as much as possible due to capillarity and the surface tension of the resist droplet. In the present Embodiment, the amount and the viscosity of the resist droplet and the like were properly determined, and thereby the resist droplet 33 which spreads near the both ends 34 of the TFT gap 31 could be obtained.

As mentioned above, the shape of the resist droplet can be controlled by using the bank pattern, that is, the bank pattern including the opening at the both ends 34 of the TFT gap (open ends of the bank pattern), and the bank having a multilayer structure of the resist pattern film 30 constituting the both sides of the TFT gap 31, the source electrode 15, the drain electrode 17, and the $n^+$ type amorphous silicon layer 13.

As mentioned below, the shape of the resist droplet 33 in the present Embodiment is mentioned just as one example, and it is not especially limited in the present invention.

FIG. 10(a) is a planar view schematically showing a configuration where a resist pattern film 35 is formed inside the TFT gap 31; and FIG. 10(b) is a cross-sectional view schematically showing the configuration taken along line H-H in FIG. 10(a).

The resist pattern film 35 was formed by volatilizing an organic solvent included in the resist droplet 33 and subjecting the substrate to heat treatment at 120° C. Due to the volume shrinkage at this time, the inside of the resist droplet 33 became temporarily negative pressure state, and part of the resist droplet 33, which flowed out of the both ends 34 of the TFT gap 31, was absorbed. As a result, the resist pattern film 35 was formed to have a shape slightly changed from the shape shown in FIG. 9(a). Due to this function, the resist pattern film 35 at the TFT gap 31 tends to have a certain shape shown in FIG. 10 regardless of variation in conditions such as a contact angle.

In the present Embodiment, the organic solvent in the resist droplet 33 was volatilized by being left. The heat treatment for the substrate was performed in order to improve a resistance for a dry-etching treatment and the like to be performed in the following step. However, in the present invention, the method of volatilizing the organic solvent is not especially limited, and a method of volatilizing the organic solvent by heating the substrate, and the like, may be appropriately selected depending on the kind of the contained organic solvent and the volume of the added resist droplet. In the present invention, the method of heating the substrate is not especially limited.

"Channel-Forming Step 6"

FIG. 11(a) is a planar view schematically showing a configuration after the channel-forming step 6 in the production process of the TFT 7; and FIG. 11(b) is a cross-sectional view schematically showing the configuration taken along line I-I in FIG. 11(a). In FIG. 11, on the substrate after the resist film at channel-forming step 5, an amorphous silicon layer 12 is obtained from the amorphous silicon film 27 by performing a dry-etching treatment using the resist pattern film 30 and the resist pattern film 35 as a mask.

In this step, chlorine ($Cl_2$) gas was used as an etching gas in the dry-etching treatment for the amorphous silicon film 27.

In the present Embodiment, the resist pattern films 30 and 35 were removed from the configuration shown in FIG. 11, and a TFT basic structure in FIG. 2 was obtained. A TFT channel 18 was formed in a region which was a lower layer of the TFT gap 31, in the amorphous silicon layer 12. The shape of the TFT channel 18 reflects the shape of the resist pattern film 35 formed by the resist droplet.

As mentioned above, the number of photolithography processes performed until the TFT basic structure was obtained was two in the present Embodiment. However, in the present Embodiment, the step of forming the additional resist pattern film 35 was separately performed using the pattern forming device such as the ink-jet device.

Comparative Embodiment 1

A production method of an inverse stagger type amorphous silicone TFT according to Comparative Embodiment 1 is mentioned with reference to FIGS. 12 and 13.

The production method of the TFT according to Comparative Embodiment 1, as shown in FIG. 12, includes a gate electrode-forming step 41, a gate insulating film and semiconductor film-forming step 42, a resist film for semiconductor film process-forming step 43, a semiconductor island-forming step 44, a source metal film and resist film-forming step 45, and a source metal film and semiconductor film-etching step 46.

FIG. 13(a) is a planar view schematically showing a TFT prepared by the production method according to Comparative Embodiment 1 and a configuration near the TFT; and FIG. 13(b) is a cross-sectional view schematically showing the configuration taken along line J-J in FIG. 13(a).

As shown in FIGS. 13(a) and (b), a TFT 47 prepared in Comparative Embodiment 1 has a bottom gate structure, as in Embodiment 1, and has a configuration in which a gate electrode 50 branched from a gate wiring 49, a gate insulating film 51, an amorphous silicon layer 52, an $n^+$ type amorphous silicon layer 53, a source electrode 55 branched from a source wiring 54, a drain electrode 57 connected to a drain connecting wiring 56 are stacked on a glass substrate 48.

In the amorphous silicon layer 52, a portion between the source electrode 55 and the drain electrode 57 is a TFT channel 58. The TFT 47 formed in the present Comparative Embodiment is different from the TFT 7 formed in Embodiment 1 in that the amorphous silicon layer 52 and the $n^+$ type amorphous silicon layer 53 are processed to have an island shape on the upper layer side of the gate insulating film 51. Also in the present Comparative Embodiment, the passivation film covering the TFT channel 58 is not shown.

The production method of the TFT 47 according to Comparative Embodiment 1 is simply mentioned.

First, as in Embodiment 1, the gate electrode-forming step 41 is performed to form the gate electrode 50 and the like. In the present Comparative Embodiment, a first photolithography process is performed in the gate electrode-forming step 41.

Then, the gate insulating film 51, and the island-shaped amorphous silicon layer 52 and $n^+$ type amorphous silicon film are formed through the gate insulating film and semiconductor film-forming step 42, the resist film for semiconductor film process-forming step 43, and the semiconductor island-forming step 44. In the present Comparative Embodiment, a second photolithography process is performed during these steps.

Then, the source metal film and resist film-forming step 45 and the source metal film and semiconductor film-etching step 46 are performed. As a result, the source electrode 55 and the drain electrode 57 are formed, and simultaneously, the $n^+$ type amorphous silicon film at the portion between these electrodes is removed, thereby electrically separating the source electrode 55 from the drain electrode 57. In the present Comparative Embodiment, a third photolithography process is performed in this step.

As mentioned above, according to the production method of Comparative Embodiment 1, a total of at least three photolithography processes are needed for obtaining such a TFT basic structure if special photolithography such as halftone exposure method is not performed.

Comparison of Embodiment 1 with Comparative Embodiment 1

In Embodiment 1 according to the present invention, one photolithography process was replaced with the resist pattern film formation using the ink-jet method. Therefore, one photolithography process could be omitted, which leads to reduction in use amount of chemicals such as a resist material, a developer, a resist-separating solution. Strictly, also in the ink-jet method, the fluid material such as the resist material is used, but the material is selectively injected, and therefore the use amount thereof is much smaller. Therefore, from a viewpoint of production of TFTs, the method in Embodiment 1 possesses advantages such as decrease in material costs and reduction in influence on ambient environment (environmental loads) associated with chemical use.

In a large-scale production of TFTs, such reduction in the number of photolithography processes leads to decrease in the number of very expensive exposure devices as typified by a proximity exposure device and a step type exposure device (stepper). Therefore, an effect of reduction in equipment investment costs of the production line as a whole may be mentioned. Reduction in equipment investment costs generally contradicts reduction in material costs, for example, because expensive materials must be used in order to reduce the equipment investment costs. Therefore, according to the production method in Embodiment 1, both of the material costs and the equipment investment costs can be reduced.

Comparison of Embodiment 1 with a Production Method Using a Halftone Exposure Method The use of the halftone exposure method also can provide the same TFT basic structure through the same number of photolithography processes as in Embodiment 1, for reference. However, the production method in Embodiment 1 is superior in that TFTs can be prepared by a general photolithography technique. First, no special photomask for halftone exposure is needed. Therefore, a wide process margin in an exposure condition, a development condition, and the like can be permitted, and the contact angle on the film surface on the substrate, the shape and the like of the source electrode and the drain electrode and the like can be controlled. As a result, the shape of the TFT channel can be more effectively controlled. Secondly, the source wiring and the like is patterned using the resist pattern film immediately after formed by the exposure and the development as a mask. Therefore, variation in pattern such as variation in wiring thickness can be reduced in comparison to the halftone exposure method using a resist pattern film after resist retreating (thinning) by ashing. Therefore, a TFT array substrate including TFTs having uniform electrical characteristics in the substrate surface can be formed. If such a TFT array substrate is used in a display device, for example, display unevenness and the like is reduced and reduction in display quality can be prevented.

Comparison of Embodiment 1 with a Production Method in Patent Document 5

The production method in the above-mentioned Patent Document 5 is the same as that in the present Embodiment in that the resist droplet is injected with a pattern formation device such as ink-jet device, and using the obtained resist pattern film as a mask, the semiconductor film is subjected to the patterning process.

The production method described in the above-mentioned Patent Document 5 is mentioned below with reference to FIGS. 14 and 15.

FIGS. 14(a) and 15(a) are planar views each schematically showing a configuration of a TFT prepared by the production method of the above-mentioned Patent Document 5. FIG. 14(b) is a cross-sectional view schematically showing the configuration taken along line K-K in FIG. 14(a). FIG. 15(b) is a cross-sectional view schematically showing the configuration taken along line L-L in FIG. 15(a). Components having substantially the same function are expressed by the same symbol in FIGS. 14 and 15.

The structure of the TFTs 61 and 70 shown in FIGS. 14 and 15 is mentioned. On a glass substrate 62, a gate electrode 63 is disposed and thereover a gate insulating film 64 is covered. As an upper layer of the gate insulating film 64, an amorphous silicon layer 65 or 71 is disposed, and a source electrode 66 and a drain electrode 67 are disposed as an upper layer of the amorphous silicon layer 65 or 71. Between the amorphous silicon layer 65 or 71, and the source electrode 66 and the drain electrode 67, an $n^+$ type amorphous silicon layer 68 or 73 is disposed.

The amorphous silicon layers 65 and 71 are prepared by patterning an amorphous silicon film formed on the entire surface of the substrate using a resist pattern film formed with an ink-jet device as a mask. In the ink-jet device, the landing accuracy is generally inferior to alignment accuracy of an exposure device such as a stepper, and the landing position tends to vary depending on droplets. Particularly if the ink-jet head has many nozzles, the landing accuracy varies among the nozzles. With respect to landing accuracy of a common ink-jet device, droplets are landed at least 5 to 10 μm or more away from the center of the target position. Such a landing accuracy is inferior to the alignment accuracy of the exposure device by about 10 times.

The TFT 61 shown in FIG. 14 shows a TFT formed in the case where the resist droplet is landed on the center of the TFT-formed portion. The TFT 70 shown in FIG. 15 is a TFT formed in the case where the resist droplet is landed away from the center. In these TFTs 61 and 70, the positions where the amorphous silicon layers 65 and 71 are formed are different because of difference in the position where the resist droplet is landed. On/off current characteristics as a switching element are important for TFTs, but it is also important that an internal capacitance of the TFT such as a capacity formed between the gate electrode 63 and the drain electrode 67 is uniform. However, in the TFTs 61 and 70, the capacity between the gate electrode 63 and the drain electrode 67 is mainly formed in shaded regions 69 and 72 shown in FIGS. 14(a) and 15(a), but these areas are clearly different, and therefore the TFTs 61 and 70 have different internal capacitances. More specifically, in the TFT 61, the entire $n^+$ type amorphous silicon layer 68 is under the drain electrode 67, but in the TFT 70, the n+amorphous silicon layer 73 is only under the drain electrode 67 in the shaded region 72. Therefore, the TFTs 61 and 70 have different internal capacitances.

As mentioned above, in the conventional production method shown in the above-mentioned Patent Document 5, the landing position of the resist droplet injected from the ink-jet device varies, and therefore the internal capacitance of the TFT formed by this method varies in the substrate surface. Accordingly, if such a TFT array substrate is used in a display device, for example, pixel electrodes connected to the TFTs have different potentials, which reduces the display quality. As mentioned above, according to the conventional production method shown in the above-mentioned Patent Document 5, it is difficult to form a TFT array substrate with uniform electrical characteristics in the substrate surface.

The production method in Embodiment 1 is different from such a method in that the source electrode 15 and the drain electrode 17 are formed in first; the unevenness formed by the multilayer structure of the resist pattern film 30 on both sides of the TFT gap 31, the source electrode 15, the drain electrode 17, and the $n^+$ type amorphous silicon layer 13 is used as a bank for controlling the shape of the resist droplet. Therefore, the method of Embodiment 1 prevents variation in internal capacitance among TFTs.

Experimental Example 1

In the present Experimental Example, whether or not the landing accuracy of the resist droplet, which is needed for the ink-jet device in Embodiment 1, is more reduced in comparison with the above-mentioned production method of the Patent Document 5, was examined. FIG. 16 is an enlarged planar view schematically showing a part (FIG. 7(a)) after completion of the source metal film and semiconductor film-etching step 4 in Embodiment 1.

In FIG. 16, a distance L between the source electrode 15 and the drain electrode 17 is 3 μm; a width W of each of the source electrode 15 and the drain electrode 17 is 60 μm; and a length D of each of the source electrode 15 and the drain electrode 17 is 16 μm. In FIG. 16, the gate electrode 10, the gate insulating film 11, and the like are not shown. Other conditions are the same as those mentioned in Embodiment 1.

A method in which a resist droplet was intentionally landed on a position away from the center of the TFT gap 31 shown by x to form a resist pattern film and this resist pattern film was observed for shape with a light microscope of 500 magnifications, was used as an experimental method. As for criterion, a resist pattern film which was inside the TFT gap 31 and had an end within ±3 μm from the both ends 34 was estimated as "good", and other films were estimated as "bad". That is, a resist pattern film like the resist pattern film 35 shown in FIG. 10(a) was estimated as "good", and a resist pattern film formed outside of the both ends 34 was estimated as "bad". The following Table 1 shows the results.

TABLE 1

|   |   | X coordinate (μm) | | | | | | | | |
|---|---|---|---|---|---|---|---|---|---|---|
|   |   | -12 | -9 | -6 | -3 | 0 | 3 | 6 | 9 | 12 |
| Y coordinate (μm) | 15 | Bad | Bad | Bad | Bad | Bad | Bad | Bad | Bad | Bad |
|   | 12 | Bad | Bad | Bad | Good | Good | Good | Bad | Bad | Bad |
|   | 9 | Bad | Bad | Good | Good | Good | Good | Bad | Bad | Bad |
|   | 6 | Bad | Bad | Good | Good | Good | Good | Good | Bad | Bad |
|   | 3 | Bad | Bad | Good | Good | Good | Good | Good | Bad | Bad |
|   | 0 | Bad | Bad | Good | Good | Good | Good | Good | Bad | Bad |
|   | -3 | Bad | Bad | Good | Good | Good | Good | Good | Bad | Bad |
|   | -6 | Bad | Bad | Good | Good | Good | Good | Good | Bad | Bad |
|   | -9 | Bad | Bad | Good | Good | Good | Good | Good | Bad | Bad |
|   | -12 | Bad | Bad | Bad | Bad | Bad | Bad | Good | Bad | Bad |
|   | -15 | Bad | Bad | Bad | Bad | Bad | Bad | Bad | Bad | Bad |

The X-coordinate and the Y-coordinate in Table 1 represent a distance from the center of the TFT gap 31 (unit; μm). The directions of the X-axis and the Y-axis are those shown in FIG. 16, respectively.

As shown in Table 1, in the method of Embodiment 1, all pattern films which showed an X coordinate of -6 to +6 μm and a Y-coordinate of -9 to +6 μm were estimated as "good." That is, from a viewpoint of the radius from the center of the TFT gap 31, all cases where the droplet was landed on a position within a 6 μm radium were estimated as "good".

Therefore, the landing accuracy needed for the ink-jet device is within a 6 μm radius, and within this range, the shape of the TFTs can be almost uniform.

In contrast, according to the production method of the above-mentioned Patent Document 5, the internal capacitance varied among the TFTs and therefore the characteristics thereof were reduced, if the distance L between the source electrode 15 and the drain electrode 17 was 3 μm and the landing accuracy of the ink-jet device was 5 to 10 μm or more.

As mentioned above, according to the production method in Embodiment 1, the landing accuracy of the pattern formation device such as an ink-jet device can be reduced. Therefore, the shape of TFTs in the substrate surface can be uniform in the substrate surface and reduction in display quality of a liquid crystal display device and the like produced using this TFT substrate can be prevented.

(Further Note)

It has been known that a bank is formed on a substrate when an ink-jet method is used. If a wiring and the like is formed by an ink-jet method, for example, a technology in which a bank pattern is formed to surround a wiring-formed region and an upper part of this bank pattern is provided with a lyophobic property and the wiring-formed region is provided with a lyophilic property, and thereby the landing accuracy needed for the ink-jet device is reduced, is disclosed as in the above-mentioned Patent Document 4. However, in this technology, a droplet of an ink material and the like is added into the region surrounded by the bank.

In contrast, the bank pattern in Embodiment 1 has an opening at the both ends 34, as mentioned above. That is, the bank pattern used in Embodiment 1 has a bank at a position above the source electrode 15 and the drain electrode 17, but has no bank at the both ends 34 of the TFT channel 31. In the present invention, the use of the bank pattern having an opening permits such a process method as in Embodiment 1 in which a pair of electrodes are formed in the same plane, like the source electrode 15 and the drain electrode 17 of the TFT 7, and a resist droplet is added at a position corresponding to the space between the electrodes. Thereby, a thin film element such as a TFT can be prepared through a smaller number of steps in comparison to the conventional method.

In the bank pattern formation in the conventional technology, photolithography is purposely used for forming wirings and the like, and therefore reduction in the number of photolithography processes can not be expected. However, in Embodiment 1, the landing accuracy needed for the ink-jet device can be reduced without additional steps of forming a bank pattern and increase in the number of photolithography processes, because the unevenness formed by the multilayer structure of the resist pattern film 30 on the both ends of the TFT gap 31, the source electrode 15, the drain electrode 17, and the $n^+$ type amorphous silicon layer 13 is used as a bank pattern.

Modified Embodiment of Embodiment 1

In Embodiment 1, the resist pattern film 35 shown in FIGS. 10(a) and (b) was obtained, but the shape of the resist pattern film is not especially limited in the present invention.

The resist pattern film may be slightly out of the TFT gap 31 and part of the film may be formed on the upper part of the resist pattern film 30, as shown in FIG. 17(a). FIG. 17(b) is a cross-sectional view schematically showing the configuration taken along line M-M in FIG. 17(a).

The resist pattern film may be formed only near the center of the TFT gap 31, as shown in FIG. 18(a), for example. Such a shape can be formed by reducing the amount of the resist droplet or increasing the contact angle at the position where the resist droplet is added. For example, the contact angle on the resist pattern film 30 exposing on the substrate surface may be adjusted to 40° to 80°, and the contact angle on the amorphous silicon film 27 may be adjusted to 40° to 60°. Also in this case, the lyophilic or lyophobic property on the substrate surface is property adjusted, and thereby landing error of the ink-jet device can be compensated. As a result, the shape of the TFTs in the substrate surface could be uniform.

In Embodiment 1, the surface treatment in the source metal film and semiconductor film-etching step 4 was performed by the plasma treatment method using oxygen ($O_2$) gas and carbon tetrafluoride ($CF_4$) gas. For example, a method of forming a film with a desired lyophilic or lyophobic property (lyophilic or lyophobic film) on the surface and the like may be used. The lyophilic or lyophobic film may be a thin film composed of a multiple molecular material or a monomolecular film. Fluid materials composed of resin materials such as alkylsilane, fluorinated alkylsilane, acrylic resin, novolak resin, silicone resin, and fluorine resin, and organic solvents such as alcohols and fluorine solvents or water may be used as a material for forming the lyophilic or lyophobic film. A spray method, a vapor deposition method, a CVD method, a sputtering method, a spin coat method, an immersion method, and an ink-jet method may be mentioned as a method of forming the lyophilic or lyophobic film. Such a method may be used in combination with the above-mentioned plasma treatment method. Further, the lyophilic or lyophobic film may remain inside the TFT structure. For example, in FIG. 19(a), the lyophilic or lyophobic film 76 remains at the TFT gap 31. FIG. 19(b) is a cross-sectional view schematically showing the configuration taken along line O-O in FIG. 19(a).

Embodiment 2

A production method of an inverse stagger type amorphous silicon TFT according to Embodiment 2 is mentioned with reference to FIGS. 20 to 22. In FIGS. 20 to 22, components having substantially the same function as in Embodiment 1 are expressed by the same symbol.

The present Embodiment is the same as Embodiment 1 in that the source electrode 15 and the drain electrode 17 were formed by the patterning processing using the resist pattern film and then a resist material droplet injected with the ink-jet device was landed on the center of these electrodes to form an additional resist pattern film and that using the additional resist pattern film as a mask, the semiconductor film was subjected to the patterning process. The present Embodiment is different from Embodiment 1 in that the resist pattern film on the source wiring 14, the source electrode 15, and the drain electrode 17 and the like was removed, and then the additional resist pattern film was formed.

Specifically, the production method of the TFT in the present Embodiment includes, as shown in FIG. 20, the gate electrode-forming step 1, the gate insulating film and semiconductor film-forming step 2, the source metal film and resist film-forming step 3, a source metal film and semiconductor film-etching step 81, a resist film at channel-forming step 82, and a channel-forming step 83. Among them, the gate electrode-forming step 1, the gate insulating film and semiconductor film-forming step 2, and the source metal film and resist film-forming step 3 are the same as in Embodiment 1, and therefore the explanation thereof is omitted. The TFT produced in the present Embodiment has almost the same shape as in the TFT produced in Embodiment 1, shown in FIG. 2.

"Source Metal Film and Semiconductor Film-Etching Step 81"

In this step, a treatment of separating and removing the resist pattern film 30 was performed in addition to the source metal film and semiconductor film-etching step 4 in Embodiment 1. FIG. 21(a) is a planar view schematically showing a configuration after completion of the source metal film and semiconductor film-etching step 81; and FIG. 21(b) is a cross-sectional view schematically showing the configuration taken along line P-P in FIG. 21(a).

The resist pattern film 30 was removed after the etching treatment for the source metal film 29 and the $n^+$ type amorphous silicon film 28.

Then, as a substrate surface treatment, a specific lyophilic or lyophobic property was provided for the substrate surface by a plasma treatment using oxygen ($O_2$) gas and carbon tetrafluoride ($CF_4$) gas. After this surface treatment, the contact angle was measured using the resist material. The source electrode 15 and the drain electrode 17, exposed on the substrate surface, had a contact angle of 40° to 50°, and the amorphous silicon film 27 had a contact angle of 20° to 30°. That is, the lyophilic or lyophobic property for the resist material could be provided, as in Embodiment 1. The end surface of the $n^+$ type amorphous silicon layer 13 exposed on the TFT gap 31 side may have a contact angle of about 20° to 80°. This is estimated from the results obtained by subjecting the film surface made of the same material to the treatment under the same conditions.

Also in the present Embodiment, the above-mentioned surface treatment may be a treatment of forming a film having a lyophobic property for the resist droplet. The above-mentioned contact angle value is mentioned just as one example, and it is not especially limited in the present invention.

"Resist Film at Channel-Forming Step 82"

This step is mentioned with reference to FIG. 22. FIG. 22(a) is a planar view schematically showing a configuration after completion of the resist film at channel-forming step 82; and FIG. 22(b) is a cross-sectional view schematically showing the configuration taken along line Q-Q in FIG. 22(a).

In this step, as in Embodiment 1, a resist droplet was injected on the glass substrate 8 after the above-mentioned source metal film and semiconductor film-etching step 81, using the ink-jet device. As a result, an additional resist pattern 84 was formed at the TFT gap 31.

Also in the present Embodiment, the reason why the resist pattern film 84 was formed to mainly fill the TFT gap 31 is the same as in Embodiment 1. However, in the present Embodiment, the unevenness formed by the multilayer structure of the source electrode 15, the drain electrode 17, and the $n^+$ type amorphous silicon layer 13 on both sides of the TFT gap 31 serves as a bank for saving the resist droplet, although in Embodiment 1, the unevenness formed by the multilayer structure of the resist pattern film 30, the source electrode 15, the drain electrode 17, and the $n^+$ type amorphous silicon layer 13 on both sides of the TFT gap 31 serves as a bank for saving the resist droplet. That is, Embodiment 1 and the present Embodiment have different bank multilayer structures. However, also in the present Embodiment, the shape of the resist droplet can be controlled by using the bank pattern, that is, the bank pattern including the opening at the both ends 34 of the TFT gap (open end of the bank pattern) and the banks at the source electrode portion and the drain electrode portion on the both sides of the TFT gap 31.

"Channel-Forming Step 83"

In this step, the substrate after completion of the above-mentioned resist film at channel-forming step 82 was subjected to a dry-etching treatment, and thereby the amorphous silicon layer 12 was obtained from the amorphous silicon layer 27. In the dry etching treatment, carbon tetrafluoride ($CF_4$) gas, oxygen ($O_2$) gas, and the like were used in combination as an etching gas, and the source electrode 15, the drain electrode 17, and the resist pattern film 84 were used as a mask. As a result, such a TFT basic structure as shown in FIG. 2 was obtained. The TFT channel 18 was formed at a region which was a lower layer of the TFT gap 31, in the amorphous silicon layer 12. The shape of the TFT channel 18 reflects the shape of the resist pattern film 84.

As mentioned above, the present Embodiment is the same as Embodiment 1 also in that the number of photolithography processes performed in the present Embodiment was two and the ink-jet device was used as a pattern formation device. Accordingly, in the present Embodiment as well as Embodiment 1, the number of photolithography processes is reduced and advantages such as reduction in material costs, environmental loads, and equipment investment costs in production of TFTs can be obtained.

The production method in the present Embodiment is the same as in Embodiment 1 in that the source electrode 15 and the drain electrode 17 are formed in first and that the bank pattern having an opening is formed. Therefore, as in Embodiment 1, a thin film element such as a TFT can be prepared through a smaller number of production steps in comparison to the conventional production method. Also with respect to comparison with the conventional technology, the production method in the present Embodiment is the same as in Embodiment 1.

In the present invention, the shape of the resist pattern film 84 and the surface treatment method in the source metal film and semiconductor film-etching step 81 and the like are not especially limited and may be variously changed as in Embodiment 1.

Embodiment 3

A production method of an inverse stagger type amorphous silicon TFT according to Embodiment 3 is mentioned with reference to FIGS. 23 to 26. In FIGS. 23 to 26, components having substantially the same function as in Embodiment 1 are expressed by the same symbol.

The present Embodiment is the same as Embodiment 1 in that the source wiring 14, the source electrode 15, the drain electrode 17, and the like were formed through the patterning process using the resist pattern film and then a resist material droplet injected with an ink-jet device was landed on the center between these electrodes to form the additional resist pattern film and that using the additional resist pattern film as a mask, the semiconductor film was subjected to the patterning process. The present Embodiment is different from Embodiment 1 in that the resist pattern film on the source wiring 14, the source electrode 15, and the drain electrode 17 and the like was removed, and then thereon a silicon nitride film serving as a passivation layer (passivation film) was formed, and then the additional resist pattern film was formed.

Specifically, the production method of the TFT in the present Embodiment includes, as shown in FIG. 23, the gate electrode-forming step 1, the gate insulating film and semiconductor film-forming step 2, the source metal film and resist film-forming step 3, a source metal film and semiconductor film-etching and passivation film-formation step 91, a resist film at channel-forming step 92, and a channel resist film and a channel-forming step 93. Among them, the gate electrode-forming step 1, the gate insulating film and semiconductor film-forming step 2, and the source metal film and resist film-forming step 3 are the same as in Embodiment 1, and therefore the explanation thereof is omitted.

FIG. 24(a) is a planar view schematically showing a TFT prepared in Embodiment 3 and a configuration near the TFT, and FIG. 24(b) is a cross-sectional view schematically showing the configuration taken along line R-R in FIG. 24(a).

The TFT 94 prepared in the present Embodiment and the TFT in Embodiment 1 are the same in many respects, but they are different in that the TFT 94 has a passivation layer 96 on a TFT channel 95, as shown in FIG. 24. The passivation layer 96 has an almost the same planar shape as of the TFT channel 95.

"Source Metal Film and Semiconductor Film-Etching and Passivation Film-Forming Step 91"

In this step, a treatment of separating and removing the resist pattern film 30 and formation of a silicon nitride ($SiN_x$) film 97 serving as a passivation layer 96 later were performed in addition to the source metal film and semiconductor film-etching step 4 in Embodiment 1. FIG. 25(a) is a planar view schematically showing a configuration after completion of the source metal film and semiconductor film-etching and passivation film-forming step 91; and FIG. 25(b) is a cross-sectional view schematically showing the configuration taken along line S-S in FIG. 25(a).

The resist pattern film 30 was removed after the etching treatment for the source metal film and the $n^+$ type amorphous silicon film, as in Embodiment 2. Then, the silicon nitride film 97 was formed on the entire surface of the substrate. Then, as a surface treatment for the substrate, the surface was coated with a fluorinated alkylsilane solution containing an alcohol as a main solvent and subjected to heat treatment at 100° C. After this surface treatment, the contact angle was measured using the resist material. The surface had a contact angle of 30° to 40°. As a result, the lyophilic or lyophobic property for the resist material could be provided, as in Embodiment 1 and the like.

The material of the passivation layer 96 is not especially limited to silicon nitride. Instead of the silicon nitride film 97, inorganic material films such as a silicon oxide film, organic material films, and the like, may be used. Also in the surface treatment, a method other than the method in Embodiment 1 and the like may be used. The above-mentioned contact angle value is mentioned just as one example, and it is not especially limited in the present invention.

"Resist Film at Channel-Forming Step 92"

This step is mentioned with reference to FIG. 26. FIG. 26(a) is a planar view schematically showing a configuration after completion of the resist film at channel-forming step 92; and FIG. 26(b) is a cross-sectional view showing the configuration taken along line T-T in FIG. 26(a).

In this step, as in Embodiment 1, the resist droplet was injected with the ink-jet device to form an additional resist pattern film 99 at a TFT gap 98.

Also in the present Embodiment, the reason why the resist pattern film 99 was formed to mainly fill the TFT gap 98 is the same as in Embodiment 1. However, the present Embodiment is different from Embodiment 1 in that the unevenness formed by the multilayer structure of the source electrode 15 of the TFT gap 98, the drain electrode 17, and the $n^+$ type amorphous silicon layer 13 on both sides serves as a bank for saving the resist droplet. That is, in the present Embodiment, the silicon nitride film 97 is formed on the TFT channel 95, but the contact angle at the bank part and that at other parts are the same. Accordingly, it is a function of the bank (unevenness) that is used for saving the resist droplet.

Also in the present Embodiment, the shape of the resist droplet can be controlled by using the bank pattern, that is, the bank pattern including the opening at the both ends of the TFT gap (open end of the bank pattern) and the banks at the source electrode portion and the drain electrode portion on the both sides of the TFT gap 98.

"Channel-Forming Step 93"

In this step, the substrate after completion of the above-mentioned resist film at channel-forming step 92 was subjected to a dry-etching treatment, and thereby the passivation layer 96 was obtained from the silicon nitride film 97 and the amorphous silicon layer 12 was obtained from the amorphous silicon film 27. In the dry etching treatment, carbon tetrafluoride ($CF_4$) gas, oxygen ($O_2$) gas, and the like were used in combination as an etching gas. The resist pattern film 99 was used as a mask to form the passivation layer 96, and the source wiring 14, the source electrode 15, the drain connecting wiring 16, the drain electrode 17, and the resist pattern film 99 were used as a mask to form the amorphous silicon layer 12. As a result, such a TFT basic structure as in FIG. 24 was obtained. The TFT channel 95 was formed in a region which was a lower layer of the TFT gap 98, in the amorphous silicon layer 12. The shape of the TFT channel 95 reflects the shape of the resist pattern film 99. Further, the passivation layer 96 was formed on the amorphous silicon layer 12.

As mentioned above, the present Embodiment is the same as Embodiment 1 also in that the number of photolithography processes performed in the present Embodiment was two and the pattern formation device such as an ink-jet device was used. Accordingly, in the present Embodiment as well as Embodiment 1, the number of photolithography processes is reduced and advantages such as reduction in material costs, environmental loads, and equipment investment costs in production of TFTs can be obtained. In Embodiments 1 and 2, the step of forming the passivation film and patterning it needs to be additionally performed. However, in the present Embodiment, these steps can be omitted because the patterned passivation layer 96 was obtained.

The production method in the present Embodiment is the same as in Embodiment 1 in that the source electrode 15 and the drain electrode 17 were formed in first and that the bank pattern having an opening was formed. Therefore, as in Embodiment 1, a thin film element such as a TFT can be prepared through a smaller number of production steps in comparison to the conventional production method. Also with respect to comparison with the conventional technology, the production method in the present Embodiment is the same as in Embodiment 1.

Also in the present Embodiment, the shape of the resist pattern film 99 and the surface treatment method in the source metal film and semiconductor film-etching and passivation film-forming step 91 and the like are not especially limited and may be variously changed as in Embodiment 1.

Embodiment 4

A production method of an inverse stagger type amorphous silicon TFT according to Embodiment 4 is mentioned with reference to FIGS. 27 and 28. In FIGS. 27 and 28, components having substantially the same function as in Embodiment 1 are expressed by the same symbol.

In the production method of the present Embodiment, an additional resist pattern film is formed in a region corresponding to a TFT channel between resist pattern films for forming a source wiring, a source electrode, a drain electrode, and the like, using an ink-jet device. That is, without using a halftone exposure method, a resist pattern film having portions with different film thicknesses is prepared in a region corresponding to a TFT channel. After the additional resist pattern film is formed, steps like those in the halftone exposure method disclosed in the above-mentioned Nonpatent Document 1 are performed to produce a TFT.

The production method of the TFT in the present Embodiment includes, as shown in FIG. 27, the gate electrode-forming step 1, the gate insulating film and semiconductor film-forming step 2, the source metal film and resist film-forming step 3, a resist film at channel-forming step 101, a source metal film and semiconductor film-etching step 102, a resist film at channel-removing step 103, and a channel-processing step 104. Among them, the gate electrode-forming step 1, the gate insulating film and semiconductor film-forming step 2, and the source metal film and resist film-forming step 3 are the same as in Embodiment 1, and therefore the explanation thereof is omitted. The TFT produced in the present Embodiment has almost the same shape as in the TFT produced in Embodiment 1, shown in FIGS. 2(a) and (b).

"Resist Film at Channel-Forming Step 101"

In this step, a resist pattern film 106 was formed at a TFT gap 105. FIG. 28(a) is a planar view schematically showing a configuration after completion of the resist film at channel-forming step 101; and FIG. 28(b) is a cross-sectional view schematically showing the configuration taken along line U-U in FIG. 28(a).

Procedures in this step are mentioned below.

First, the substrate after the previous step (the source metal film and resist film-forming step 3) was subjected to a plasma surface treatment using oxygen ($O_2$) gas and carbon tetrafluoride ($CF_4$) gas to provide the surfaces of the resist pattern film 30 and the source metal film 29, exposed on the substrate surface, with a lyophobic property for the resist droplet. The resist pattern film 30 had a contact angle of 40° to 80°, and the source metal film 29 had a contact angle of 40° to 50°. That is, the lyophilic or lyophobic property for the resist material could be provided, as in Embodiment 1.

Then, using an ink-jet device, the resist droplet was added at the TFT gap 105 on the substrate after completion of this surface treatment. As a result, the resist pattern film 106 was obtained. This resist pattern film 106 had a shape shown in FIG. 28, because of the same reason as in Embodiment 1. That is, the resist pattern film 106 having a thickness thinner than that at other positions was formed at the TFT gap 105.

Materials other than the material for the resist pattern film 30 may be used as the material for the resist pattern film 106. For example, the resist pattern films 106 and 30 may be composed of different resins. This is performed for improvement in selectivity when only the resist pattern film 106 is removed later. The following steps are mentioned below simply, because the TFT is produced by the same steps as in the halftone exposure method disclosed in Nonpatent Document 1.

"Source Metal Film and Semiconductor Film-Etching Step 102"

In this step, the source metal film 29, the $n^+$ type amorphous silicon film 28, and the amorphous silicon film 27 were etched using the resist pattern film 30 and the additional resist pattern film 106 as a mask. Chlorine ($Cl_2$) gas, boron trichloride ($BCl_3$) gas, and the like were used in combination as an etching gas.

"Resist Film at Channel-Removing Step 103"

In this step, the additional resist pattern film 106 was removed by ashing and the like. At this time, the shape of the resist pattern film 30 is deformed to have a slightly thinner line width by thinning, in some cases.

"Channel-Processing Step 104"

In this step, the source metal film 29 and the $n^+$ type amorphous silicon film 28 at the TFT gap 105 from which the additional resist pattern film 106 was removed were etched. Chlorine ($Cl_2$) gas, boron trichloride ($BCl_3$) gas, and the like were used in combination as an etching gas.

Until this step, each of the source metal film 29 and the $n^+$ type amorphous silicon film 28 was subjected to the two-step etching treatment in the present Embodiment.

Then, the resist pattern film 30 was removed. As a result, such a TFT as in FIGS. 2(a) and (b) was obtained.

In the present Embodiment, the resist pattern film having two different film thicknesses was prepared without the halftone exposure method. That is, the halftone exposure method with low controllability in exposure, development, and the like can be replaced with one photolithography process and the resist pattern film-forming step using the ink-jet method. Therefore, TFTs with uniform characteristics can be produced in the substrate surface.

The production method of the present Embodiment is the same as that in Embodiment 1 in that the bank pattern with an opening was used, but is different in that the resist pattern film 30 on the both sides of the TFT gap 105 serves as a bank. Therefore, as in Embodiment 1, a thin film element such as a TFT can be prepared through a smaller number of production steps in comparison to the conventional production method. Also with respect to comparison with the conventional technology, the production method in the present Embodiment is the same as in Embodiment 1.

The present invention is not limited by the examples in the present Embodiment, such as the shape of the resist pattern film 106, the surface treatment method in the resist film at channel-forming step 101, and may be variously changed, as in Embodiment 1.

Embodiment 5

A production method of an inverse stagger type amorphous silicon TFT according to Embodiment 5 is mentioned with reference to FIGS. 29 to 31.

In Embodiment 1, the source electrode and the drain electrode were obtained, and then the resist material droplet was landed on the center between these electrodes using the ink-jet device, and thereby an additional resist pattern film was formed. In Embodiment 4, the resist pattern film for forming the source electrode and the drain electrode was prepared, and then, using the ink-jet device, the resist material droplet was landed on the center between these electrodes. As a result, the additional resist pattern film was formed. Then, using this additional resist pattern film as a mask, the semiconductor films and the like were processed.

In the present Embodiment, instead of the resist material, a droplet of an organic solvent was injected and landed on the substrate, thereby deforming or dissolving the resist pattern film near the position at which the droplet was landed. As a result, the additional resist pattern was obtained.

This method may be applied to the production methods of Embodiment 1 and Embodiment 4. The case where this method is applied to Embodiment 1 is mentioned in the present Embodiment.

The production method of the TFT according to the present Embodiment includes the gate electrode-forming step 1, the gate insulating film and semiconductor film-forming step 2, the source metal film and resist film-forming step 3, a source metal film and semiconductor film-etching step 111, a resist film at channel-forming step 112, and a channel-forming step 113, as shown in FIG. 29.

Among them, the gate electrode-forming step 1, the gate insulating film and semiconductor film-forming step 2, and the source metal film and resist film-forming step 3 are the same as in Embodiment 1, and therefore the explanation thereof is omitted. The TFT produced in the present Embodiment has almost the same shape as in the TFT produced in Embodiment 1, shown in FIGS. 2(a) and (b).

"Source Metal Film and Semiconductor Film-Etching Step 111"

This step is the same as the source metal film and semiconductor film-etching step 4 in Embodiment 1. In the present Embodiment, however, the surface treatment finally performed in this step is performed in such a way that the surface shows a proper lyophilic or lyophobic property for a droplet of an organic solvent used in the following step. In this Embodiment, a plasma treatment method using oxygen ($O_2$) gas and carbon tetrafluoride ($CF_4$) gas was used to provide a specific lyophilic or lyophobic property for the surface. After this surface treatment, the lyophilic or lyophobic property was checked based on a contact angle. The resist pattern film 30 exposed on the substrate surface had a contact angle of 40° to 80°, and the amorphous silicon film 27 exposed thereon had a contact angle of 20° to 30°. As in Embodiment 1, the end surfaces of the $n^+$ amorphous silicon layer 13, the source electrode 15, and the drain electrode 17, each exposed on the TFT gap 31 side, may have a contact angle of 20° to 80°. This is estimated from the results obtained by subjecting the film surface made of the same material to the treatment under the same conditions. In the present invention, however, the above-mentioned surface treatment is not especially limited to the method in the present Embodiment. As mentioned below, a method of forming a film with a proper lyophilic or lyophobic property for the droplet of the organic solvent and the like may be used. The above-mentioned contact angle value is also mentioned just as one example, and the present invention is not limited thereto.

"Resist Film at Channel-Forming Step 112"

In this step, one droplet of an organic solvent (solvent droplet) was injected into the vicinity of the center of the TFT gap 31 on the glass substrate 8 after the above-mentioned source metal film and semiconductor film-etching step 111, using an ink-jet method. The shape of this solvent droplet was changed with lapse of time, after landed on the glass substrate 8.

The kind of the organic solvent was only diethylene glycol monomethyl ether. The volume of one droplet of the solvent was 1 to 2 pl. In the present invention, the organic solvent is not especially limited as long as it acts on the resist pattern film 30 and the like on the substrate and deforms or dissolves it. It is preferable that the volume of the solvent droplet is appropriately determined depending on the form of the resist pattern film 30, the contact angle of the resist pattern film 30 and the amorphous silicon film 27, the pattern of the additional resist pattern film to be formed by deforming or dissolving the resist pattern film 30, and the like.

FIG. 30(a) is a planar view schematically showing a configuration after completion of landing of the solvent droplet; and FIG. 30(b) is a cross-sectional view schematically showing the configuration taken along line V-V in FIG. 30(a).

The solvent droplet 114 was deformed into a shape shown in FIGS. 30(a) and (b) a little while after landed. The droplet spread and filled the TFT gap 31, and its movement was stopped in the vicinity of the both ends 34 of the TFT gap 31.

Such a shape of the solvent droplet 114 was controlled and formed by the bank pattern, that is, the bank pattern constituted by the opening and the bank, and the lyophilic or lyophobic property provided by the surface treatment in the previous step (the source metal film and semiconductor film-etching step 111).

The reason why the solvent droplet 114 spread and filled the TFT gap 31 is that the unevenness formed by the multilayer structure of the resist pattern 30 on the both sides of the TFT gap 31, the source electrode 15, the drain electrode 17, and the $n^+$ type amorphous silicon layer 13 served as a bank for saving the solvent droplet 14 and that the lyophilic or lyophobic property on the surface of the resist pattern film 30 was adjusted by the surface treatment in the previous step. In this case, it is preferable that the surface of the resist pattern film 30 has a lyophobic property higher than that on the surface of the amorphous silicon film 27.

The reason why the spreading solvent droplet 114 was stopped in the vicinity of the both ends 34 of the TFT gap 31 is attributed to the surface tension of the solvent droplet 114 and the lyophobic property on the surface of the amorphous silicon film 27. When the solvent droplet 114 flows out of the both ends 34 of the TFT gap 31, the surface area of the solvent droplet 114 rapidly increases, and such an increase in the surface area increases a force to rapidly become smaller. Because of these reasons, the solvent droplet 114 remains inside the narrow TFT gap 31. Such a shape of the solvent droplet 114 is appropriately controlled by other conditions such as an amount of the droplet and a viscosity of the resist droplet.

Thus, even if the solvent droplet 114 is used instead of the resist droplet, the shape of the solvent droplet 114 can be controlled by the bank pattern constituted by the opening on the both sides 34 and the bank having a multilayer structure of the resist pattern film 30 constituting the both sides of the TFT gap 31, the source electrode 15 or the drain electrode 17, the $n^+$ type amorphous silicon layer 13. As mentioned below, the shape of the solvent droplet 114 in the present Embodiment is mentioned just as one example, and the solvent droplet 114 may have such another shape as in Embodiment 1 and the like.

FIG. 31(a) is a planar view schematically showing a configuration in which a resist pattern film 115 is formed inside the TFT gap 31; and FIG. 31(b) is a cross-sectional view schematically showing the configuration taken along line W-W in FIG. 31(a).

The organic solvent contained in the solvent droplet 114 gets contact with a portion of the resist pattern film 30, and acts on and dissolves the portion, and then absorbs the resist material. Then, the organic solvent is volatilized. In such a way, the resist pattern film 115 was obtained.

In the present Embodiment, the organic solvent was volatilized by natural drying, and then the entire substrate was subjected to heat treatment at 120° C. for improvement in resistance for a dry-etching treatment performed in the following step.

The present invention is not limited to this, and a method of volatilizing the organic solvent by heating the substrate and the like may be used depending on the kind of the contained organic solvent and the volume of the added solvent droplet 114. Various methods may be used as a method of heating the substrate. The resist pattern film 30 was deformed into a shape of a resist pattern film 116 and had a deformed part on each side of the TFT gap 31.

In this case, due to the volume shrinkage at the time of volatilization of the organic solvent, the inside of the solvent droplet 114 became temporarily negative pressure state, and part of the solvent droplet 114, which flowed out of the both ends 34 of the TFT gap 31, could be absorbed. Because of this function, the shape of the TFT gap 31 tends to have a certain shape shown in FIGS. 31(a) and 31(b) regardless of variation in conditions such as a contact angle.

"Channel-Forming Step 113"

In this step, the substrate after subjected to the previous step (resist film at channel-forming step 112) was subjected to a dry-etching treatment, and thereby the amorphous silicon layer 12 was obtained from the amorphous silicon film 27. Chlorine ($Cl_2$) gas was used as an etching gas and the resist pattern films 115 and 116 were used as a mask in the dry-etching treatment for the amorphous silicon film 27. As a result, a TFT basic structure shown in FIGS. 2(a) and (b) was obtained. The TFT channel was formed at a portion corresponding to the TFT gap 31, in the amorphous silicon layer 12. The shape of the TFT channel reflects the shape of the resist pattern film 115.

The number of photolithography processes performed until the TFT basic structure was obtained was two in the present Embodiment. However, in the present Embodiment, the step of forming the additional resist pattern film 115 using the pattern formation device such as an ink-jet device was additionally performed.

The present Embodiment is also the same as Embodiment 1 in that the source electrode 15 and the drain electrode 17 were formed in first and that the bank pattern having an opening was formed. Thus, the use of the bank pattern having an opening permits such a process method as in the present Embodiment, in which a pair of electrodes such as a source electrode and a drain electrode in a TFT are formed in the same plane and a solvent droplet is added at a position corresponding to a space between the electrodes, and therefore a thin film element such as a TFT can be prepared through a smaller number of production steps in comparison to the conventional production method. Also with respect to comparison with the conventional technology, the production method in the present Embodiment is the same as in Embodiment 1.

The production method in the present Embodiment is the same as that in Embodiment 1 in that the source electrode 15 and the drain electrode 17 were formed in first and that the bank pattern having an opening was formed. Therefore, as in Embodiment 1, a thin film element such as a TFT can be prepared through a smaller number of production steps in comparison to the conventional production method. Also with respect to comparison with the conventional technology, the production method in the present Embodiment is the same as in Embodiment 1.

The present invention is not limited by the examples in the present Embodiment, such as the shape of the resist pattern films 115 and 116, the surface treatment method in the source metal film and semiconductor film-etching step 111, and may be variously changed, as in Embodiment 1.

Embodiment 6

An Embodiment in which an inverse stagger type amorphous silicon TFT was prepared is mentioned below with reference to FIGS. 32 to 35 as an Embodiment of the present invention.

In Embodiments 1, 2, 3, and 5, the source electrode and the drain electrode were obtained in first, and then a droplet of the resist material or the organic solvent was landed on the center of these electrodes, thereby forming the additional resist pattern film. In the present Embodiment, in addition to this step of forming the additional resist pattern film, a back surface exposure and a development treatment using the gate electrode shape were additionally performed. Thus, a TFT was prepared by a method for forming a more excellent TFT channel shape.

The production method of the TFT in the present Embodiment is a method including the above-mentioned back surface exposure and development treatment in addition to the method shown in Embodiment 1. As shown in FIG. 32, for example, the production method includes the gate electrode-forming step 1, the gate insulating film and semiconductor film-forming step 2, the source metal film and resist film-forming step 3, the source metal film and semiconductor film-etching step 4, a resist film at channel-forming step 301, and the channel-forming step 6. In the present Embodiment, the above-mentioned back surface exposure and development treatment are added in the resist film at channel-forming step 301.

FIG. 33(a) is a planar view schematically showing a configuration of a TFT 302 prepared in the present Embodiment; and FIG. 33(b) is a cross-sectional view schematically showing the configuration taken along line AF-AF in FIG. 33(a).

The TFT 302 prepared in the present Embodiment has a bottom gate structure, as shown in FIG. 33, and has a configuration in which a gate electrode 303 branched from the gate wiring 9, the gate insulating film 11, the amorphous silicon layer 12, the $n^+$ type amorphous silicon layer 13, the source electrode 15 branched from the source wiring 14, the drain electrode 17 connected to the drain connecting wiring 16 are stacked on the glass substrate 8. A TFT channel 304 was formed in a lower layer region at the space formed between the source electrode 15 and the drain electrode 17, in the amorphous silicon layer 12. The shape in the vicinity of both ends 305 of the TFT channel 304 is formed through the back surface exposure and the development treatment, and it is a linear shape, in reflection of the shape of the gate electrode 303.

The production method of the TFT 302 in the present Embodiment is mentioned below. The present Embodiment is different form Embodiment 1 only in the resist film at channel-forming step 301, and therefore this step is mentioned.

The resist film at channel-forming step 301 of the present Embodiment includes a back surface exposure and a development treatment using the gate electrode shape, in addition to the resist film at channel-forming step 5 in Embodiment 1. FIG. 34(a) shows a configuration on the substrate immediately after subjected to the back surface exposure. FIG. 34(a) is a schematic planar view and FIG. 34(b) is a cross-sectional view schematically showing the configuration taken along line AG-AG in FIG. 34(a). In FIG. 34(a), a region 306 exposed to diffracted light due to back surface exposure in the vicinity of the TFT channel 31 before being formed, is shown by the shaded region. In the present Embodiment, a resist material having photosensitivity was used as a material for the resist pattern film 35. Specifically, a material mainly including novolak resin, a photosensitive agent, and diethylene glycol monobutyl ether was used. Therefore, the resist pattern film 35 at the region 306 was exposed. The method of the back surface exposure was performed by irradiating the substrate with light from the back surface, using a back surface exposure device including an extra high pressure mercury lamp.

Then, the development treatment was performed, and then a substrate shown in FIGS. 35(a) and (b) was obtained. FIG. 35(a) is a schematic planar view and FIG. 35(b) is a cross sectional view schematically showing the configuration taken along line AG-AG in FIG. 35(a). The portion exposed by the back surface exposure of the resist pattern film 35 was dissolved, and thereby a shaped resist pattern film 307 was obtained at the TFT gap 31. An aqueous solution of TMAH (tetramethyl ammonium hydroxide) was used for this development. The preparation conditions of the resist pattern film 30 such as a material and a heat treatment were appropriately determined so as not to be substantially influenced by the development treatment.

A resist pattern film 307 is sandwiched between the source electrode 15 and the drain electrode 17, and the shape at portions not surrounded by these electrodes is determined by the shape of the gate electrode 303. The source electrode 15, the drain electrode 17, and the gate electrode 303 are prepared by the photolithography process with accuracy, and therefore, the resist pattern film 307 also has a shape with high accuracy equivalent to that in photolithography. Therefore, the treatment in the following channel-forming step 6 is performed, and a TFT channel 304 with high accuracy can be formed. As a result, the display quality is not reduced even if a plurality of such TFTs is formed on an active matrix substrate for display devices, for example.

Thus, the production method in the present Embodiment is especially useful because the shape in the vicinity of the both ends 305 of the TFT channel 304 can be controlled by the back surface exposure and the development treatment with accuracy equivalent to that in photolithography.

The addition of the back surface exposure and the development treatment in the present Embodiment is especially useful in the combination of Embodiments 1 to 3 and 5, but may be performed in combination with the method in other Embodiments of the present invention. The present invention is not especially limited to the examples used in the present Embodiment, and may be variously changed, as in other Embodiments and the like.

Embodiment 7

The production methods of the TFT in the present invention are mentioned in Embodiments 1 to 6, but in Embodiment 7, a shape of a TFT suitable for such production methods is mentioned with reference to FIGS. 36-1 and 36-2. In FIGS. 36-1 and 36-2, components having substantially the same function as in Embodiment 1 are expressed by the same symbol.

FIG. 36-1(a) is a planar view schematically showing a configuration of a TFT in Embodiment 7, and FIG. 36-1(b) is a cross-sectional view schematically showing the configuration taken along line X-X in FIG. 36-1(a).

The TFT 121 in the present Embodiment has a bottom gate structure, as shown in FIGS. 36-1(a) and (b), and has a configuration in which the gate electrode 10 branched from the gate wiring 9, the gate insulating film 11 that is an upper layer of the gate electrode 10, the amorphous silicon layer 12, the n$^+$ type amorphous silicon layer 13, the source electrode 15 branched from the source wiring 14, a drain electrode 122 connected to the drain connecting wiring 16 are stacked on the glass substrate 8. The TFT 121 has semiconductor layers (the amorphous silicon layer 12 and the n$^+$ type amorphous silicon layer 13) on the entire surface on the substrate side of the source electrode 15, the drain electrode 122, and the source wiring 14 connected to the source electrode 15, and also has a partial notch 122a at the end on the TFT channel 18 side of the drain electrode 122.

The TFT channel 18 was formed in a lower layer region at the space formed between the source electrode 15 and the drain electrode 122, in the amorphous silicon layer 12. The drain connecting wiring 16 is formed for connecting a pixel electrode (not shown) and the drain electrode 122 in a display application, for example. On the upper side of the source electrode and the drain electrode in a commonly used TFT such as the TFT according to the present Embodiment, a passivation film is often formed to cover the TFT channel, which is not shown in the present Embodiment.

The TFT 121 shown in FIGS. 36-1(a) and (b) has the notch 122a near the center of the drain electrode 122. The notch 122a is also formed on the structure in which the gate electrode 10, the gate insulating film 11, and the amorphous silicon film 12 are stacked on the glass substrate 8, and therefore can function as a channel of the TFT 121.

The notch 122a shown in FIG. 36-1(a) had a depth Wa of 5 μm, and a width Wb of 10 μm. In FIG. 36-1(a), L was 3 μm, and W was 60 μm.

The reason why such a notch 122a was formed in the present Embodiment is mentioned below.

The production method in Embodiment 1 is assumed to be used as the production method of the TFT 121 in the present Embodiment.

According to the production method in Embodiment 1, the additional resist pattern film 35 was formed at the TFT gap 31 in the resist film at channel-forming step 5. At this time, the resist pattern film 35 is prepared by landing the resist droplet on the substrate using the ink-jet device as mentioned in Embodiment 1. The resist droplet spreads and fills the TFT gap 31.

The volume of the resist droplet with which the TFT gap 31 is just filled was calculated. That is, the volume, at which the unevenness formed by the multilayer of the n$^+$ type amorphous silicon layer 13, the source electrode 15 or the drain electrode 17, and the resist pattern film 30 is filled at the space between the source electrode 15 and the drain electrode 17, was calculated. As a result of calculation based on the values described in Embodiment 1, the volume of the TFT gap 31 was 0.54 pl.

Therefore, if the production method in Embodiment 1 is used, a proper volume of the resist droplet is determined on the basis of 0.54 pl. If the volume is much larger than 0.54 pl, the surface tension exceeds the limit at the both ends 34, and a large amount of the resist droplet flows out of the both ends 34 at the TFT gap 31.

The minimum volume of the droplet injectable by the ink-jet device is generally about 1 pl or more. The volume of the resist droplet injected in Embodiment 1 was 1 to 2 pl. This depends on the head structure and the like of the ink-jet device. That is, the smaller the liquid droplet is, the smaller the nozzle (hole for injection) diameter is. Therefore, higher process accuracy is needed or nozzle clogging is easily caused.

Accordingly, the minimum volume of the droplet injectable by the ink-jet device is more than twice as large as the above-calculated volume of the TFT gap 31.

In order to reduce the difference between the two, it is preferable that at least one of the source electrode and the drain electrode is provided with a notch, as in the present Embodiment. Thus, the notch can be formed as a position where an excess amount of the droplet is absorbed in the resist film at channel-forming step 5.

In the TFT 121 in the present Embodiment, the drain electrode 122 was provided with the notch 122a. Therefore, the volume of the TFT gap 31 could be adjusted to be 0.69 pl, which is closer to the volume of the resist droplet. Therefore, it can be possible to prevent a large amount of the resist droplet from flowing out of the both ends 34 in the resist film at channel-forming step 5, and therefore, the shape of the TFT 121 can be more stably formed.

The present inventors found that the above-mentioned functional effects could be observed through experiments using patterns having a notch and those not having a notch, and that it is effective to provide the source electrode and/or the drain electrode with the notch. The notch formation in the drain electrode slightly reduces a value of on-state current of TFTs, but it can be possible to redesign the TFTs to have desired electric properties by optimization such as review of the entire size.

As mentioned above, if a TFT is produced by the production method in Embodiment 1, at least one of the source electrode and the drain electrode is provided with a partial notch at the end on the channel side, and thereby the difference between the volume of the TFT channel and the minimum volume of the droplet injectable by the ink-jet device can be reduced and the shape of the TFT can be stably formed. The production method is not limited to the production method in Embodiment 1, and the same functional effects can be obtained even if the production methods in Embodiments 2 to 6 are used.

The TFT 121 in the present Embodiment has semiconductor layers (the amorphous silicon layer 12 and the n$^+$ type amorphous silicon layer 13) on the entire surface on the substrate side of the source electrode 15, the drain electrode 122, and the source wiring 14 connected to the source electrode 15, and can be produced by the production methods in Embodiments 1 to 6 of the present invention.

Accordingly, the number of photolithography processes can be easily reduced if the TFT 121 is produced by the production methods of Embodiments 1 to 6.

The shape of the notch 122a may be a shape shown in FIGS. 36-2(a) and 36-2(b). FIG. 36-2(a) is a planer view schematically showing another example of the TFT configuration in Embodiment 7; and FIG. 36-2(b) is a cross-sectional view schematically showing the configuration taken along line Y-Y in FIG. 36-2(a).

In the TFT 123 shown in FIG. 36-2, the drain electrode 124 had a notch 124a, and the length Wa was 5 μm and the width Wb was 3 μm. The width Wb was set to be the same as the channel length L of the TFT. A plurality of the notches 124a may be formed.

Embodiment 8

The TFT in the present invention may be a TFT including a semiconductor layer on the entire surface side of a source electrode, a drain electrode, and a source wiring connected to the source electrode, wherein the TFT has a channel having a square U-shape or a U-shape. The present Embodiment shows a TFT according to such an embodiment.

A TFT 125 having such a shape as in FIGS. 37(a) and (b) may be mentioned as the above-mentioned TFT, for example. FIG. 37(a) is a planar view schematically showing the TFT 125; and FIG. 37(b) is a cross-sectional view schematically showing the TFT 125 taken along line Z-Z in FIG. 37(a). The TFT 125 shown in FIG. 37 has a bottom gate structure as in the TFT produced in other Embodiments. The characteristics of the TFT 125 are that the TFT channel 18 has a square U-shape (U-shape) and has a shape bent at two points. Similarly, a drain electrode 126 also has a square U-shape, but a source electrode 127 has a linear shape. The TFT channel 18 has a square U-shape, and therefore it is within a smaller circle in comparison to the channel having a linear shape.

Such a shape of the TFT 125 is suitable for the processes of the present invention, mentioned in Embodiments 1 to 6. This is because the resist droplet immediately after landed on the substrate has an almost circular planer shape in the resist film at channel-forming step (for example, the step 5) in the middle of the preparation of the TFT 125. If the shape of the TFT channel 18 is formed to be within a small circle, the resist droplet can fill the TFT gap as much as possible immediately after landed. Therefore, a TFT having a substantially long channel width can be produced even if the resist droplet after landed is not so extended. Therefore, such a shape is useful if a TFT having a long channel is produced by the method of the present invention. Further, it can be possible to increase a proportion of the channel area to the area of the portion constituting the semiconductor element in the semiconductor layer and therefore the volume of the channel groove or the resist groove can be increased. As a result, the fluid material added dropwise in the channel groove or the resist groove can be easily kept inside the groove, and the resist pattern film can be formed with accuracy. In addition, the TFT 125 can be produced by the methods in Embodiments 1 to 6 of the present invention, because the TFT 125 has semiconductor layers (the amorphous silicon layer 12 and the n$^+$ type amorphous silicon layer 13) on the entire surface on the substrate side of the source electrode 127, the drain electrode 126, and the source wiring 14 connected to the source electrode 127. Therefore, the use of the production methods in Embodiments 1 to 6 permits easy production of the TFT 125 having a long channel and easily reduces the number of photolithography processes.

An allowable landing error of the ink-jet device in the case where the TFT 125 is produced by the production method shown in Embodiment 1 was checked for reference.

First, the detailed shape of the source electrode 127 and the drain electrode 126 is mentioned with reference to FIG. 38. FIG. 38 is an enlarged planar view schematically showing the source electrode 127 and the drain electrode 126 in FIG. 37(a). In FIG. 38, a distance L between the source electrode 127 and the drain electrode 126 was 3 μm, and with respect to the size of the source electrode 127 and the drain electrode 126, W1 was 30 μm; W2 was 11 μm; W3 was 40 μm; and W4 was 43 μm. The entire TFT 125 has an almost square shape because the values of W3 and W4 are close to each other and the TFT channel is formed at the TFT gap 31 that is a space between the source electrode 127 and the drain electrode 126. The effective channel width W of the TFT is unclear, but may be 59 to 71 μm in consideration of each length of at the end on the channel side of the source electrode 127 and the drain electrode 126. The TFT 7 in Embodiment 1 had a channel width W of 60 μm, which is a value close to this range.

The same method as in Experimental Example 1 was used as an experimental method. In the resist film at channel-forming step 5 that is in the middle of preparation of the TFT 125, a resist droplet was intentionally landed at a position away from the center of the TFT gap 31 shown by x. The observation method and the criterion were the same as in Embodiment 1. The following Table 2 shows the results.

TABLE 2

| | | \multicolumn{9}{c}{X coordinate (μm)} | | | | | | | | |
|---|---|---|---|---|---|---|---|---|---|---|
| | | -12 | -9 | -6 | -3 | 0 | 3 | 6 | 9 | 12 |
| Y coordinate (μm) | 15 | Bad | Bad | Bad | Bad | Bad | Bad | Bad | Bad | Bad |
| | 12 | Bad | Bad | Bad | Bad | Bad | Bad | Bad | Bad | Bad |
| | 9 | Bad | Bad | Bad | Good | Good | Bad | Bad | Bad | Bad |
| | 6 | Good | Good | Good | Good | Good | Good | Good | Good | Bad |
| | 3 | Bad | Good | Good | Good | Good | Good | Good | Good | Bad |
| | 0 | Bad | Good | Good | Good | Good | Good | Good | Good | Bad |
| | -3 | Bad | Good | Good | Good | Good | Good | Good | Good | Bad |
| | -6 | Bad | Good | Good | Good | Good | Good | Good | Good | Bad |
| | -9 | Bad | Good | Good | Good | Good | Good | Good | Good | Bad |
| | -12 | Good | Bad | Good | Good | Good | Good | Bad | Good | Bad |
| | -15 | Bad | Bad | Bad | Bad | Bad | Bad | Bad | Bad | Bad |

Each of the X-coordinate and the Y-coordinate in Table 2 represents a distance from the center of the TFT gap 31, and its unit is micrometer. The directions of the X-axis and the Y-axis are those shown in FIG. 38, respectively. As shown in Table 2, in the present Embodiment, all pattern films which showed an X coordinate of −9 to +9 µm and a Y-coordinate of −9 to +6 µm were estimated as "good". Also in the TFT 125 in the present Embodiment, the allowable landing error of the ink-jet device could be reduced.

In the present invention, the embodiment shown in the present Embodiment in which the channel has a square U-shape or a U-shape and the embodiment shown in Embodiment 7 in which at least one of the source electrode and the drain electrode has a notch may be employed in combination, and both effects can be obtained. A TFT 128 is shown in FIGS. 39(a) and (b) as one example. FIG. 39(a) is a schematic planar view; and FIG. 39(b) is a cross-sectional view schematically showing the TFT 128 taken along line AA-AA in FIG. 39(a). The TFT 128 has a U-shaped TFT channel 18, and includes a drain electrode 129 having two notches 129a and 129b. Each of the notches 129a and 129b has a Wa of 5 µm and Wb of 3 µm.

FIGS. 40 (a) and (b) show similar examples. FIG. 40(a) is a schematic planar view; and FIG. 40(b) is a cross-sectional view schematically showing a TFT 131 taken along line AB-AB in FIG. 40(a). The TFT 131 in these figures includes a source electrode 133 and a drain electrode 132 having a notch 132a. The notch 132a has a Wa of 5 µm and Wb of 11 µm. In the TFT 131 shown in FIG. 40, the portion where the channel length of the TFT is partially enlarged is a portion where the notch 132a is formed.

Embodiment 9

The TFT in the present invention is a TFT having a semiconductor layer on the entire surface on the substrate side of a source electrode, a drain electrode, and a source wiring connected to the source electrode, wherein the source electrode and the drain electrode has corners near the ends of the TFT channel. The present invention relates to a TFT according to such an embodiment.

The TFT in the present Embodiment may have the same embodiment as in the TFT 7 shown in FIGS. 2(a) and (b).

FIG. 41(a) is a planar view schematically showing the source electrode 15 and the like partially extracted from FIG. 2(a). In FIG. 41(a), the source electrode 15 and the drain electrode 17 have corners 143, 144, 145, and 146 near ends 141 and 142 of the TFT channel 18. As a result of a wholehearted examination, the present inventors found that such a TFT in which the source electrode and the drain electrode have corners near every end of the TFT channel as shown in FIG. 41(a) is preferable, and that the shape of the TFT channel can be stabilized particularly if the corner has an angle of 90°.

This could be identified by preparing a TFT 147 shown in FIG. 41(b) for comparison by the method in Embodiment 1, and comparing it with the configuration in FIG. 41(a), for example. FIG. 41(b) is a planar view schematically showing a source electrode 149 and the like of the TFT, which is partially extracted. In FIG. 41(b), the TFT 147 includes a source electrode 149 connected to a source wiring 148, a drain electrode 151 connected to a drain connecting wiring 150, and a TFT channel 152 made of an amorphous silicon film formed between the source electrode 149 and the drain electrode 151. In the vicinity of an end 153 of the TFT channel 15, the source electrode 149 and the drain electrode 151 include the corners 155 and 156. In the vicinity of the other end 154, only the source electrode 149 has a corner 157, and the drain electrode 151 is connected to the drain connecting wiring 150 to have a linear shape and therefore has no corner.

According to the results of the preparation of this TFT 147 by the methods shown in Embodiments 1 to 6, as shown in FIG. 41(b), at the end 154 of the TFT channel 152, the TFT channel 152 often had such a contour that extends to the drain connecting wiring 150 side, and the shape varied among a plurality of TFTs and tended to be deformed in comparison to the shape at the end 153.

This may be attributed to behavior of the resist droplet in the resist film at channel-forming step, and may be because of difference when the resist droplet which slightly flowed out of the ends 153 and 154 is retreated by drying of the organic solvent, particularly. That is, at the end 153, the source electrode 149 and the drain electrode 151 have the corners 155 and 156, and therefore the bank formed by these corners also has corners. Therefore, the contour of the resist droplet is retreated to the line connecting these two corners 155 and 156. On the other hand, at the end 154, there is no corner on the drain electrode 151 side, and therefore, a point where the contour of the resist droplet is retreated is hard to determine. The shape of the TFT channel 152 is determined by the contour after the resist droplet is retreated, and therefore it would appear that the shape at the end 154 is hardly determined.

In a TFT in which the source electrode and the drain electrode have corners near every end of the TFT channel, like a TFT shown in FIG. 41(a), the shape at the both ends of the TFT channel was stabilized.

As mentioned above, such a TFT in which the source electrode and the drain electrode have corners near every end of the TFT channel as in the present Embodiment is preferable if the methods mentioned in Embodiments 1 to 6 are used to produce TFTs. Particularly if the corner has an angle of 90° or less, the shape of the TFT is stabilized.

The present Embodiment is mentioned using the production method of the TFT mentioned in Embodiment 1 as an example, but the same results can be obtained if the production methods in Embodiments 2 to 6 are used.

The embodiment in which the channel has a square U-shape or a U-shape, shown in Embodiment 8, and the embodiment in the present Embodiment can be employed in combination, which is effective because both effects can be obtained. A TFT 158 in such an embodiment is shown in FIGS. 42(a) and (b), as an example. FIG. 42(a) is a schematic planar view; and FIG. 42(b) is a schematic cross-sectional view of the TFT 158 taken along line AC-AC in FIG. 42(a). The TFT 158 has a U-shaped TFT channel 159 inside a region 160 in FIG. 42(a).

Embodiment 10

The TFTs and the production methods thereof shown in Embodiments 1 to 9 can be applied to a diode having the same internal structure as in these TFTs. The present Embodiment relates to a diode according to such an embodiment.

A diode having a structure shown in FIGS. 43(a) and (b) may be mentioned as the above-mentioned diode. FIG. 43(a) is a planar view schematically showing the diode in the present Embodiment and the configuration near the diode. FIG. 43(b) shows a cross-sectional view schematically showing the configuration taken along line AD-AD in FIG. 43(a).

A diode 171 in the present Embodiment has a bottom gate structure and has a configuration in which a gate electrode 173, a gate insulating film 174, an amorphous silicon layer 175, an $n^+$ type amorphous silicon layer 176, a drain electrode 178 connected to a connecting wiring 177, a source electrode 180 connected to a connecting wiring 179, a passivation film 181, a conductive film for connection 182 are stacked on a glass substrate 172. Between the drain electrode 178 and the source electrode 180, part of the amorphous silicon layer forms a channel 183, and such components and the gate electrode 173 and the like constitutes a TFT part 185 having the same structure as in a TFT. A contact part 184 is formed at a portion of the connecting wiring 179. At the contact part 184, the gate insulating film 174 and the passivation film 181 are opened, and mainly over this opening, the conductive film for connection 182 is formed as an upper layer, and the gate electrode 173, the connecting wiring 179, and the source electrode 180 are electrically connected.

The passivation film 181 is made of silicon nitride, and the conductive film for connection 182 is made of ITO (indium tin oxide). Other components are constituted as shown in Embodiment 1.

The diode 171 in the present Embodiment is formed to connect arbitrary wirings such as adjacent source wirings, gate wirings and the like in an active matrix substrate, for example. Its purpose is to prevent static electricity from burning elements such as TFT or wirings in the substrate. For example, if static electricity is accumulated on a wiring and the wiring has a potential much higher than surrounding potential, the source electrode 180 and the gate electrode 173 of the diode 171 electrically connected to the wiring, also have a high potential and the TFT part 185 is in ON-state to be in the conductive state. Therefore, the static electricity on this wiring can be flowed through the drain electrode 178 and the connecting wiring 177. Accordingly, the above-mentioned burning and the like can be prevented. If static electricity is not accumulated, the TFT part 185 is not in ON-state and has a high resistance. Therefore, the wirings and the like can be substantially electrically separated.

The diode 171 is prepared by additionally performing a step of forming the passivation film 181 and a step of preparing the conductive film for connection 182 after the production method in Embodiment 1, and can be prepared by forming films constituting these films 181 and 182 over the entire surface of the substrate and patterning the films by photolithography. The silicon nitride forming the passivation film 181 was prepared by a plasma enhanced CVD method, and the conductive film for connection 182 was prepared by a sputtering method.

As mentioned above, the TFT part 185 is prepared by the method in Embodiment 1, and therefore the channel 183 reflects the shape of the resist pattern film formed by the droplet of the resist material (resist droplet) injected with the ink-jet device. The reason why this channel 183 did not have a circular shape is because the bank formed by the drain electrode 178, the source electrode 180, and the like controlled the direction where the resist droplet was wet and spread and because the resist droplet could be gathered between the drain electrode 178 and the source electrode 180 when the organic solvent in the resist droplet was volatilized.

As shown in the present Embodiment, the production methods of the TFTs in Embodiments 1 to 6 can be applied to a diode having such a structure as in these TFT structures. The present Embodiment as well as Embodiments 1 to 6 attributes to reduction in the number of photolithography processes. Therefore, the same production merits can be obtained.

The shape of the diode and the configuration of the electrode are not limited to the examples in FIG. 43. A diode 186 shown in FIGS. 44(*a*) and (*b*) may be used. FIG. 44(*a*) is a schematic planar view; and FIG. 44(*b*) is a cross-sectional view schematically showing the diode 186 taken along line AE-AE in FIG. 44(*a*). In a contact part 187, the gate electrode 173 and the connecting wiring 179 are not connected to each other. Instead, a conductive film for connection 188 is connected to the connecting wiring 179 and covers the entire TFT part 189, thereby serving as a gate electrode of the TFT to function as a diode. A diode which has the characteristics of the diode shown in FIGS. 43 and 44 may be used. In this case, both of the gate electrode and the conductive film for connection serve as a gate electrode of the TFT.

An embodiment in which a transparent electrode for display is formed using the conductive film for connection 182 or 188 in the present Embodiment may be employed.

Embodiment 11

The active matrix substrate (circuit substrate) in the present Embodiment is a TFT array substrate and has an embodiment shown in FIG. 45-1. FIG. 45-1 is a planar view schematically showing a configuration of the active matrix substrate in Embodiment 11.

An active matrix substrate 191 in the present Embodiment includes a source wiring 192, a gate wiring 193, and a TFT 194 that is a kind of semiconductor element, disposed at an intersection of these wirings. A plurality of the TFTs 194 is formed in the active matrix substrate 191, and the substrate includes an effective region 195 used as a region for image display or imaging and a peripheral region 196 positioned outside of the effective region. The peripheral region 196 is a region where wirings for driving the active matrix substrate 191, terminals (not shown) for connection to an external substrate, and the like are disposed. In the active matrix substrate 191, a diode 197 that is a kind of semiconductor element is disposed in the peripheral region 196.

The TFT 194 is connected to a pixel electrode (not shown) for performing image display and the like, the source wiring 192 and the gate wiring 193, and has a shape shown in Embodiment 1. The diode 197 connects adjacent gate wirings 193 and serves as a protection element for preventing static electricity from burning wirings or elements, and has a shape shown in Embodiment 10. The production methods mentioned in Embodiments 1 to 6 and 10 may be used as a production method for these components. In this case, each of the TFT 194 and the diode 197 in the present Embodiment includes semiconductor layers (amorphous silicon layer and $n^+$ type amorphous silicon layer) on the entire surface on the substrate side of the source electrode, the drain electrode, and the source wiring connected to the source electrode.

The characteristics of the active matrix substrate 191 in the present Embodiments are that the TFT 194 and the diode 197 are on a group of equally spaced straight lines (a group of parallel lines) 198 in the gate wiring direction. The TFT 194 is a semiconductor element inside the effective region 195 and the diode 197 is a semiconductor element inside the peripheral region 196. The characteristics of the substrate 191 are that such semiconductor elements which are positioned in different regions and formed for different purposes are disposed on the same straight line.

When the TFT 194 and the diode 197 were prepared, an ink-jet device was used as a pattern formation device capable of selectively injecting or adding a resist material and the like as a liquid droplet at a position on a substrate surface.

The ink-jet device includes an ink-jet head and injects a droplet of a resist material and the like while changing a relative position between the ink-jet head and the substrate. When viewed from the substrate side, the ink-jet head generally moves in such a manner that scanning in one direction in the plane is repeated, and during each scanning, the ink-jet head is moved just by a specific distance in the direction perpendicular to the scanning direction. At this time, the number of the scanning is reduced as much as possible in order to perform the treatment for the substrate efficiently.

In addition, nozzles for injecting the droplet are disposed equally spaced in the ink-jet head. Therefore, the droplet can not be injected on the substrate region positioned between the nozzles. Through one scanning, the droplet can be added only at the position on the group of equally spaced straight lines through which nozzles are passed. Therefore, in order to minimize the number of the scanning, it is preferable that the positions on which the droplet and the like is landed, that is, the positions where the semiconductor element is formed are on the group of equally spaced straight lines as much as possible.

Because of such a reason, the arrangement of the TFT 194 and the diode 197 in the present Embodiment is suitable for the production methods of the TFT in Embodiments 1 to 6 and the production method of the diode in Embodiment 10, and can reduce the number of the scanning of the ink-jet head, which makes it possible to perform the treatment for the substrate efficiently. In the present Embodiment, semiconductor elements such as a TFT and a diode other than the TFT 194 and the diode 197 may be disposed at least one of the effective region 195 and the peripheral region 196 on the active matrix substrate 191, which is not shown in the figure. In addition, not every semiconductor element may be disposed on the group of equally spaced straight lines.

An active matrix substrate 202 including TFTs 199 and diodes 200 positioned on the group of equally spaced straight lines 201 in the source direction may be used as an Modified Embodiment of the present Embodiment, as shown in FIG. 45-2. FIG. 45-2 is a planar view schematically showing a configuration of the active matrix substrate 202 according to Modified Embodiment of the present Embodiment. Semiconductor elements such as a TFT and a diode other than the TFT 199 and the diode 200 may be disposed at one of the effective region 195 and the peripheral region 196 on the active matrix substrate 202, which is not shown in FIG. 45-2. If the methods mentioned in Embodiments 1 to 6 and 10 are employed, the TFT 199 and the diode 200 include semiconductor layers (amorphous silicon layer and n$^+$ type amorphous silicon layer) on the entire surface on the substrate side of the source electrode, the drain electrode, and the source wiring connected to the source electrode.

It is preferable that the scanning is performed in the gate wiring direction when the ink-jet head is viewed from the substrate side, because a distance between gate wirings is larger than that between source wirings in an active matrix substrate commonly used in a liquid crystal display device. This is because the distance between nozzles formed in the ink-jet head can be made larger and therefore the number of the nozzles is reduced and the process accuracy and the uniformity of the droplet landing distribution among the nozzles can be maintained.

In the present invention, the active matrix substrate may be an active matrix substrate in which more than one semiconductor element is disposed at every intersection of the gate wiring with the source wiring in the effective region, and the more than one semiconductor element is disposed on one group of equally spaced straight lines.

For example, as shown in FIG. 45-3, an active matrix substrate 207 in which TFTs 203 and 204 and diodes 205 are disposed on a group of equally spaced straight lines 206 in the gate wiring direction may be used. FIG. 45-3 is a planar view schematically showing a configuration of the active matrix substrate 207 according to Modified Embodiment of the present Embodiment. Semiconductor elements such as a TFT and a diode other than the TFTs 203 and 204, and the diode 205 may be disposed at least one of the effective region 195 and the peripheral region 196 on the active matrix substrate 207, which is not shown in FIG. 45-3. If the methods mentioned in Embodiments 1 to 6 and 10 are used, the TFTs 203 and 204 and the diode 205 have semiconductor layers (amorphous silicon layer and n$^+$ type amorphous silicon layer) on the entire surface on the substrate side of the source electrode, the drain electrode, and the source wiring connected to the source electrode.

In the present invention, the active matrix substrate may be an active matrix substrate including a plurality of source wirings, a plurality of gate wirings and semiconductor elements on a (glass) substrate, in which the substrate includes an effective region where the semiconductor elements are formed and a periphery region in the periphery of the effective region, and also includes a portion where the semiconductor elements disposed in the effective region are disposed on two groups of equally spaced straight lines in the gate wiring direction and/or the source wiring direction, and (second) semiconductor elements in the peripheral region are disposed on the above-mentioned groups of equally spaced straight lines.

For example, as shown in FIG. 45-4, an active matrix substrate 213 in which TFTs 208 and 209 are formed near an intersection of a source wiring 192 with a gate wiring 193; the TFT 208 and the diode 210 are positioned on a (first) group of equally spaced straight lines 211 in the gate wiring direction; the TFT 209 is positioned on a (second) group of equally spaced straight lines 212 in the gate wiring direction may be used. FIG. 45-4 is a planar view schematically showing a configuration of the active matrix substrate 213 according to Modified Embodiment of the present Embodiment. Semiconductor elements such as a TFT and a diode other than the TFTs 208 and 209, and the diode 210 may be disposed at least one of the effective region 195 and the peripheral region 196 on the active matrix substrate 213, which is not shown in the figure. If the methods used in Embodiments 1 to 6 and 10 are used, the TFTs 208 and 209, and the diode 210 have semiconductor layers (amorphous silicon layer and n$^+$ type amorphous silicon layer) on the entire surface on the substrate side of the source electrode, the drain electrode, and the source wiring connected to the source electrode.

In the present invention, the active matrix substrate may be an active matrix substrate including a plurality of source wirings, a plurality of gate wirings and semiconductor elements on a (glass) substrate, in which the substrate includes an effective region where the semiconductor elements are formed and a periphery region in the periphery of the effective region, and also includes a portion where the semiconductor elements disposed in the effective region are disposed on at least one group of equally spaced straight lines in the gate wiring direction and/or the source wiring direction, and (second) semiconductor elements in the peripheral region are disposed on a group of straight lines determined based on a unit fraction of a distance between the equally spaced straight lines.

For example, as shown in FIG. 45-5, an active matrix substrate 218 including the TFTs 214 and diodes 217 in the periphery region on a fourth group of equally spaced straight lines 216 formed separately from a third group of equally spaced straight lines 215 corresponding to the array of the TFT 214 by a distance I2 may be used. If the distance between the straight lines constituting the third group of equally spaced straight lines 215 on which the TFTs 214 are disposed is defined as I1, I2 is one third of I1. FIG. 45-5 is a planar view schematically showing a configuration of the active matrix substrate 218 according to Modified Embodiment of the present Embodiment. Semiconductor elements such as a TFT and a diode other than the TFT 214 and the diode 217 may be disposed at least one of the effective region 195 and the peripheral region 196 on the active matrix substrate 218, which is not shown in the figure. If the methods mentioned in Embodiments 1 to 6 and 10 are used, the TFT 214 and the diode 217 have semiconductor layers (amorphous silicon layer and n$^+$ type amorphous silicon layer) on the entire surface on the substrate side of the source electrode, the drain electrode, and the source wiring connected to the source electrode.

"Production of TFT Array Substrate"

Embodiment 12

The production method of the TFT array substrate (circuit substrate) in the present Embodiment is a method in which the production methods mentioned in Embodiments 1 to 6 are employed in combination with a publicly known conventional technology.

For example, the method of producing a TFT array substrate using the production method of the TFT shown in Embodiment 1 includes, as shown in FIG. 46, a gate electrode-forming step 311, a gate insulating film and semiconductor film-forming step 312, a source metal film and resist film-forming step 313, a source metal film and semiconductor film-etching step 314, a resist film at channel-forming step 315, a channel-forming step 316, a passivation layer-forming step 317, and a pixel electrode-forming step 318.

Among them, the gate electrode-forming step 311, the gate insulating film and semiconductor film-forming step 312, the source metal film and resist film-forming step 313, the source metal film and semiconductor film-etching step 314, the resist film at channel-forming step 315, and the channel-forming step 316 correspond to the gate electrode-forming step 1, the gate insulating film and semiconductor film-forming step 2, the source metal film and resist film-forming step 3, the source metal film and semiconductor film-etching step 4, the resist film at channel-forming step 5, and the channel-forming step 6 in Embodiment 1, respectively. TFT or a TFT part in a diode (TFD) and the like is formed by the method mentioned in Embodiment 1. Other parts, for example, terminal parts in the peripheral region and other electrical contact parts may be formed according to a conventional technology.

The passivation layer-forming step 317 and the pixel electrode-forming step 318 are performed by a conventional technology. In the passivation layer-forming step 17, a silicon nitride film which serves as a passivation layer later is formed by a plasma enhanced CVD method and processed into a specific pattern by photolithography. As a result, a passivation layer for protecting the TFT and the like is obtained. In the pixel electrode-forming step, an ITO film which serves as a pixel electrode later by a sputtering method is formed and processed into a specific pattern by photolithography. As a result, a pixel electrode used in image display and the like is obtained.

Similarly, a TFT array substrate may be produced using the production methods of the TFT mentioned in Embodiments 2 to 6 and a conventional technology in combination.

The shapes mentioned in Embodiments 7 to 10 may be used as those of the TFT and the TFD.

This Nonprovisional application claims priority (under 35 U.S.C. §119) on Patent Application No. 2005-133244 filed in Japan on Apr. 28, 2005, the entire contents of which are hereby incorporated by reference.

The terms "or more" and "or less" include the described values, respectively.

BRIEF DESCRIPTION OF DRAWINGS

FIG. 2(*b*) is a cross-sectional view schematically showing the configuration taken along line A-A in FIG. 2(*a*).

FIG. 4(*b*) is a cross-sectional view schematically showing the configuration taken along line B-B in FIG. 4(*a*) (Embodiment 1).

FIG. 5(*b*) is a cross-sectional view schematically showing the configuration taken along line C-C in FIG. 5(*b*) (Embodiment 1).

FIG. 6(*b*) is a cross-sectional view schematically showing the configuration taken along line D-D in FIG. 6(*a*) (Embodiment 1).

FIG. 7(*b*) is a cross-sectional view schematically showing the configuration taken along line E-E in FIG. 7(*a*) (Embodiment 1).

FIG. 8(*b*) is a cross-sectional view schematically showing the configuration taken along line F-F in FIG. 8(*a*) (Embodiment 1).

FIG. 9(*b*) is a cross-sectional view schematically showing the configuration taken along line G-G in FIG. 9(*a*) (Embodiment 1).

FIG. 10(*b*) is a cross-sectional view schematically showing the configuration taken along line H-H in FIG. 10(*a*) (Embodiment 1).

FIG. 11(*b*) is across-sectional view schematically showing the configuration taken along line I-I in FIG. 11(*a*).

FIG. 13(*b*) is a cross-sectional view schematically showing the configuration taken along line J-J in FIG. 13(*a*).

FIG. 14(*b*) is a cross-sectional view schematically showing the configuration taken along line K-K in FIG. 14(*a*).

FIG. 36-1(a) is a planar view schematically showing one example of the configuration of the TFT according to Embodiment 7; and FIG. 36-1(b) is a cross-sectional view schematically showing the TFT taken along line X-X in FIG. 36-1(a).

FIG. 36-2(a) is a planar view schematically showing another example of the configuration of the TFT in Embodiment 7; and FIG. 36-2(b) is a cross-sectional view schematically showing the TFT taken along line Y-Y in FIG. 36-2(b).

FIG. 45-1 is a planar view schematically showing one example of the configuration of the active matrix substrate according to Embodiment 11.

FIG. 45-2 is a planar view schematically showing one example of the configuration of the active matrix substrate according to Embodiment 11.

FIG. 45-3 is a planar view schematically showing one example of the configuration of the active matrix substrate according to Embodiment 11.

FIG. 45-4 is a planar view schematically showing one example of the configuration of the active matrix substrate according to Embodiment 11.

FIG. 45-5 is a planar view schematically showing one example of the configuration of the active matrix substrate according to Embodiment 11.

EXPLANATION OF NUMERALS AND SYMBOLS

Figure 1:
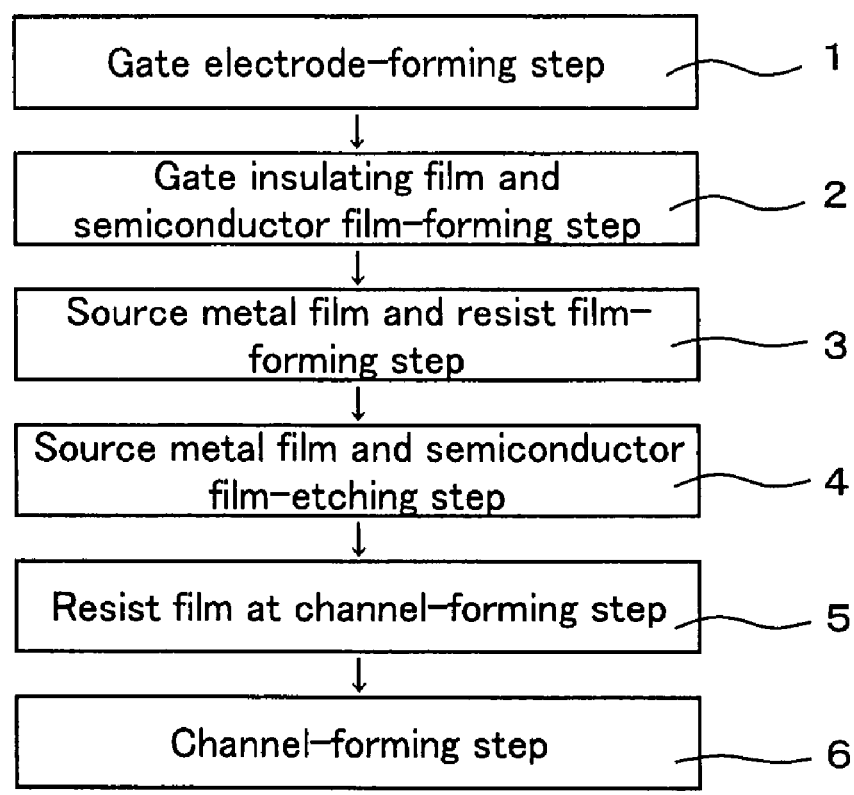
FIG. 1 is a flowchart showing order of the production steps of the TFT according to Embodiment 1 of the present invention.
Figure 2:
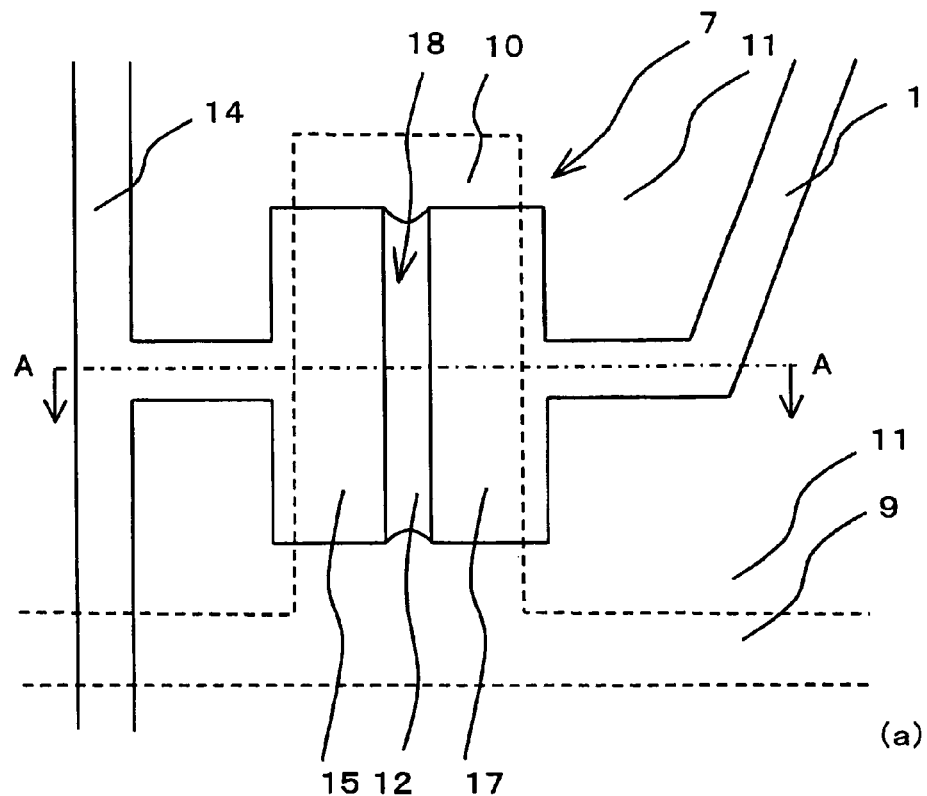
FIG. 2(*a*) is a planer view schematically showing the TFT produced by the production method of Embodiment 1 and a configuration near the TFT.
Figure 2:
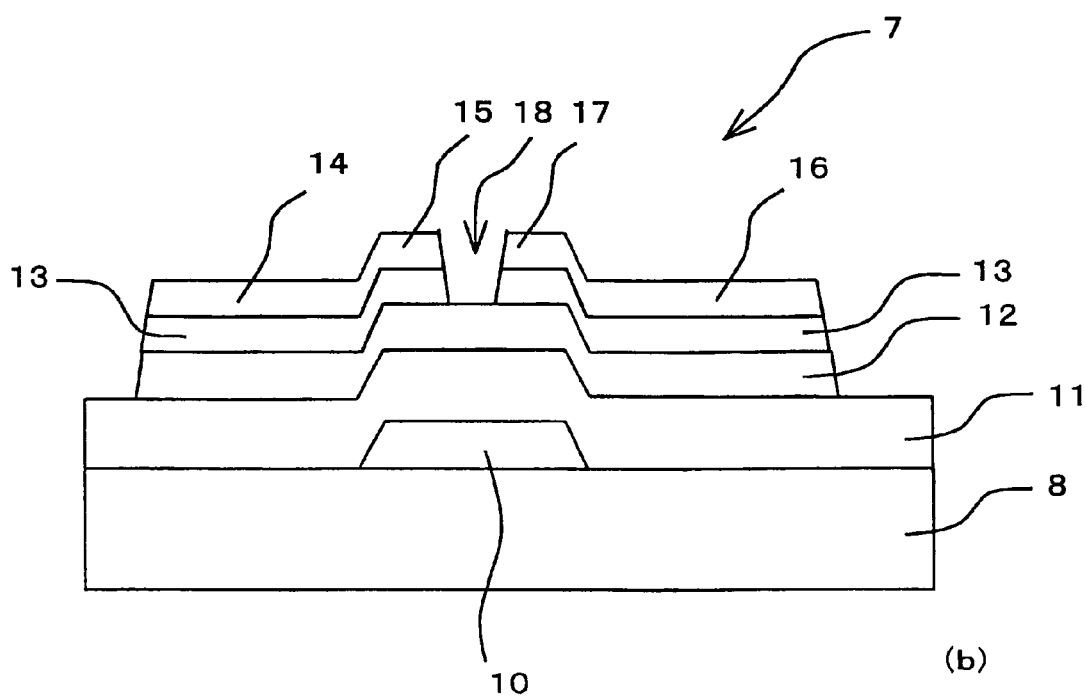
Figure 3:
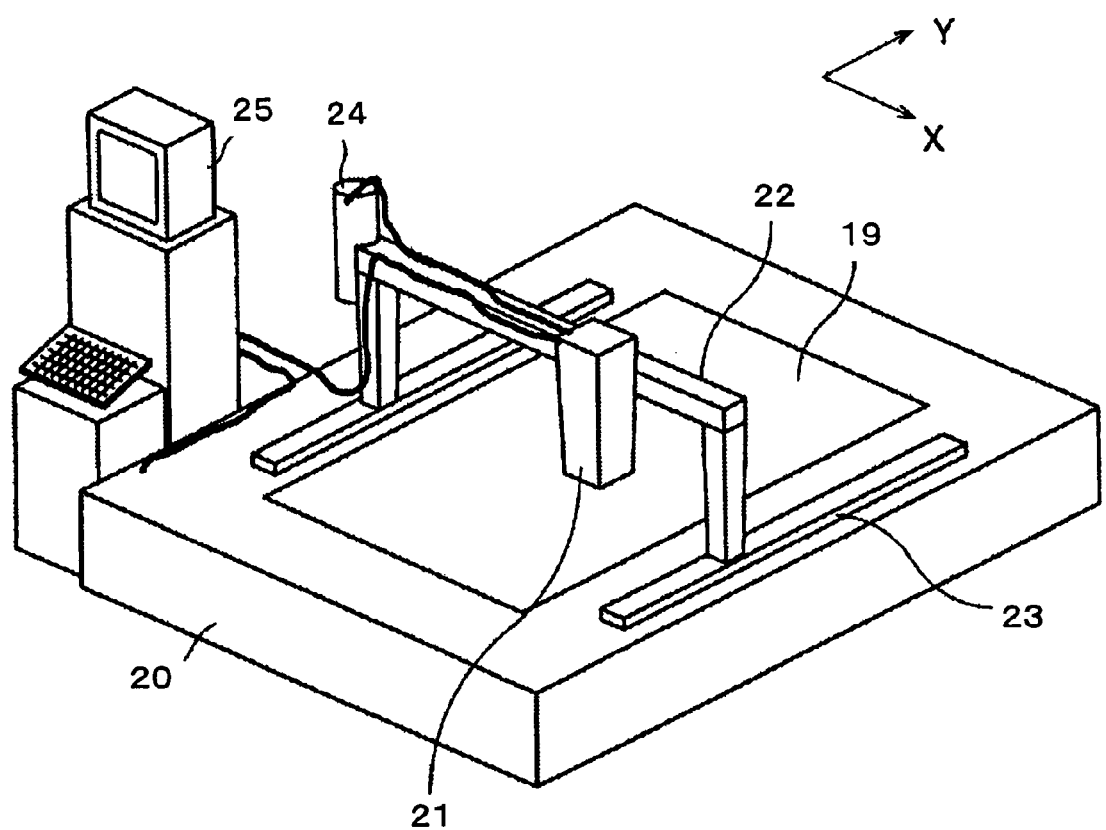
FIG. 3 is a perspective view schematically showing a structure of an ink-jet device.
Figure 4:
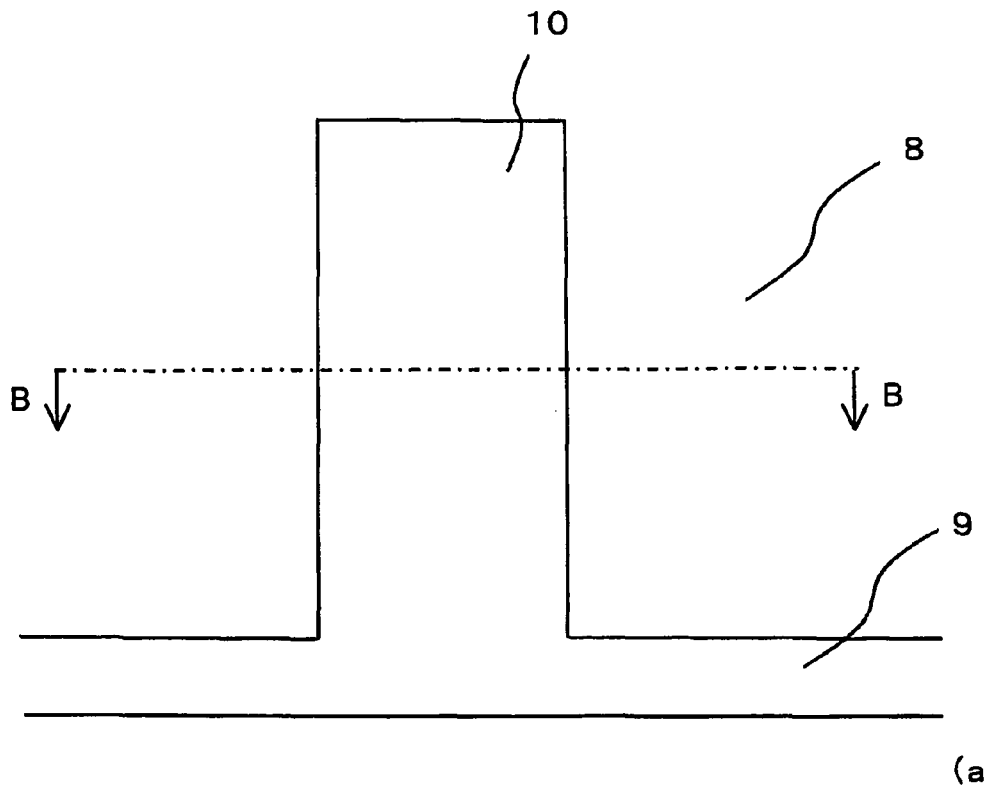
FIG. 4(*a*) is a planar view schematically showing a configuration after the gate electrode-forming step 1 in the production process of the TFT 7.
Figure 4:
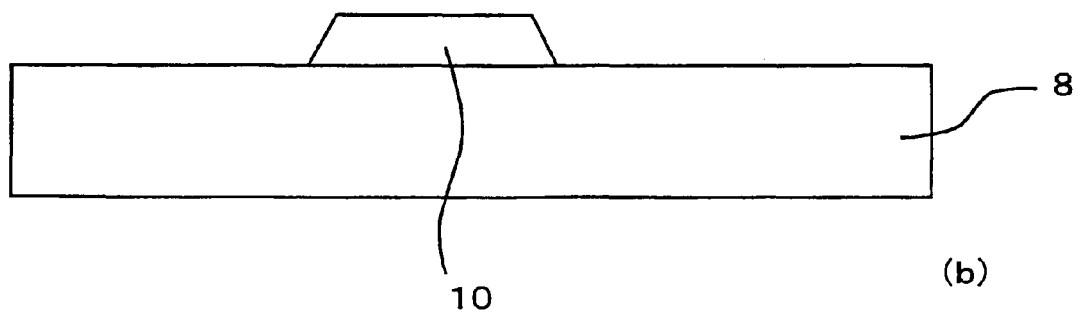
Figure 5:
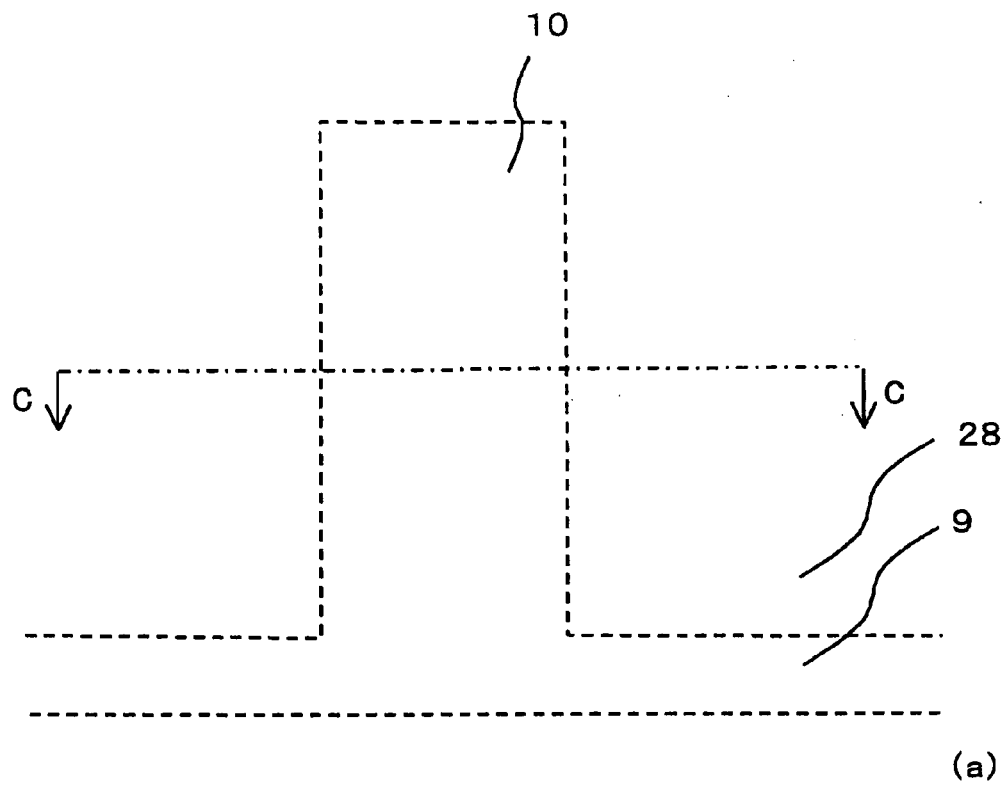
FIG. 5(*a*) is a planar view schematically showing a state after the gate insulating film and semiconductor film-forming step 2 in the production process of the TFT 7.
Figure 5:
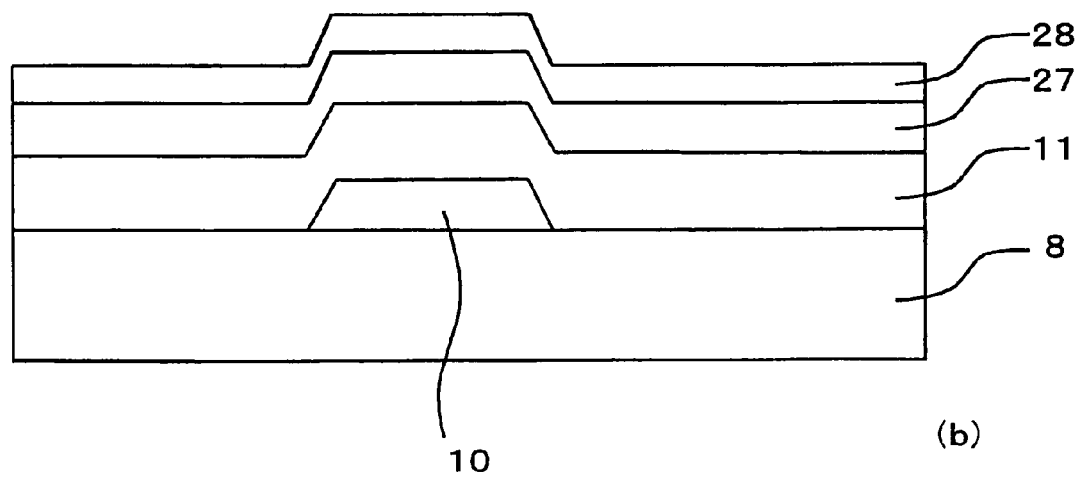
Figure 6:
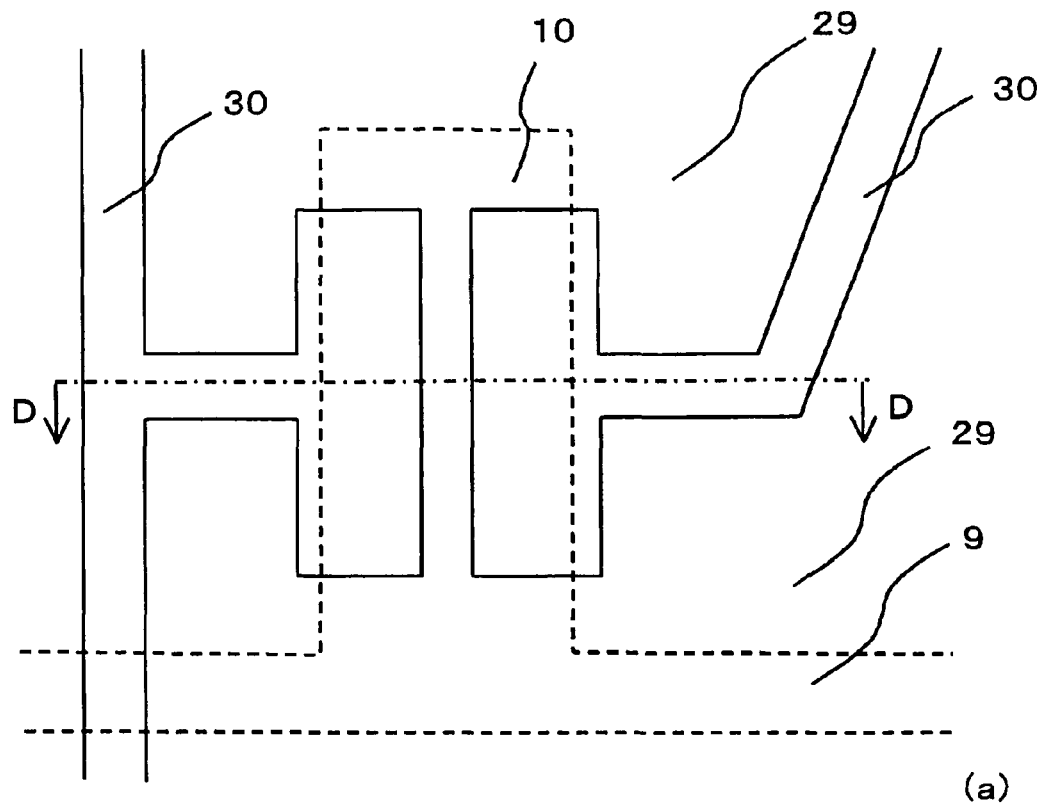
FIG. 6(*a*) is a cross-sectional view schematically showing a state after the source metal film and resist film-forming step in the production process of the TFT 7.
Figure 6:
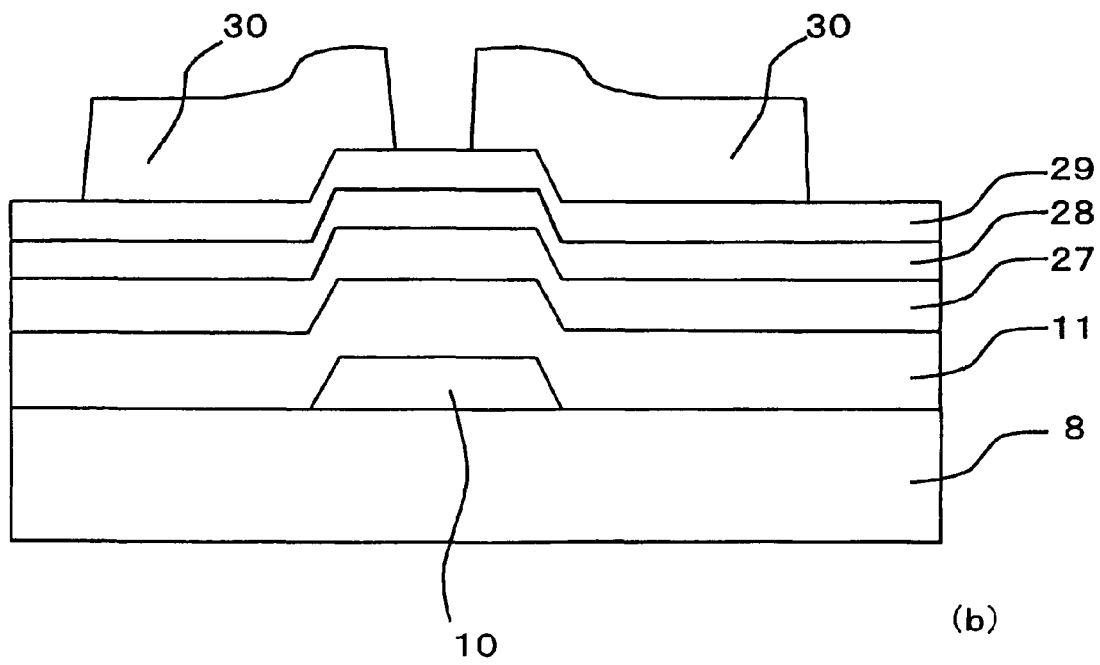
Figure 7:
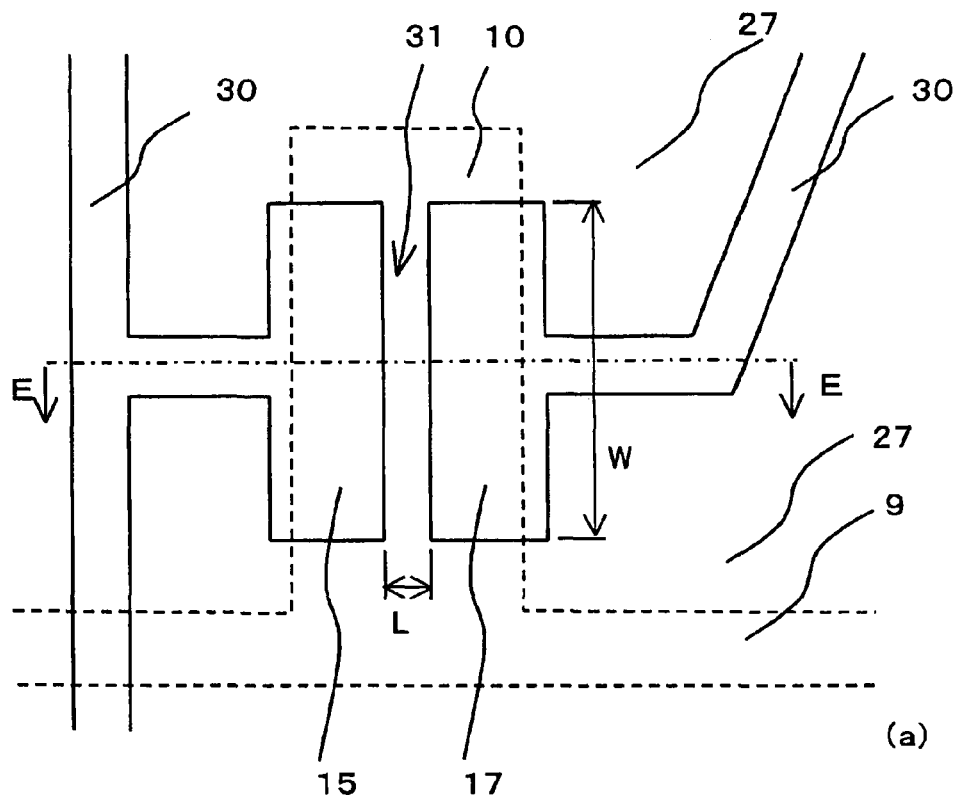
FIG. 7(*a*) is a cross-sectional view schematically showing a state after the source metal film and semiconductor film-etching step 4 in the production process of the TFT 7.
Figure 7:
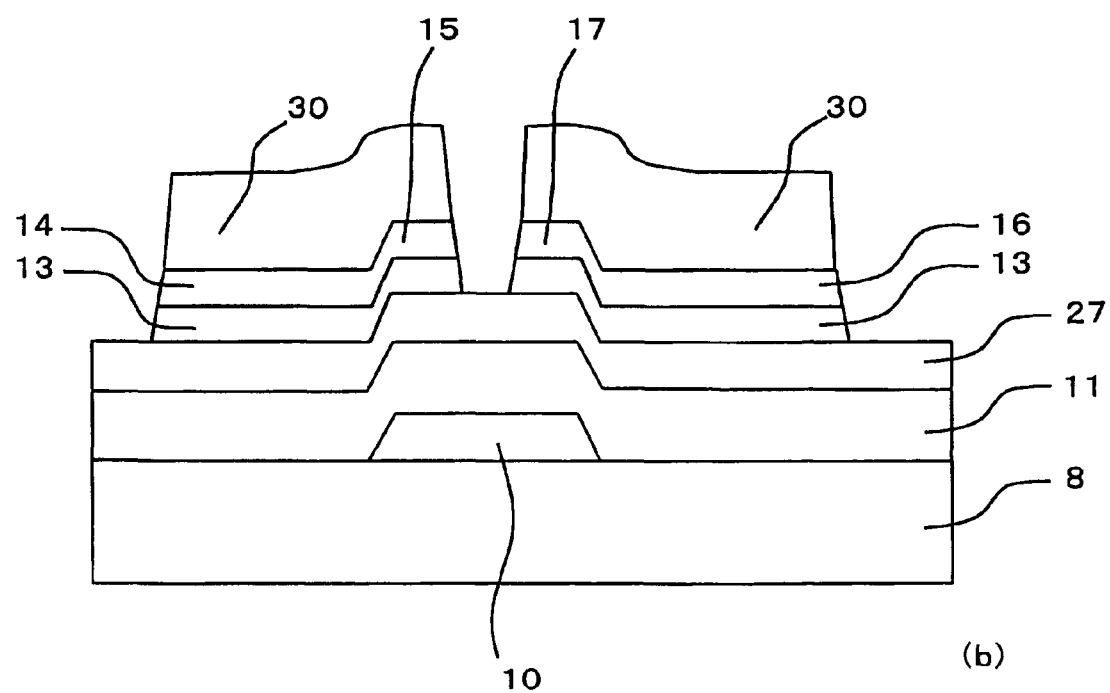
Figure 8:
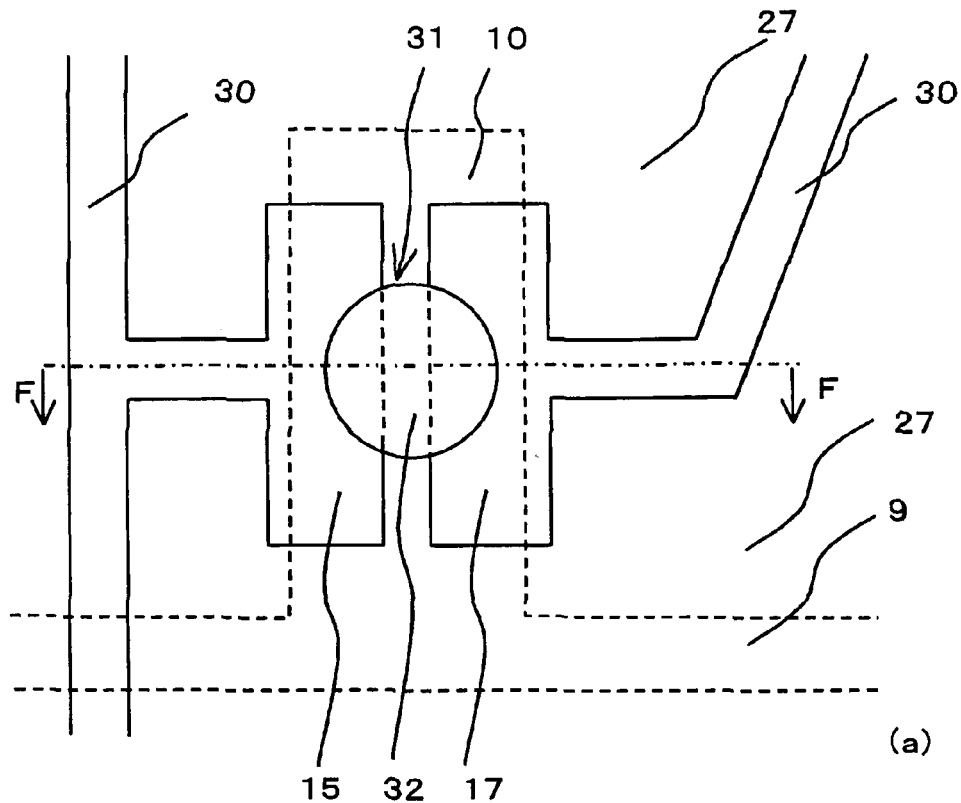
FIG. 8(*a*) is a planar view schematically showing a state where a resist droplet has just landed on the TFT gap 31.
Figure 8:
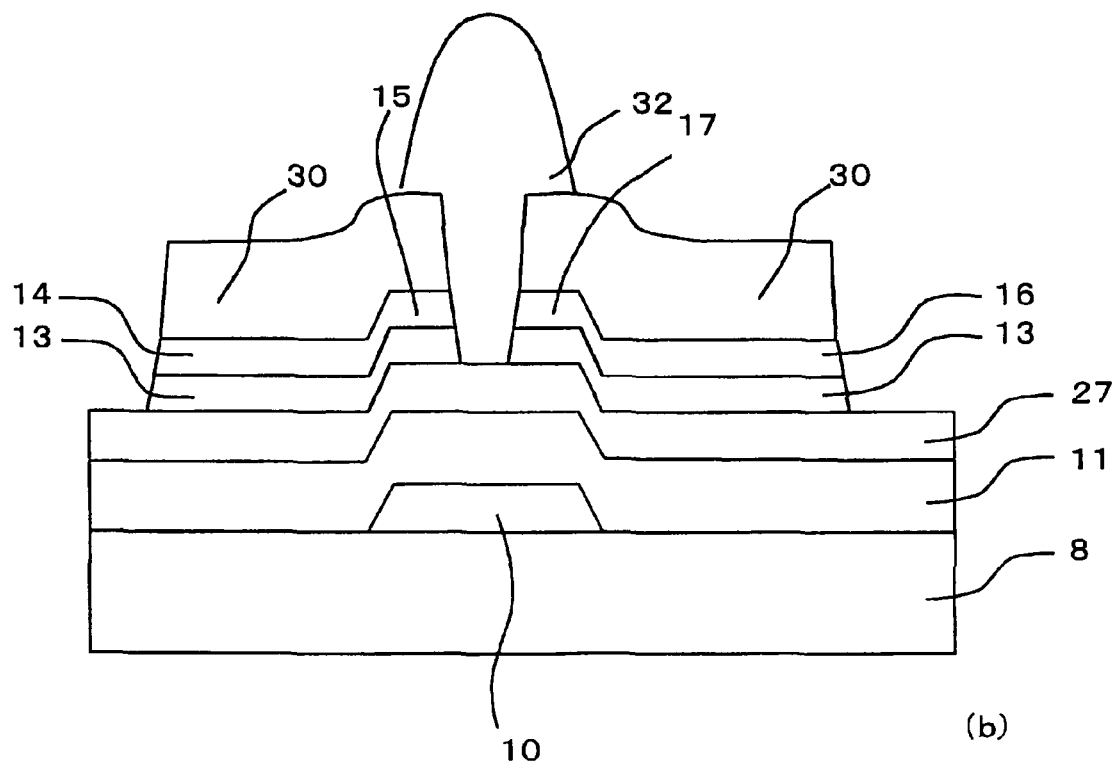
Figure 9:
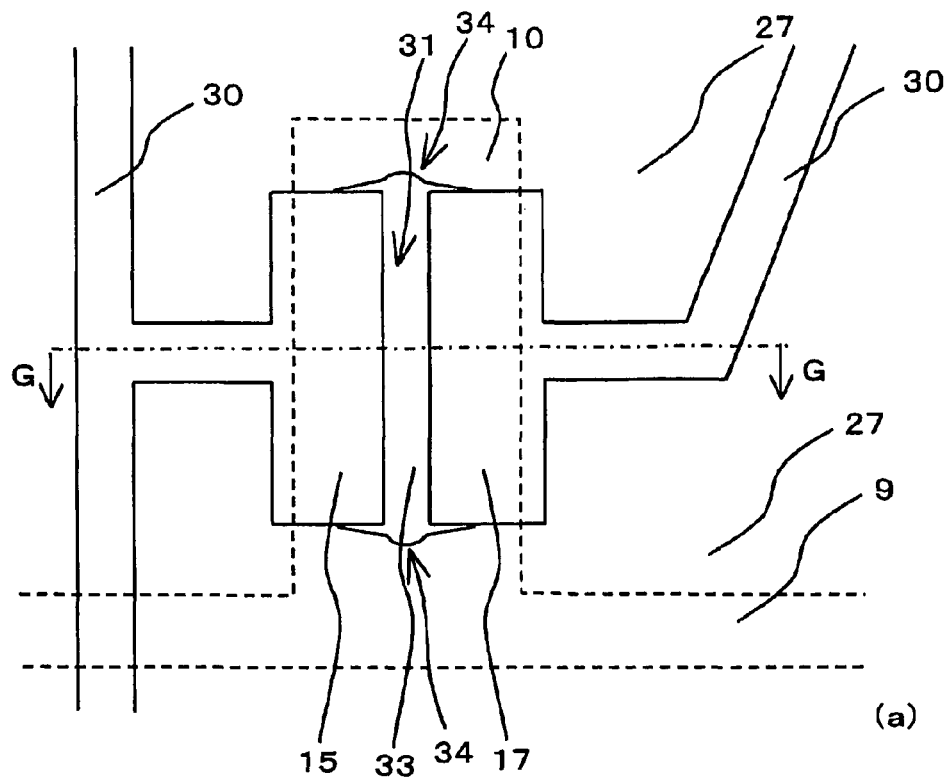
FIG. 9(*a*) is a planar view schematically showing a state where the resist droplet 32 shown in FIG. 8(*a*) is deformed because of its fluidity after landed.
Figure 9:
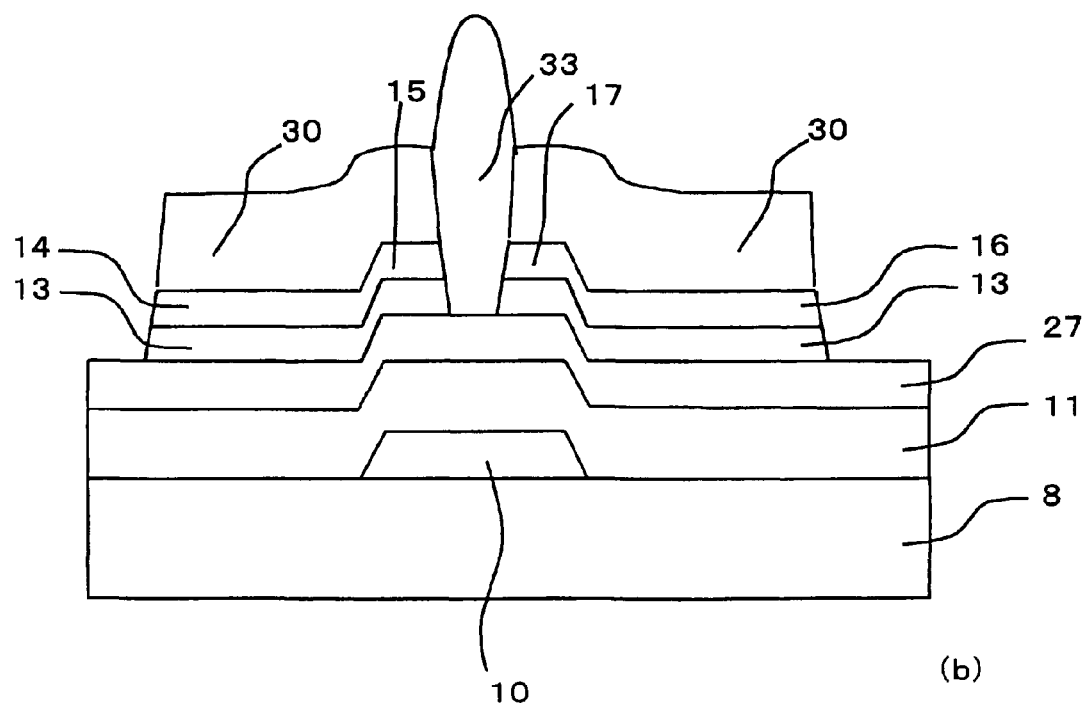
Figure 10:
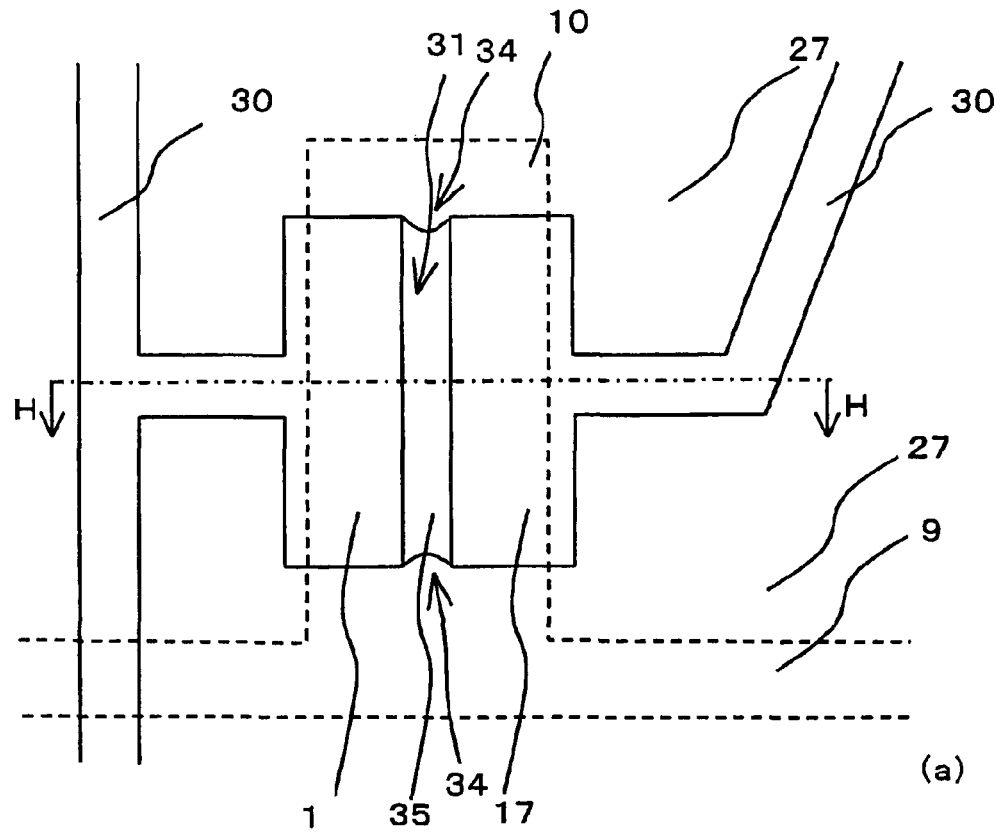
FIG. 10(*a*) is a planar view schematically showing a state where the resist pattern film 35 is formed inside the TFT gap 31.
Figure 10:
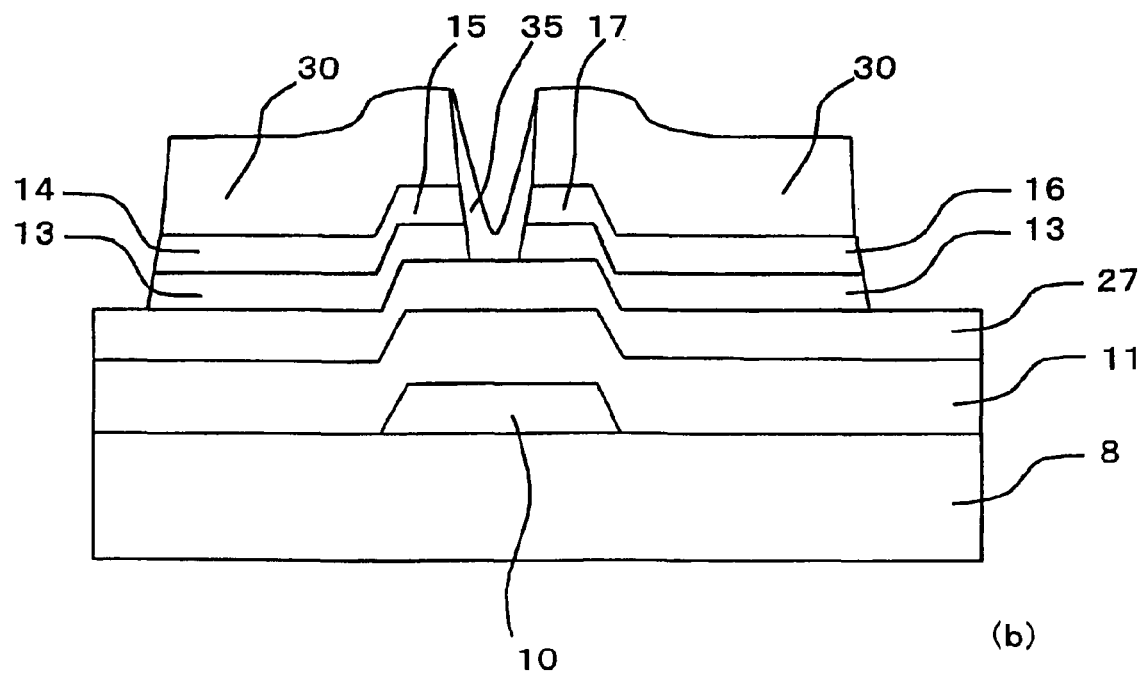
Figure 11:
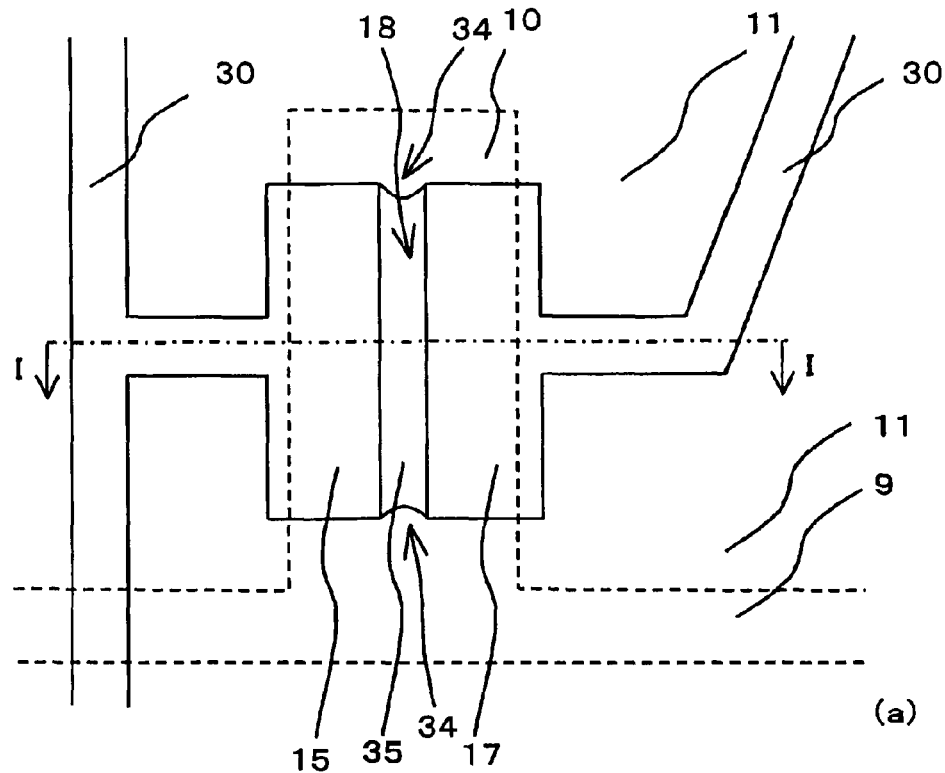
FIG. 11(*a*) is a planar view schematically showing a state after the channel-forming step 6 in the production process of the TFT 7.
Figure 11:
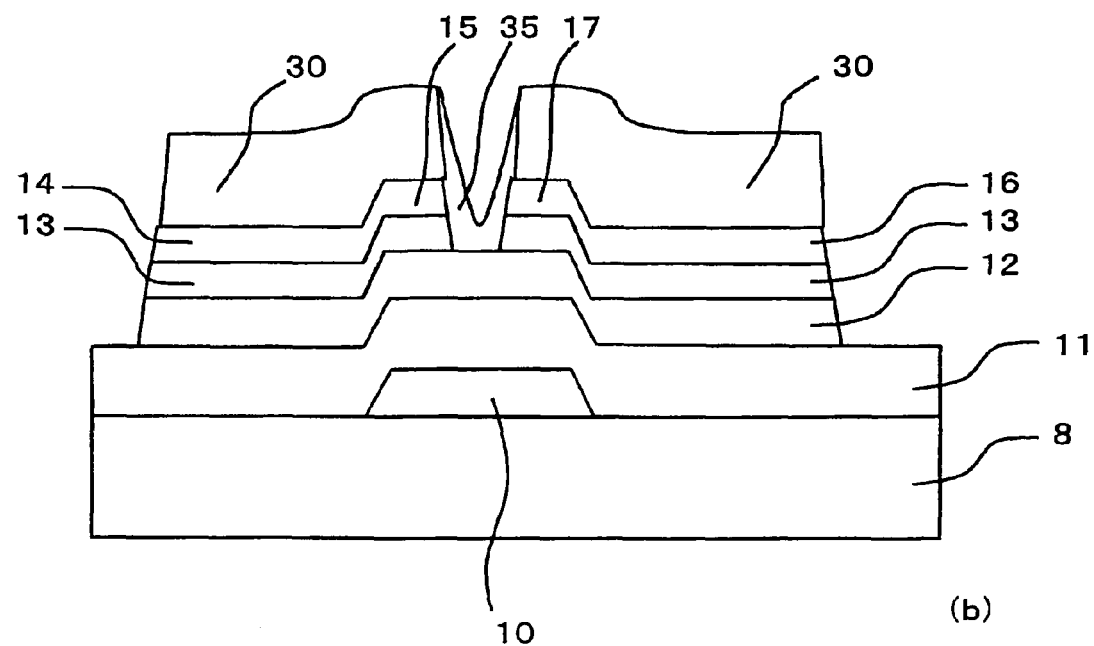
Figure 12:
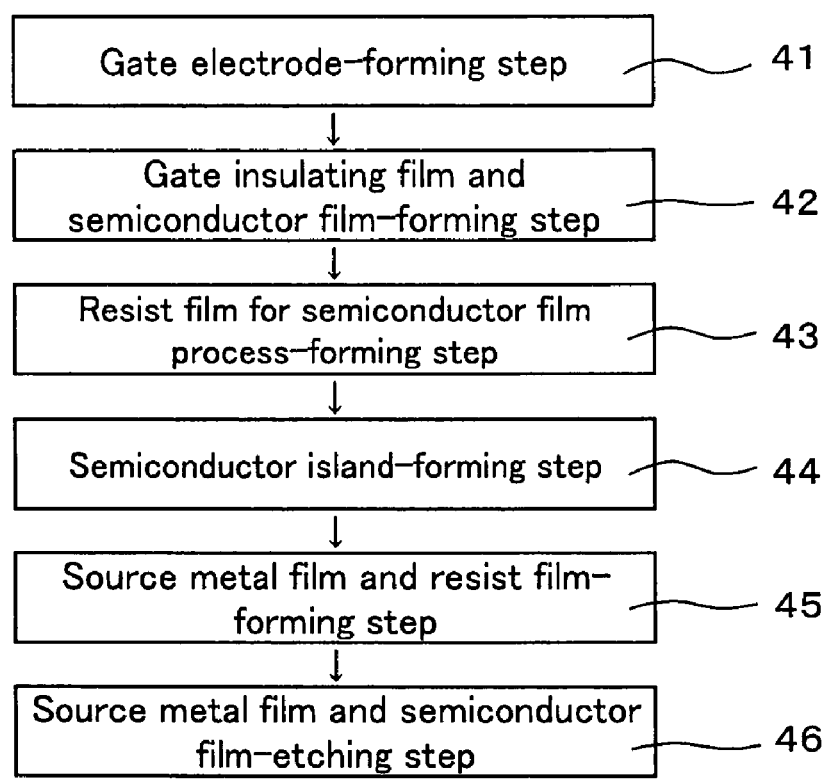
FIG. 12 is a flowchart showing order of the production steps of the TFT according to Comparative Embodiment 1.
Figure 13:
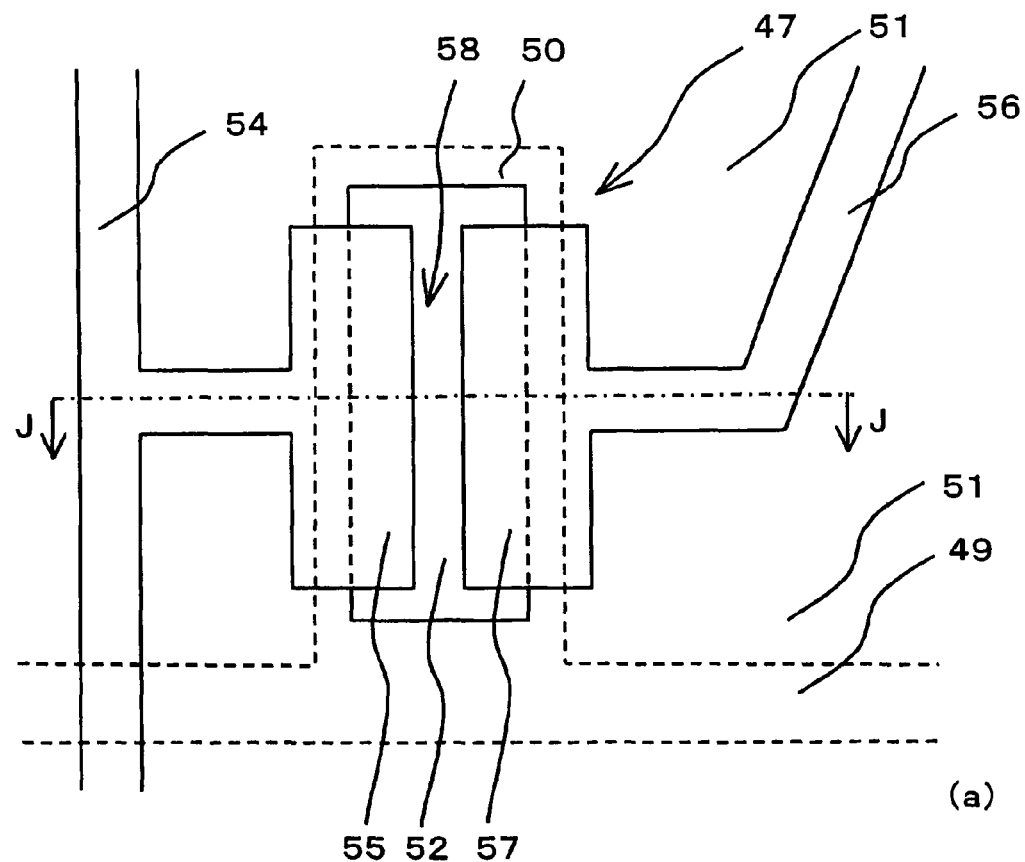
FIG. 13(*a*) is a planer view schematically showing the TFT prepared by the production method of Comparative Embodiment 1 and a configuration near the TFT.
Figure 13:
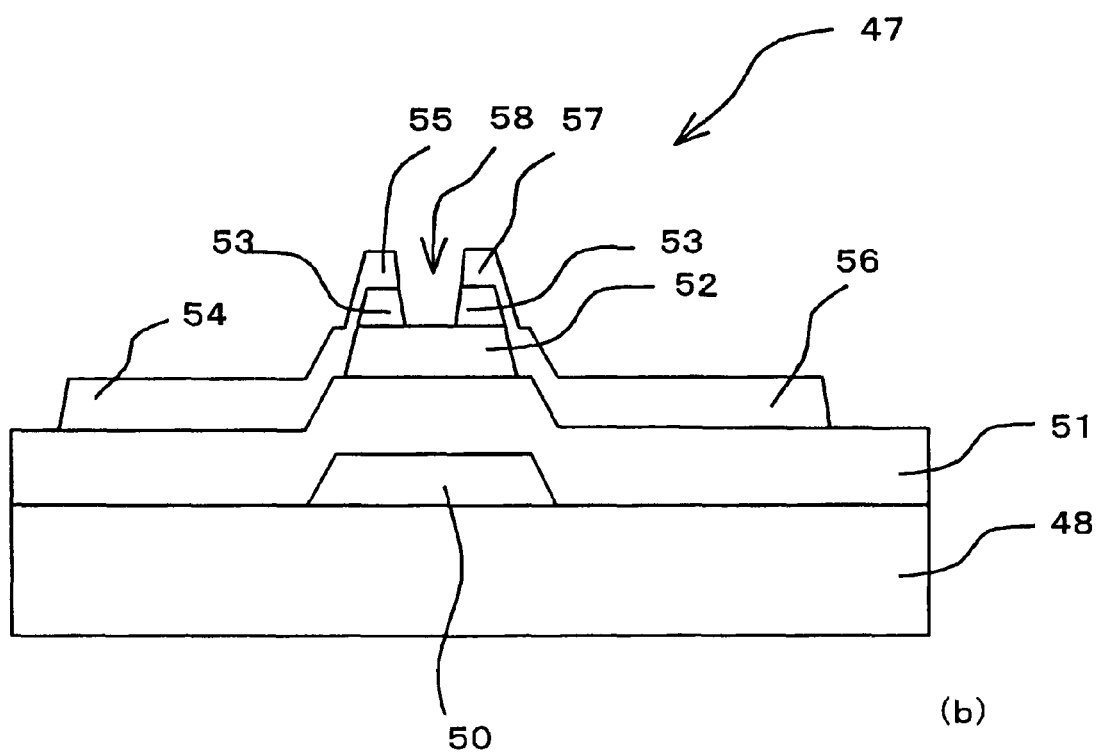
Figure 14:
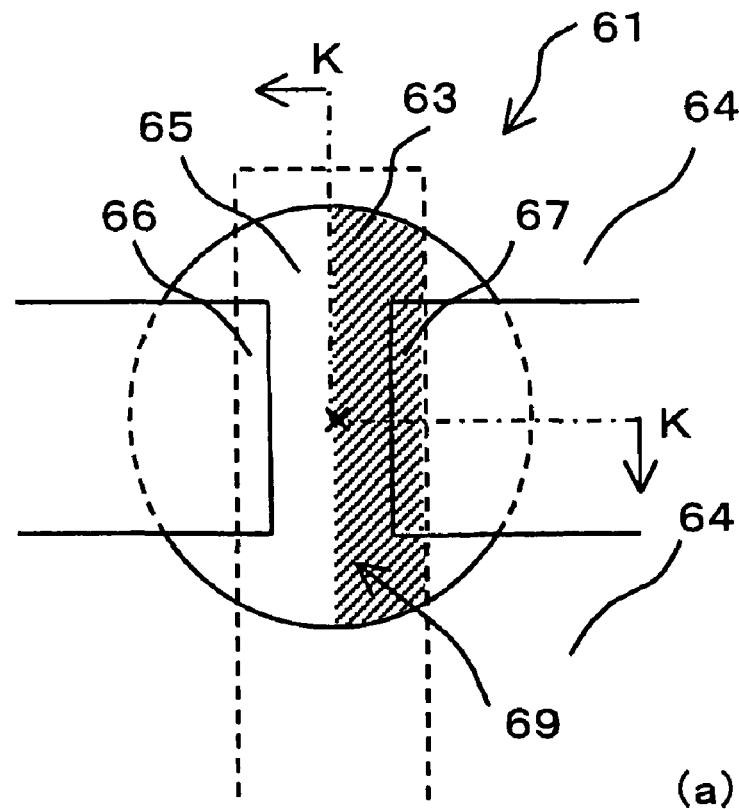
FIG. 14(*a*) is a planar view schematically showing a configuration of the TFT prepared by the production method in Patent Document 5.
Figure 14:
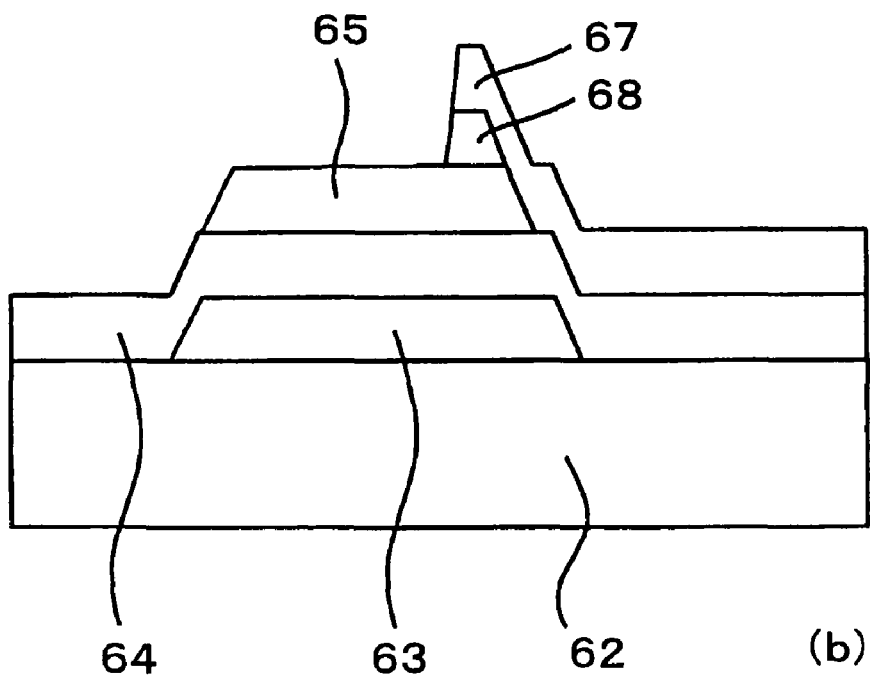
Figure 15:
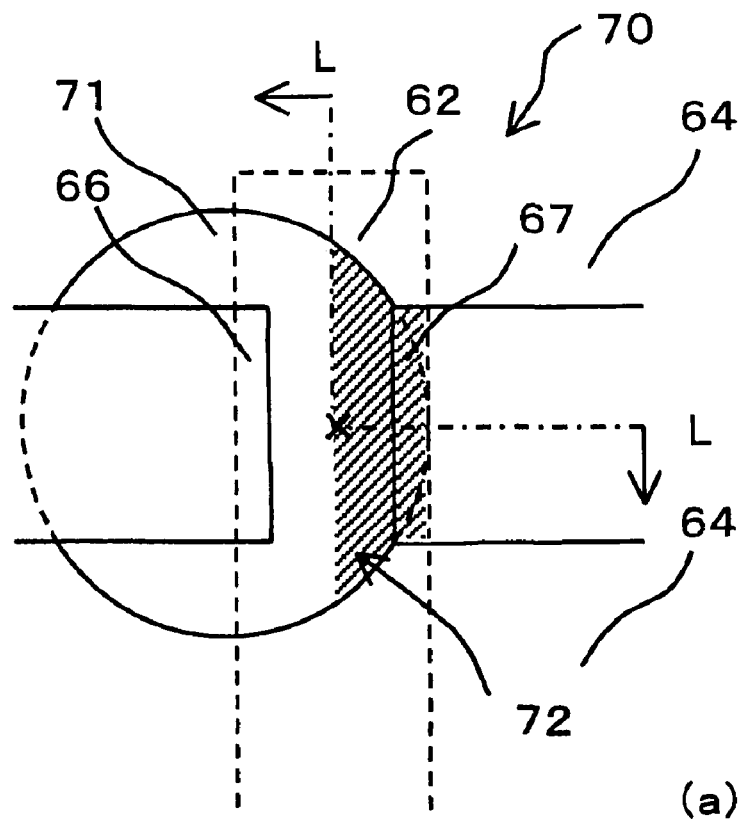
FIG. 15(a) is a planar view schematically showing a configuration of the TFT prepared by the production method in Patent Document 5.
FIG. 15(b) is a cross-sectional view schematically showing the configuration taken along line L-L in FIG. 15(a).
Figure 15:
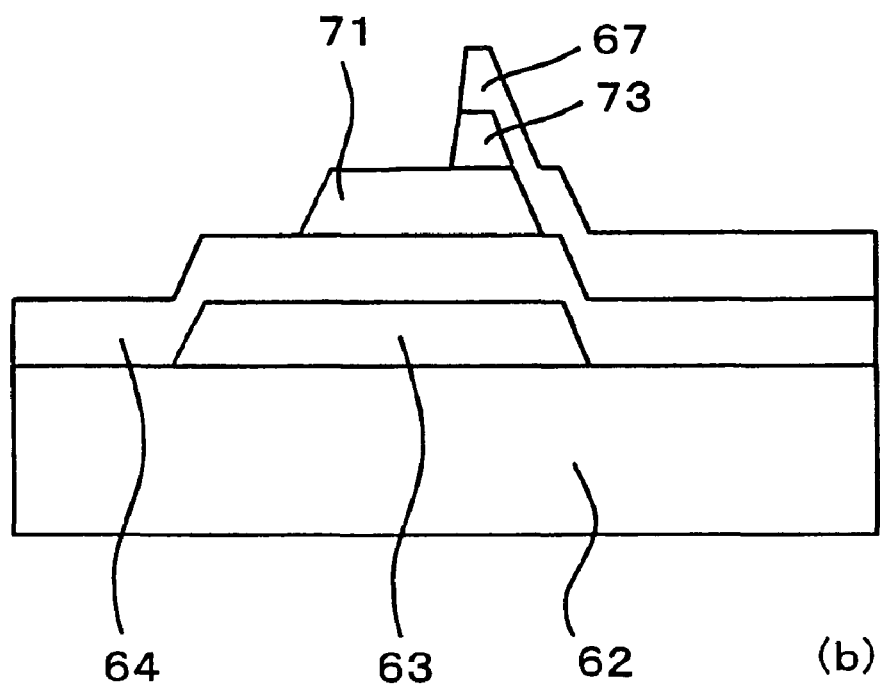
Figure 16:
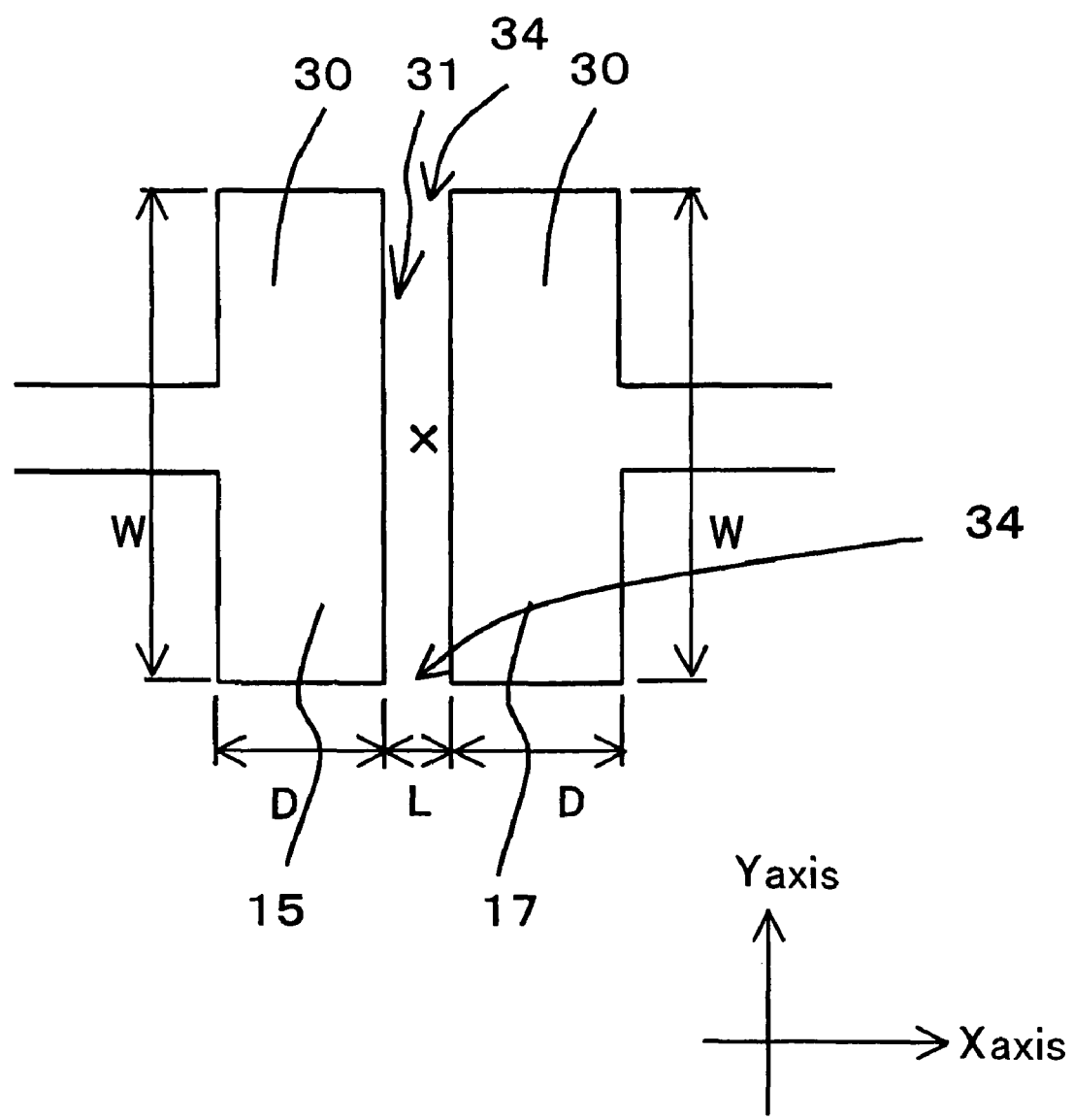
FIG. 16 is an enlarged planar view schematically showing a part after completion of the source metal film and semiconductor film-etching step 4 in Embodiment 1 (FIG. 7(a)).
Figure 17:
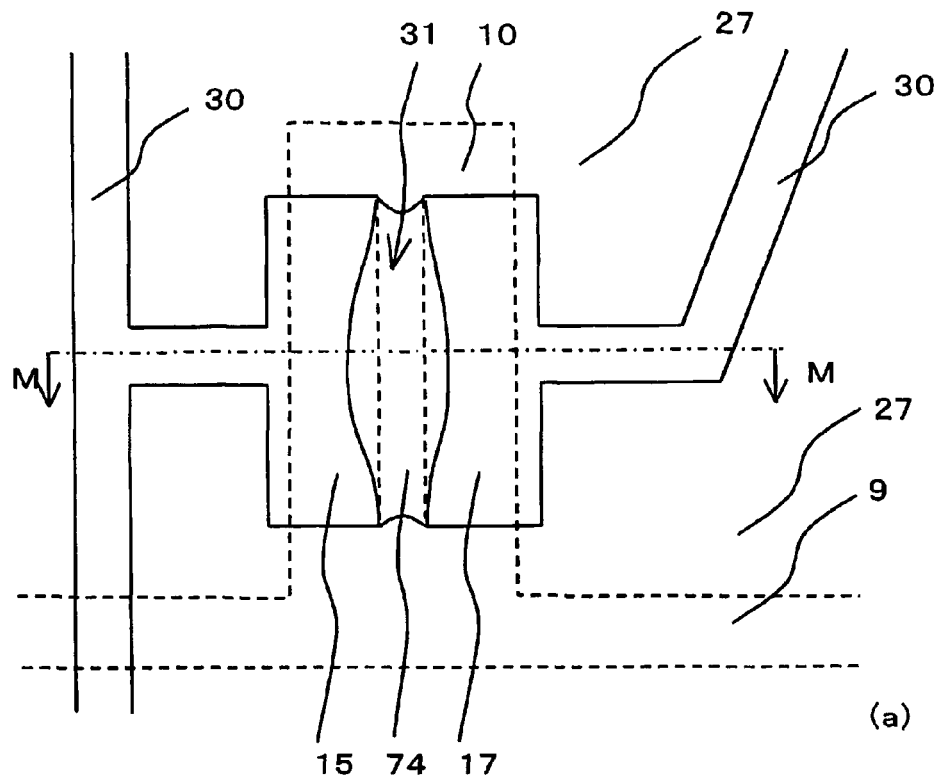
FIG. 17(a) is a planar view schematically showing a state where the resist pattern film 74 slightly flows out of the TFT gap 31 and is also formed on the upper part of the resist pattern film 30.
FIG. 17(b) is a cross-sectional view schematically showing the configuration taken along line M-M in FIG. 17(a) (Modified Embodiment of Embodiment 1).
Figure 17:
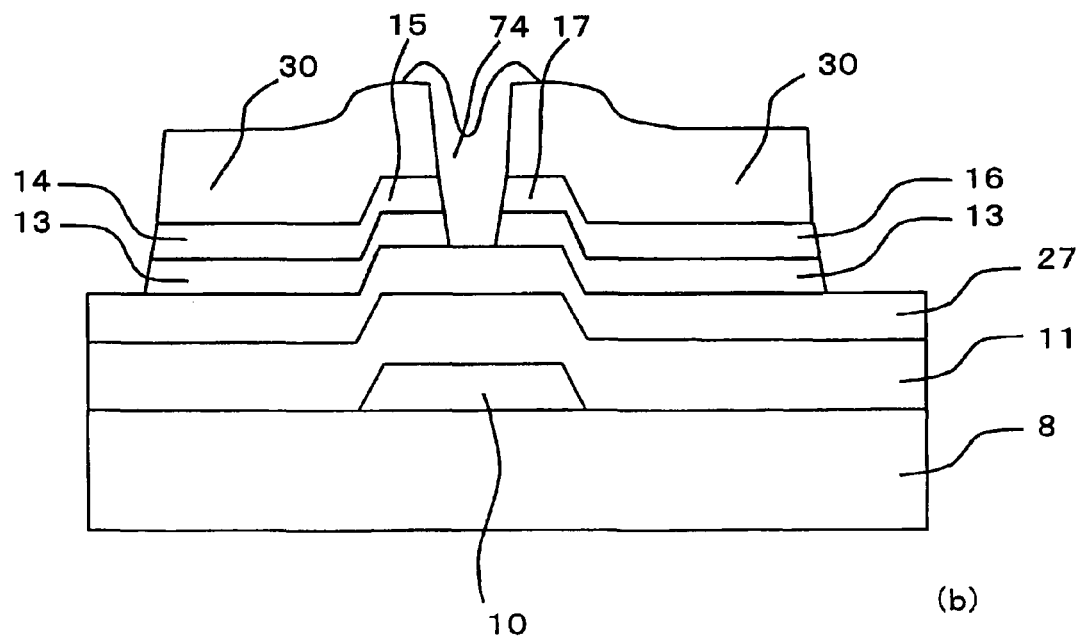
Figure 18:
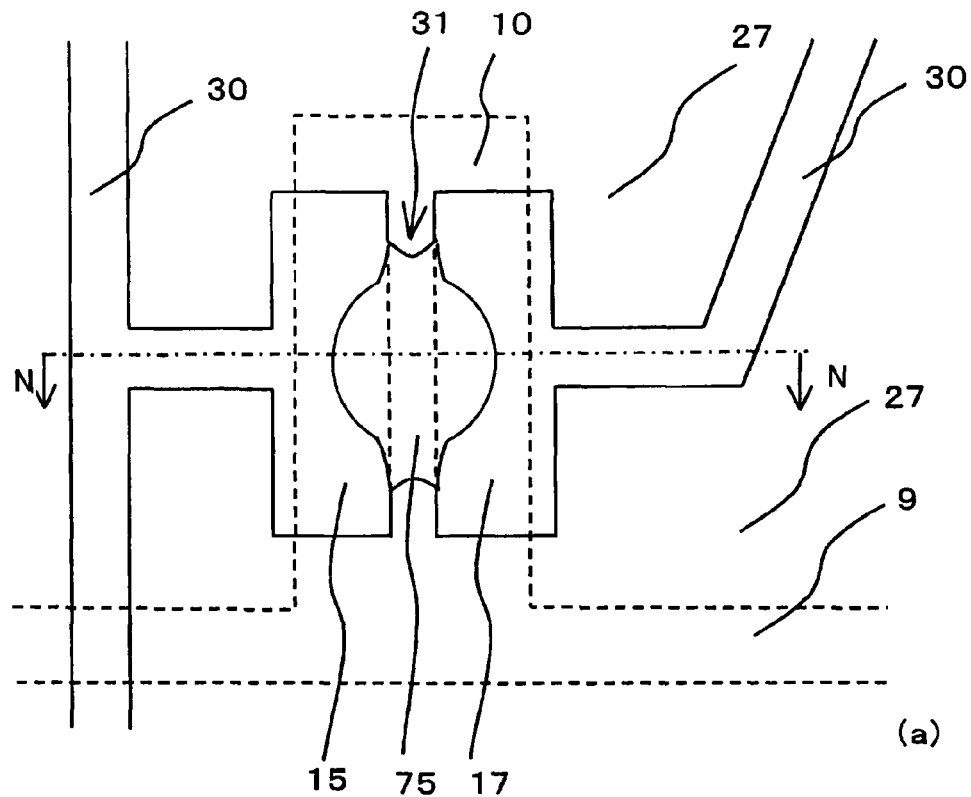
FIG. 18(a) is a planar view schematically showing a state where the resist pattern film 75 is formed only near the center of the TFT gap 31.
FIG. 18(b) is a cross-sectional view schematically showing the configuration taken along line N-N in FIG. 18(a) (Modified Embodiment of Embodiment 1).
Figure 18:
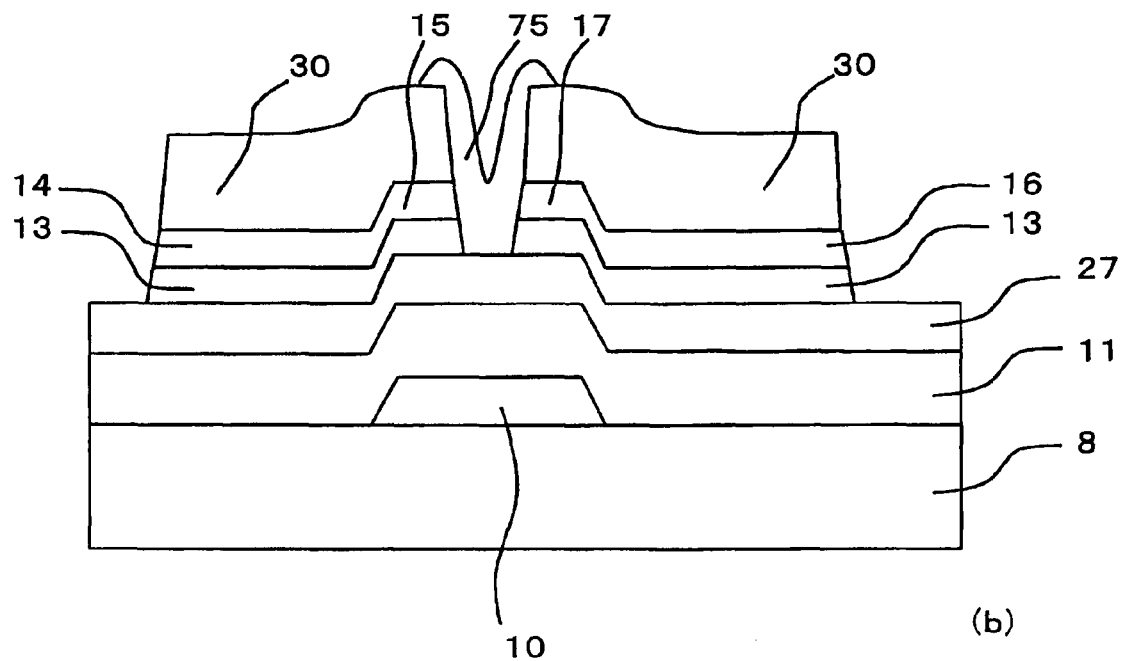
Figure 19:
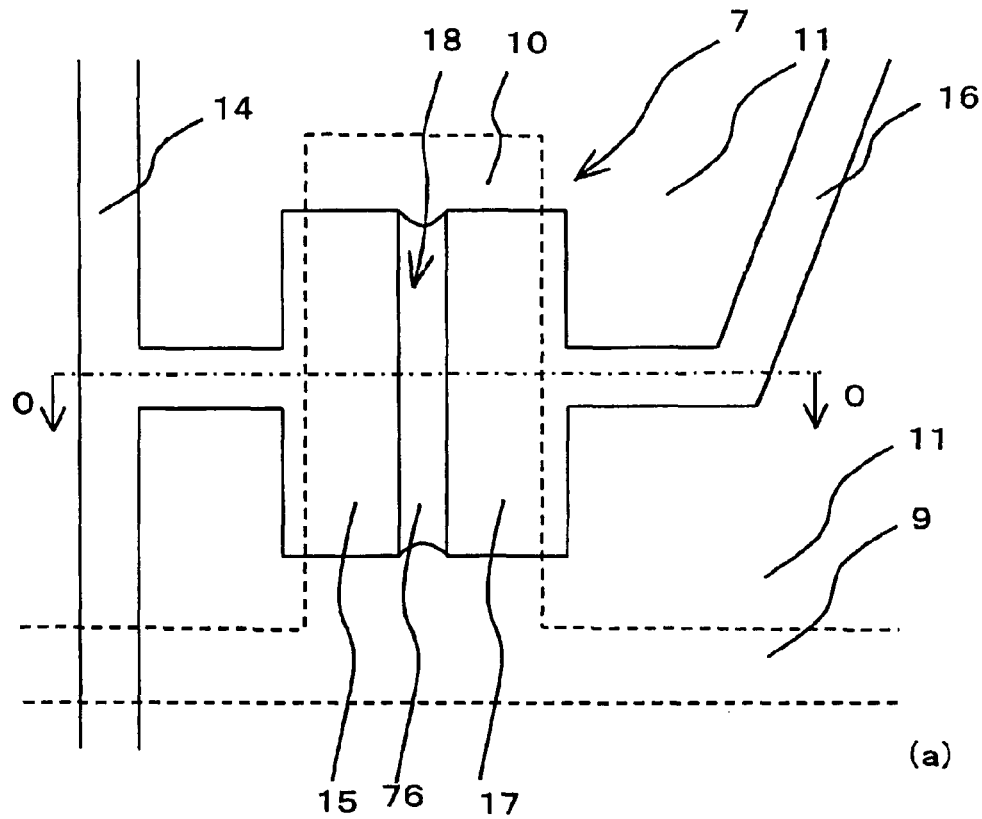
FIG. 19(a) is a planar view schematically showing a state where the lyophilic or lyophobic film 76 remains at the TFT gap 31.
FIG. 19(b) is a cross-sectional view schematically showing the configuration taken along line O-O in FIG. 19(a).
Figure 19:
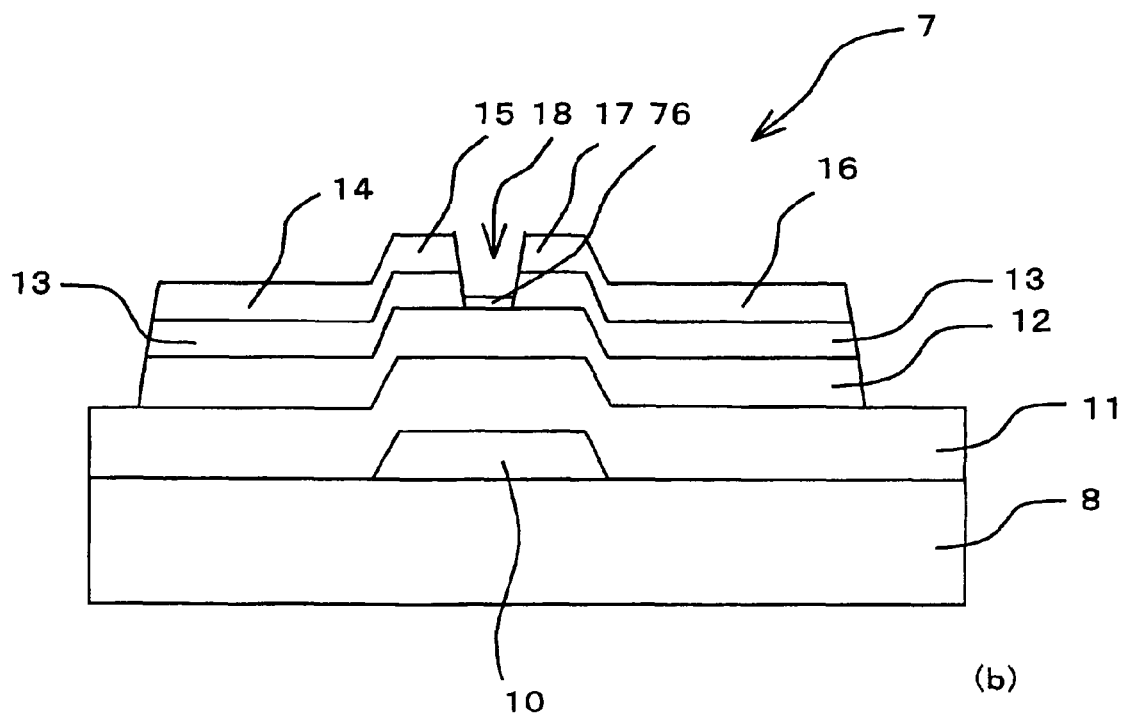
Figure 20:
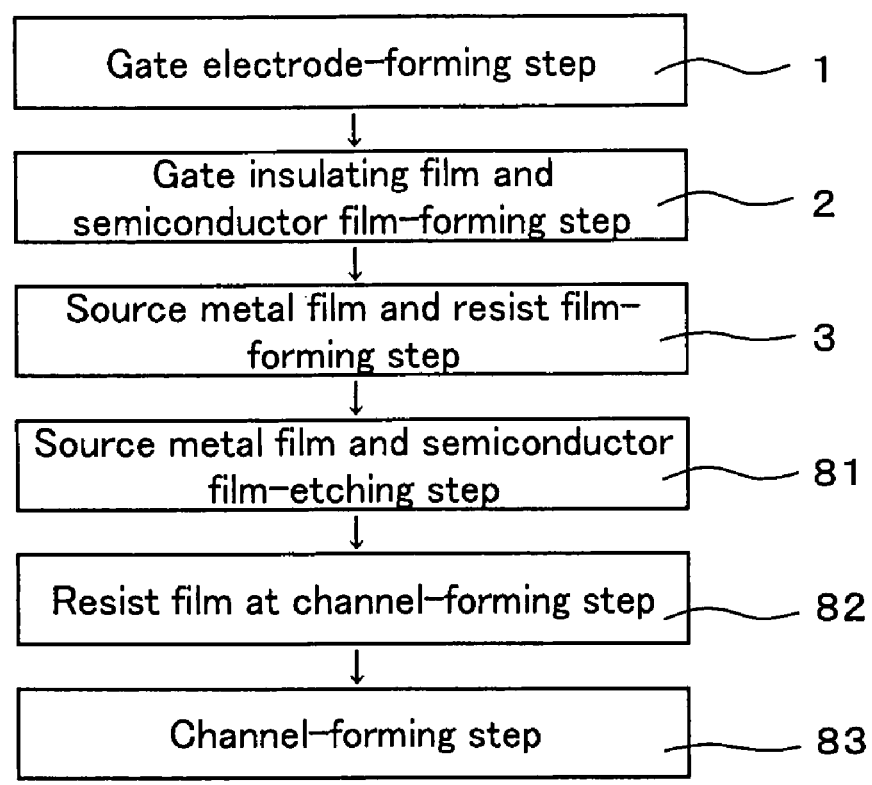
FIG. 20 is a flowchart showing order of the production steps of the TFT according to Embodiment 2 of the present invention.
Figure 21:
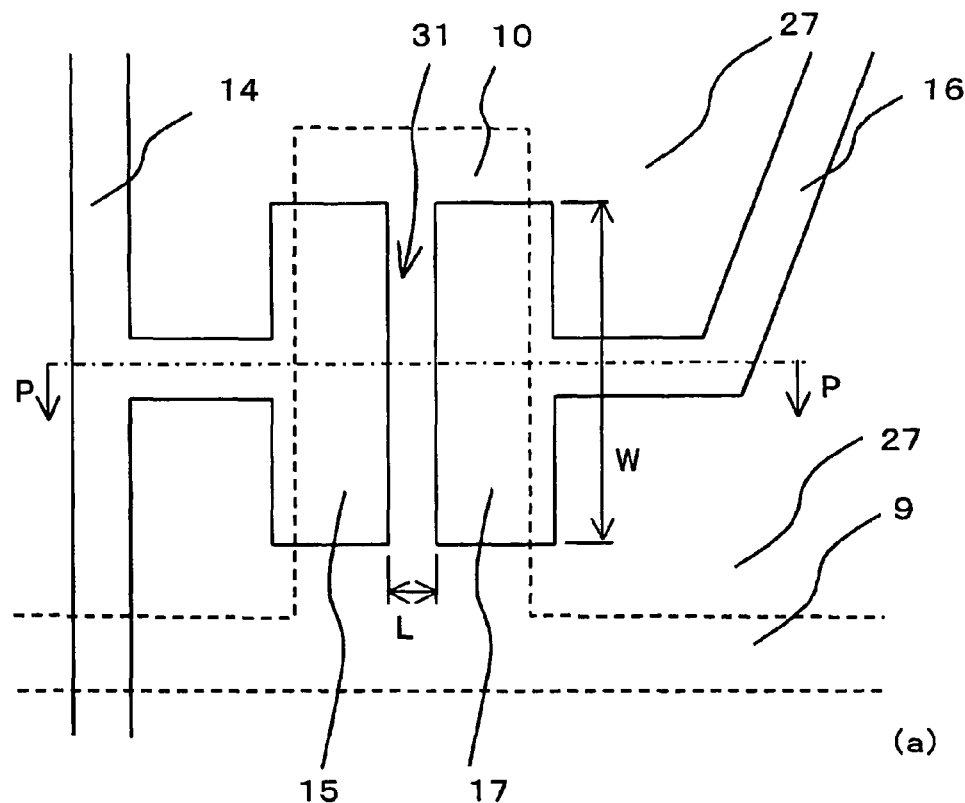
FIG. 21(a) is a planar view schematically showing a state after completion of the source metal film and semiconductor film-etching step 81 is completed.
FIG. 21(b) is a cross-sectional view schematically showing the configuration taken along line P-P in FIG. 21(a).
Figure 21:
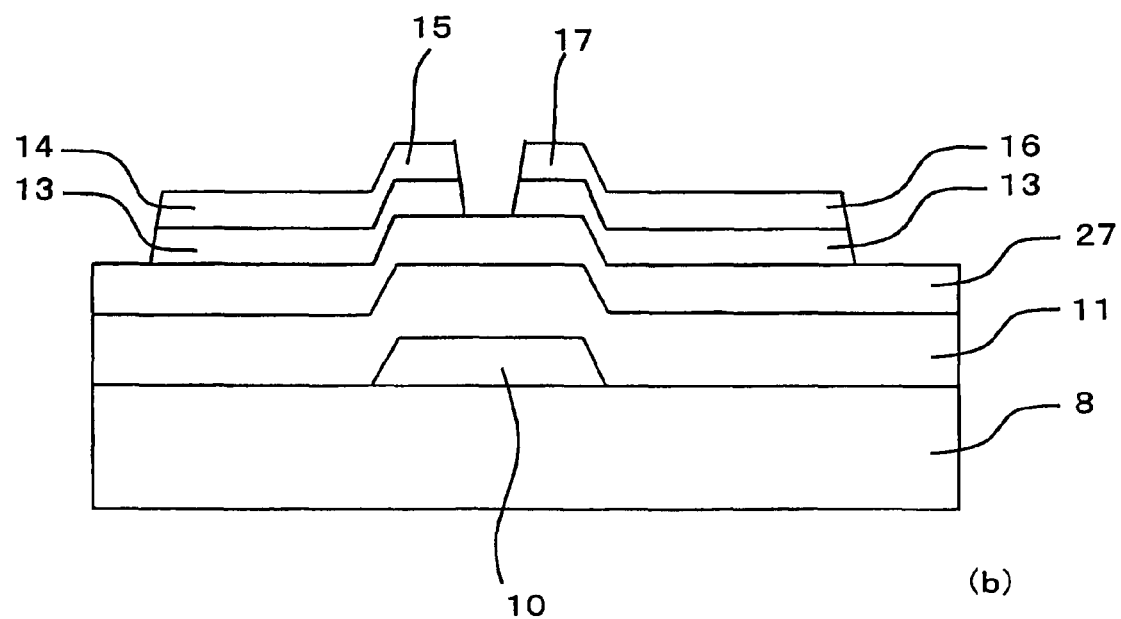
Figure 22:
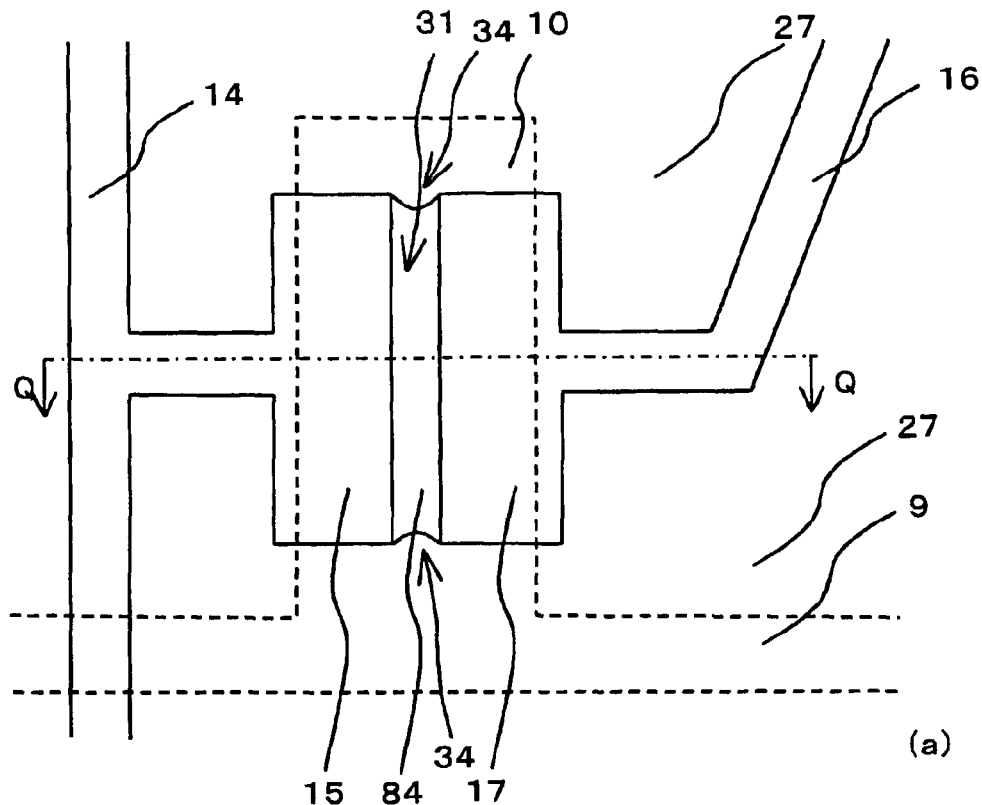
FIG. 22(a) is a planar view schematically showing a state after completion of the resist film at channel-forming step 82.
FIG. 22(b) is a cross-sectional view schematically showing the configuration taken along line Q-Q in FIG. 22(a).
Figure 22:
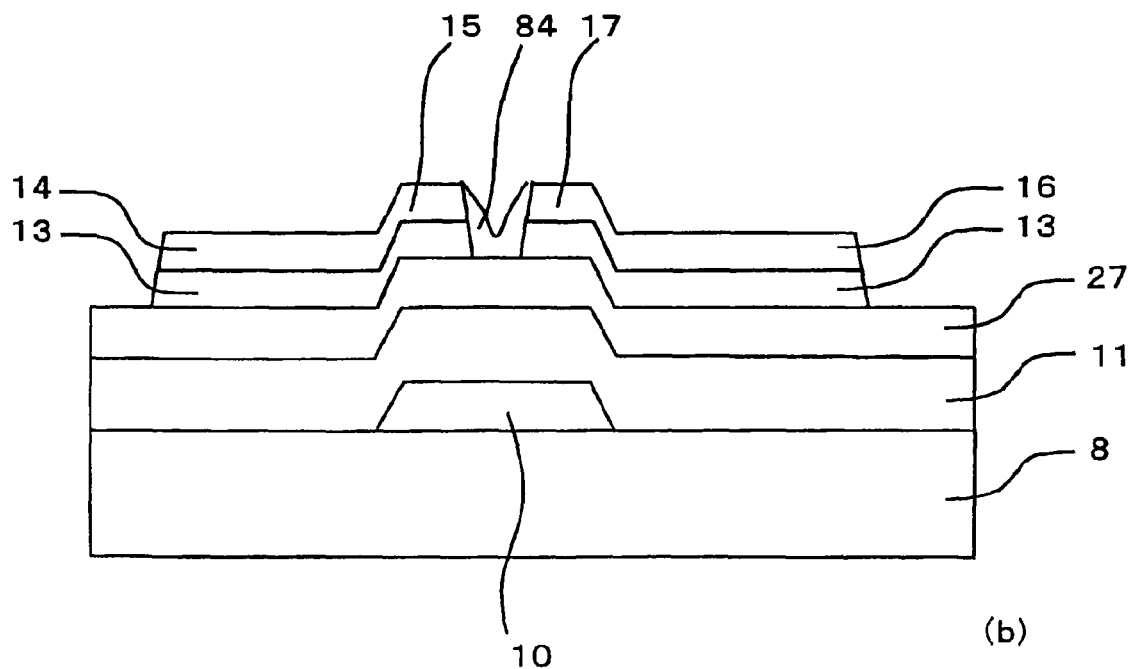
Figure 23:
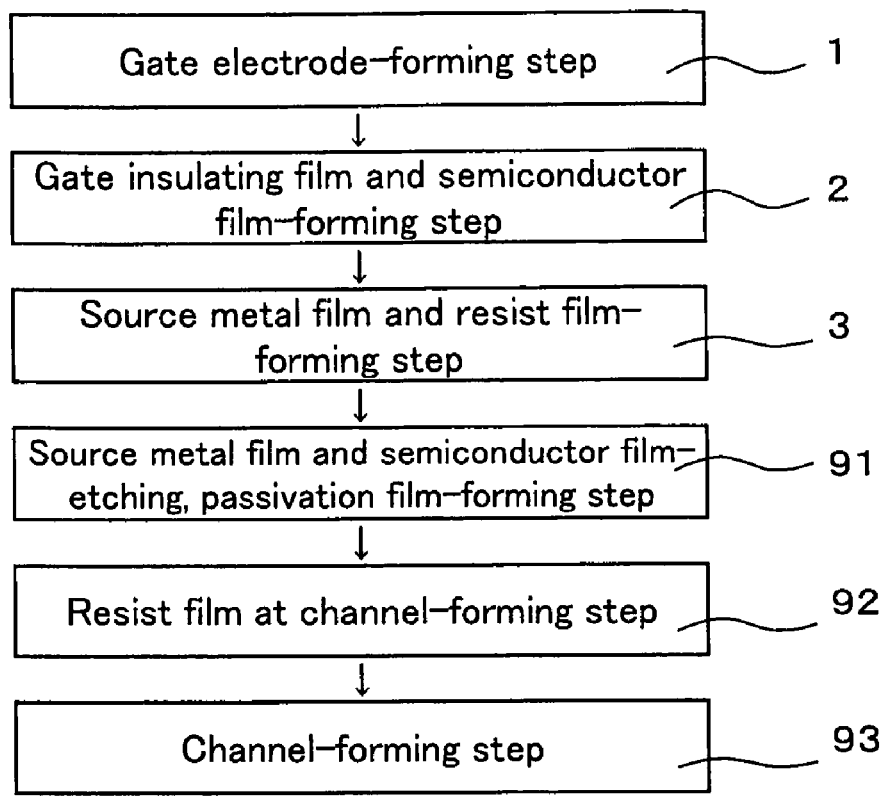
FIG. 23 is a flowchart showing order of the production steps of the TFT according to Embodiment 3 of the present invention.
Figure 24:
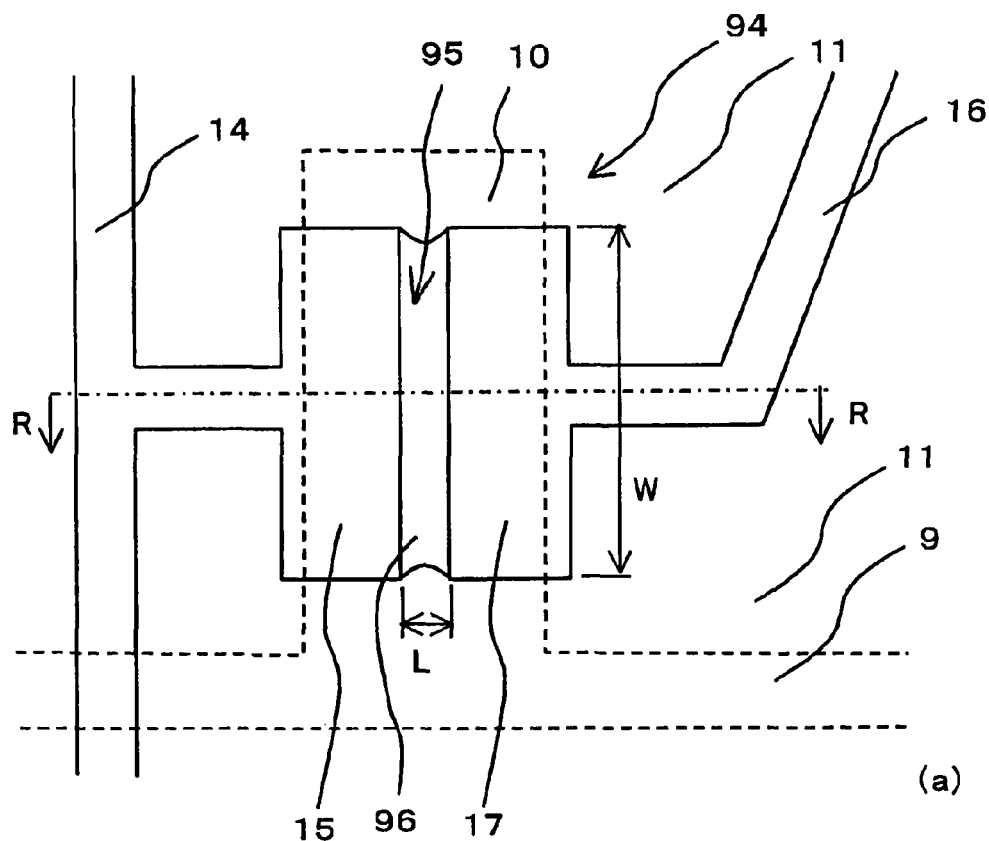
FIG. 24(a) is a planar view schematically showing the TFT prepared in Embodiment 3 and a configuration near the TFT.
FIG. 24(b) is a cross-sectional view schematically showing the configuration taken along line R-R in FIG. 24(a).
Figure 24:
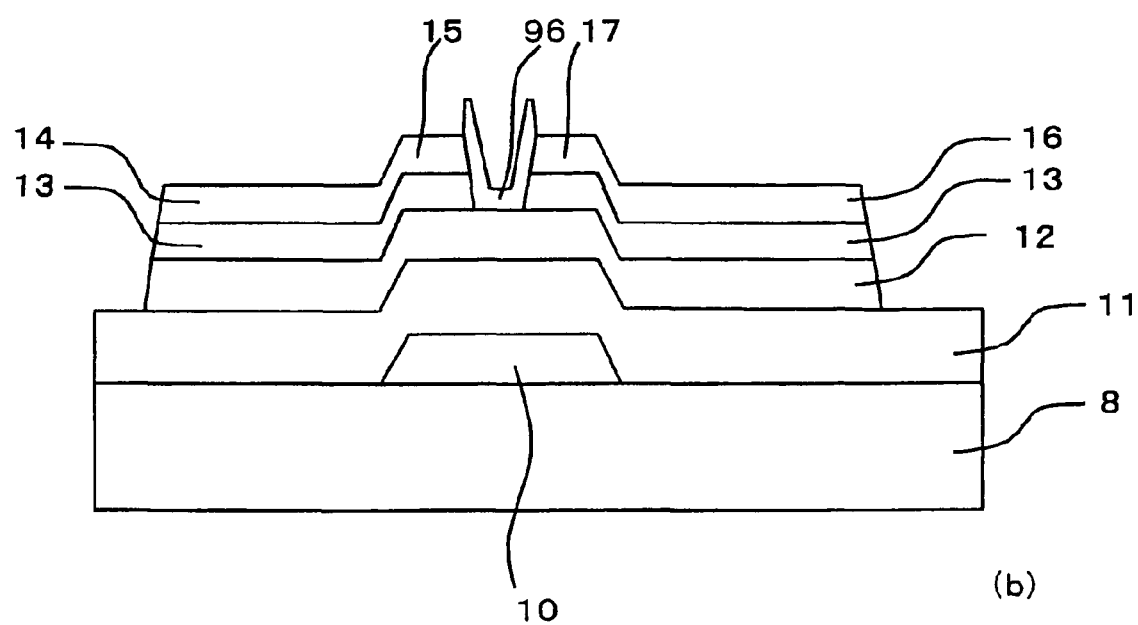
Figure 25:
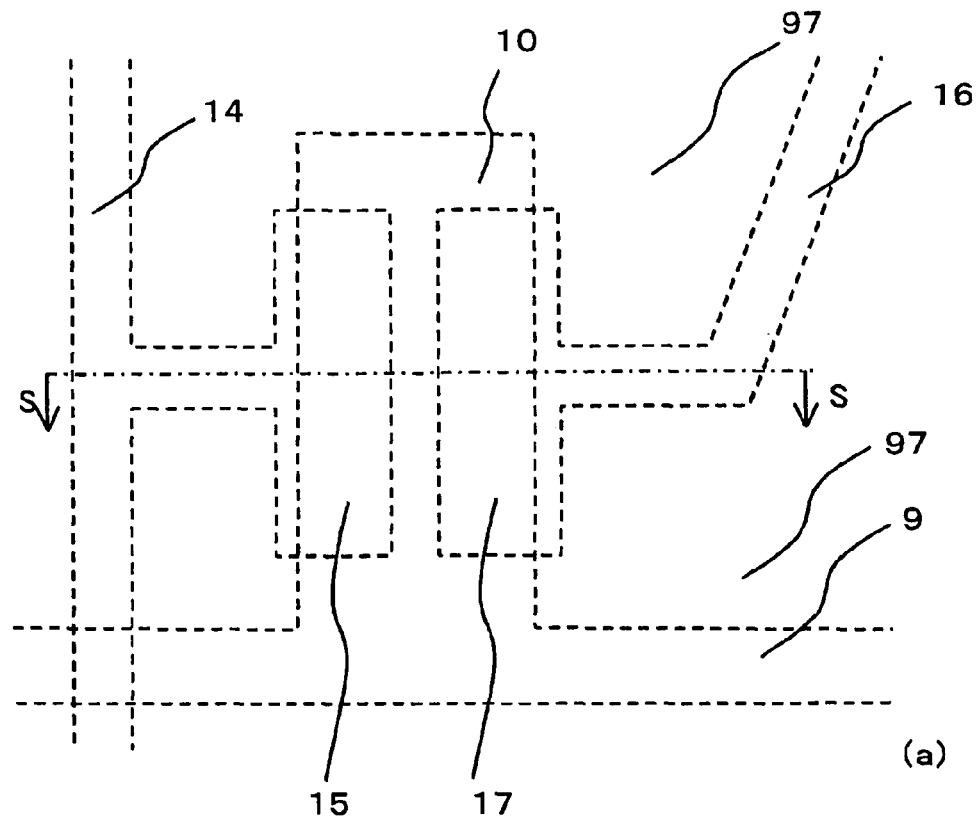
FIG. 25(a) is a planar view schematically showing a state after completion of the source metal film and semiconductor film-etching and passivation film-forming step 91.
FIG. 25(b) is a cross-sectional view schematically showing the configuration taken along line S-S in FIG. 25(a) (Embodiment 3).
Figure 25:
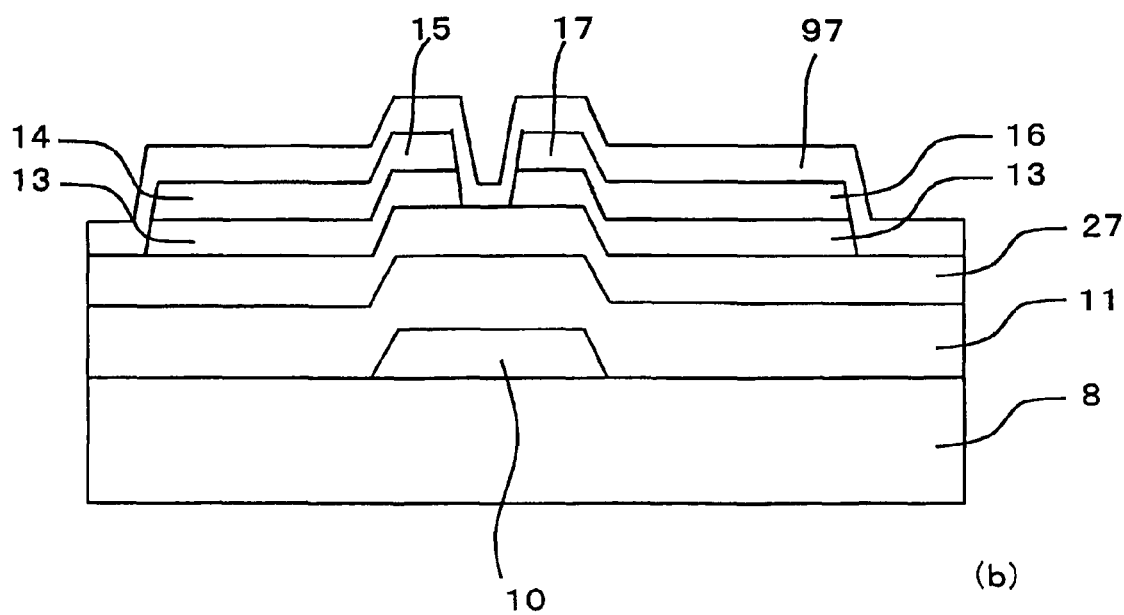
Figure 26:
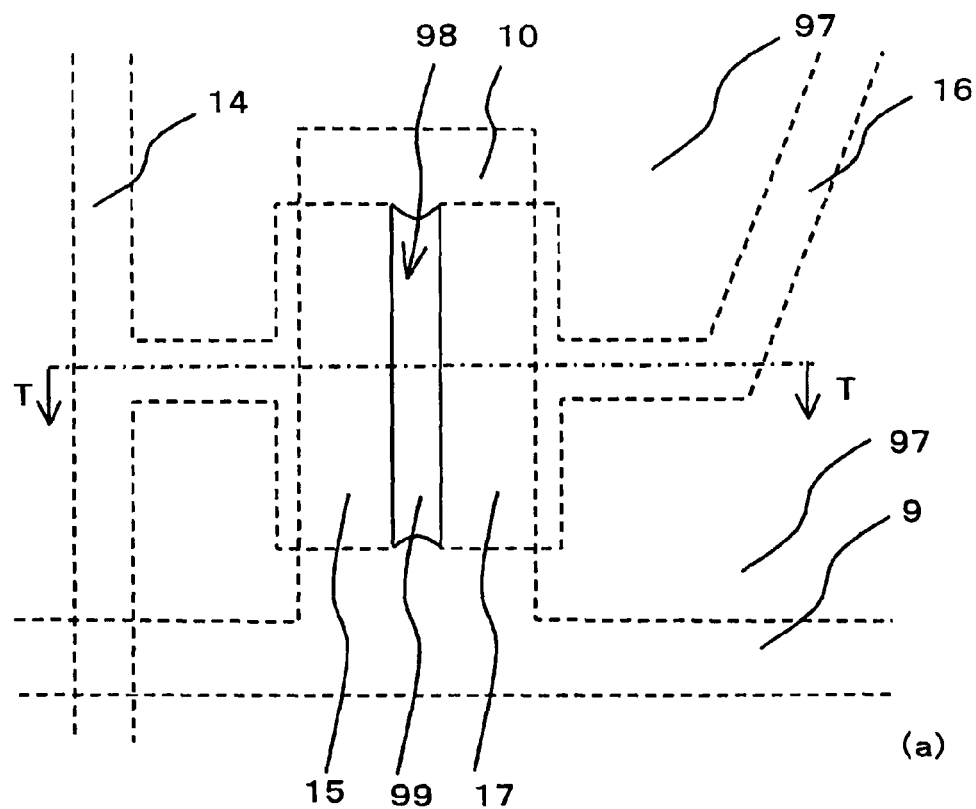
FIG. 26(a) is a planar view schematically showing a state after completion of the resist film at channel-forming step 92.
FIG. 26(b) is a cross-sectional view schematically showing the configuration taken along line T-T in FIG. 26(a) (Embodiment 3).
Figure 26:
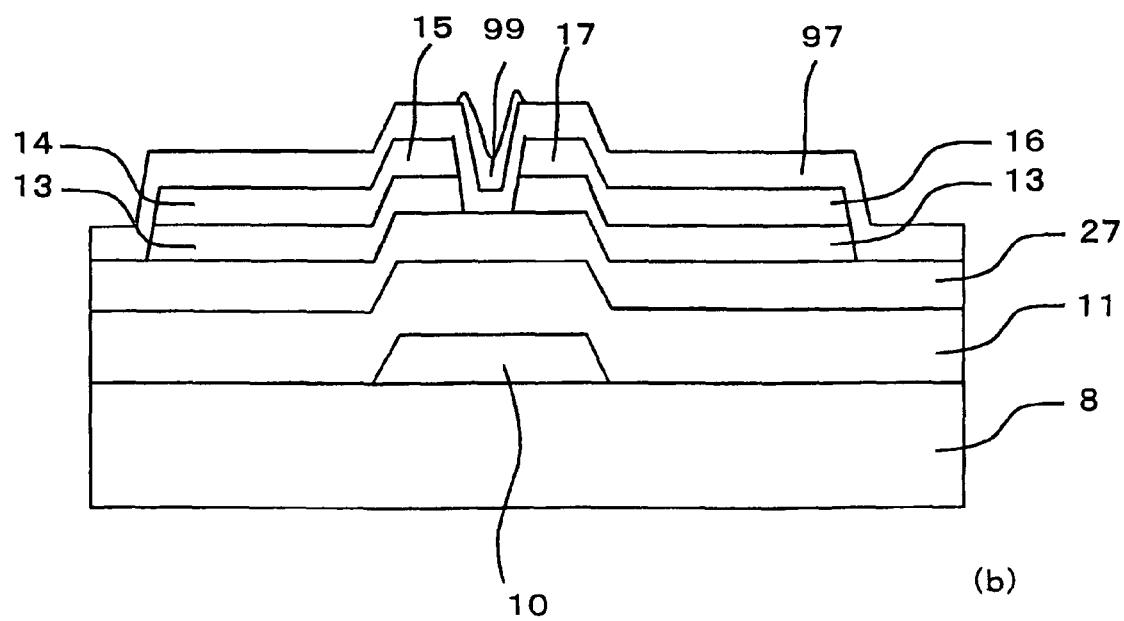
Figure 27:
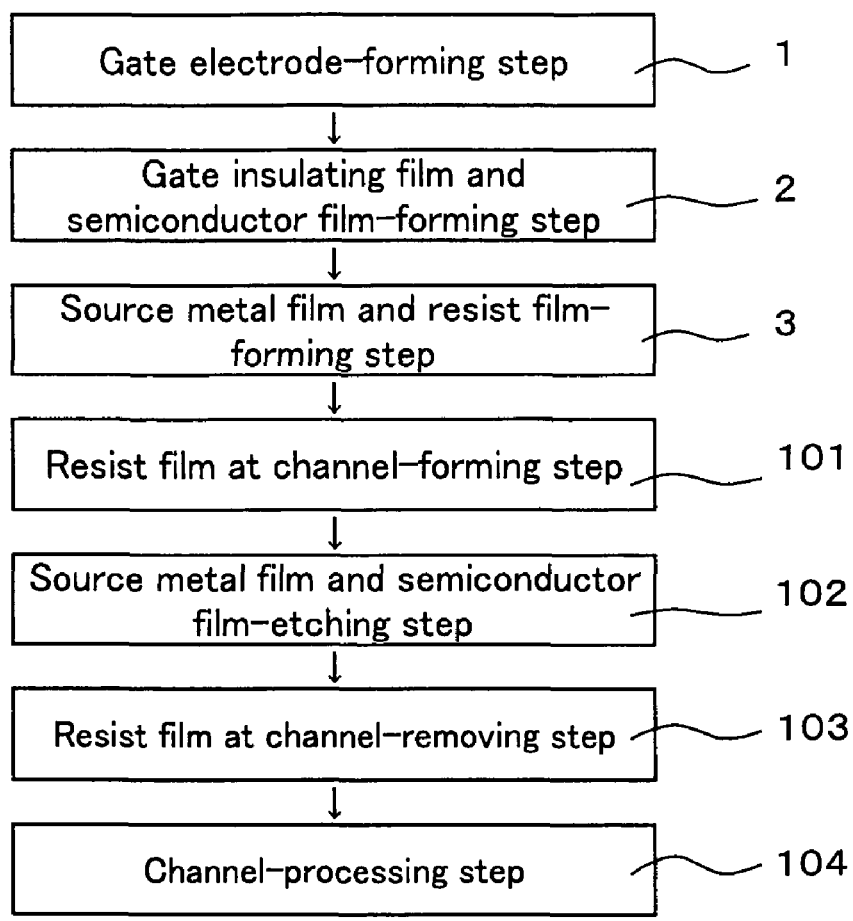
FIG. 27 is a flowchart showing order of the production steps of the TFT according to Embodiment 4 of the present invention.
Figure 28:
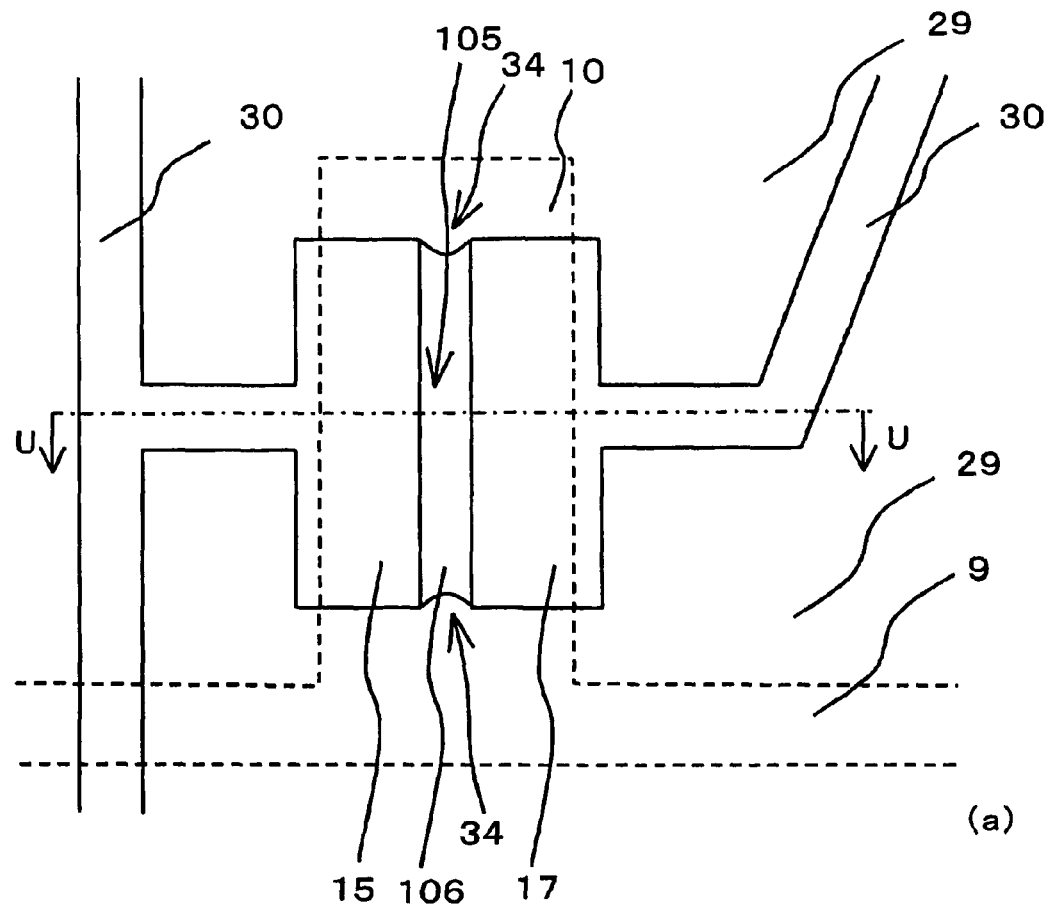
FIG. 28(a) is a planar view schematically showing a state after completion of the resist film at channel-forming step 101.
FIG. 28(b) is a cross-sectional view schematically showing the configuration taken along line U-U in FIG. 28(a) (Embodiment 4).
Figure 28:
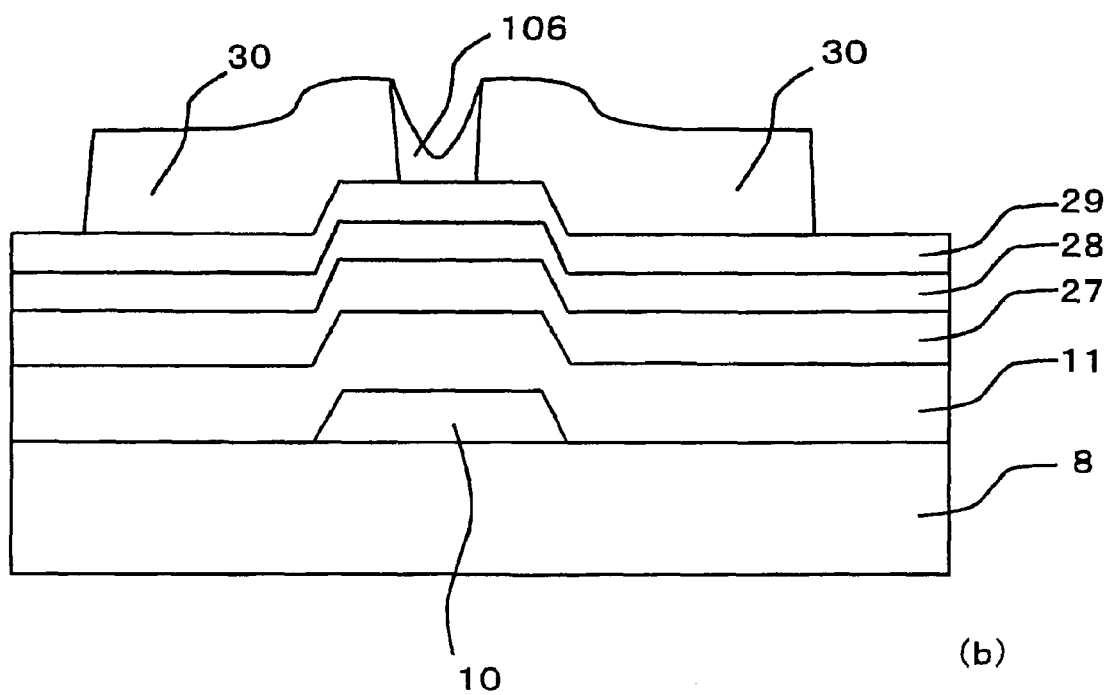
Figure 29:
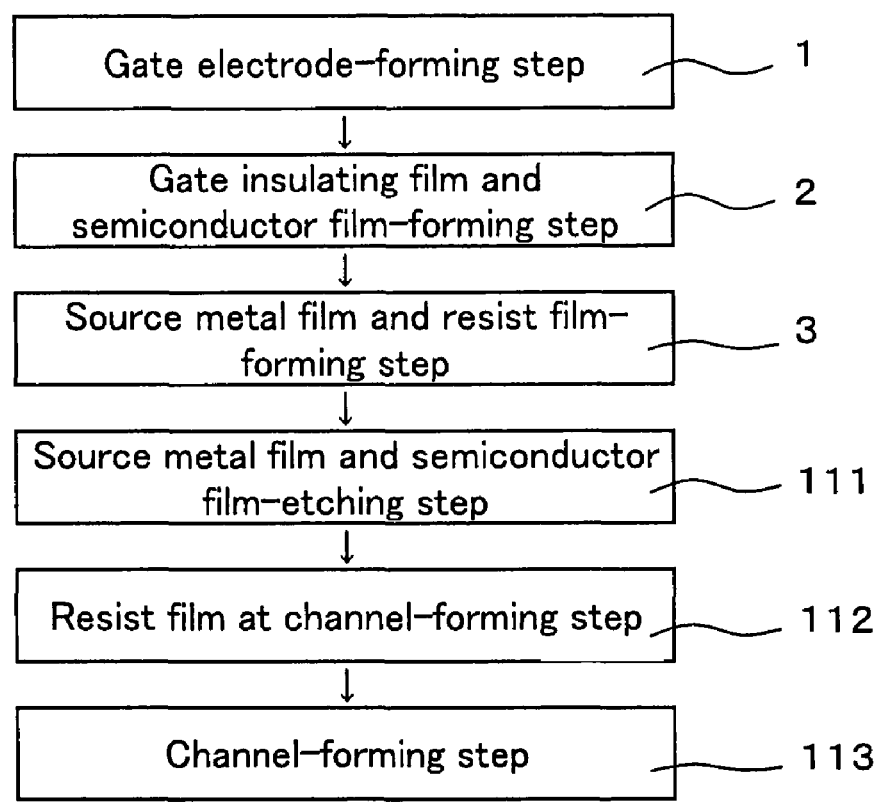
FIG. 29 is a flowchart showing order of the production steps of the TFT according to Embodiment 5 of the present invention.
Figure 30:
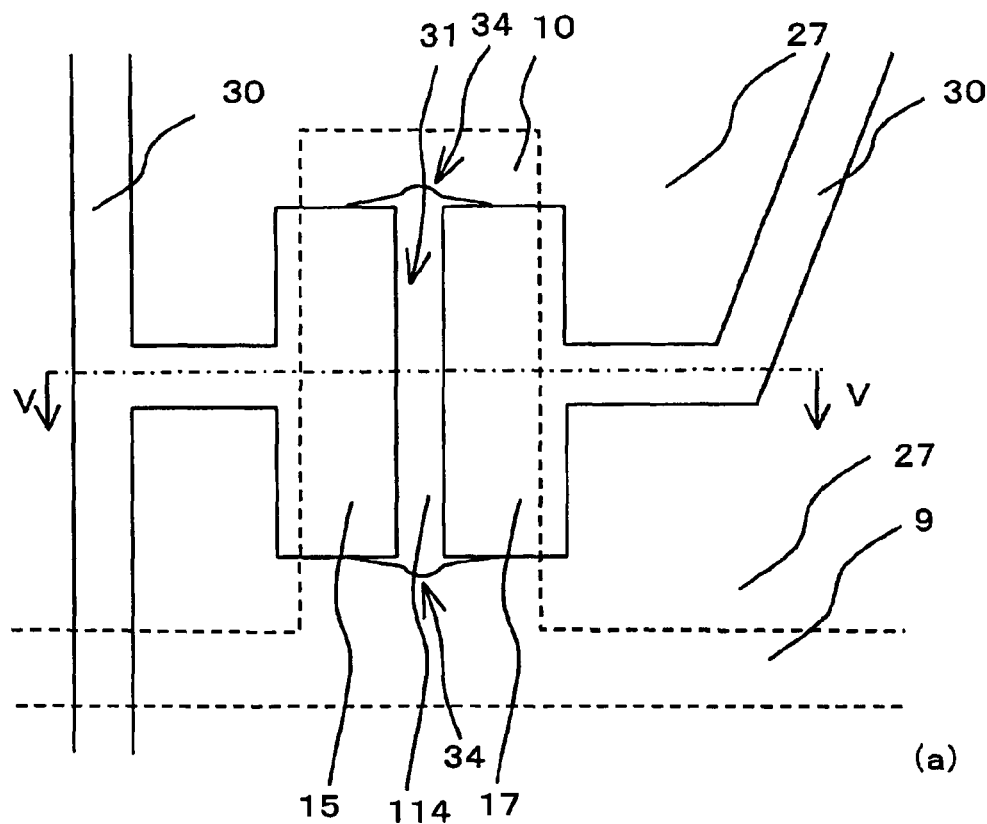
FIG. 30(a) is a cross-sectional view schematically showing a state after completion of landing of the solvent droplet.
FIG. 30(b) is a cross-sectional view schematically showing the configuration taken along line V-V in FIG. 30(a).
Figure 30:
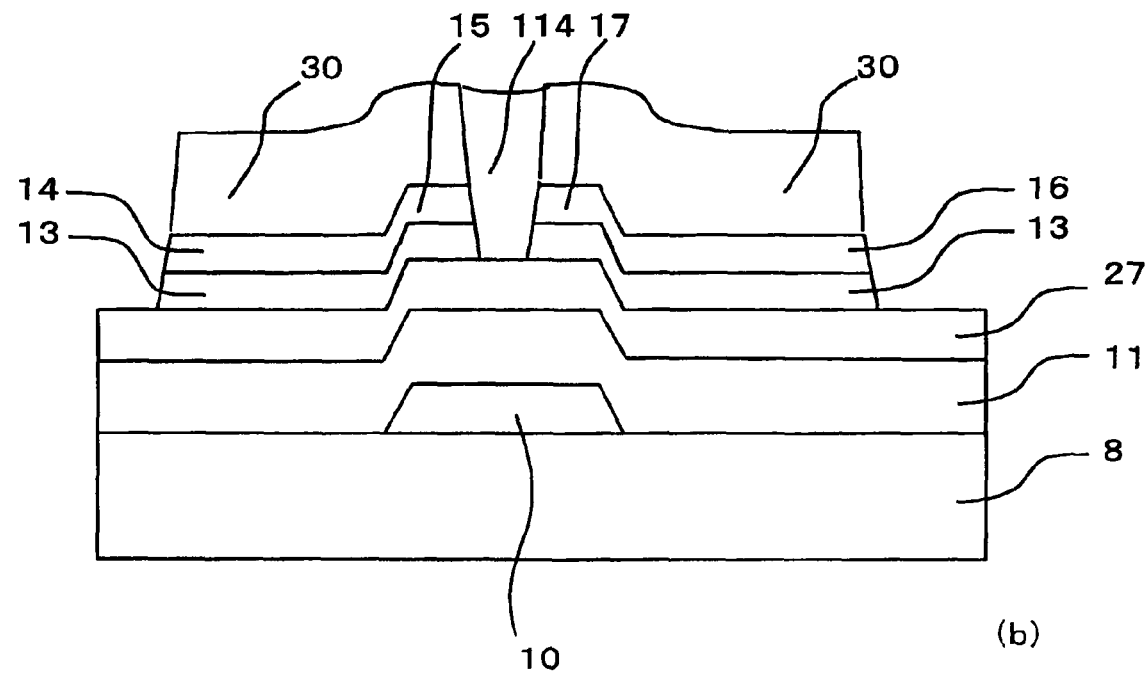
Figure 31:
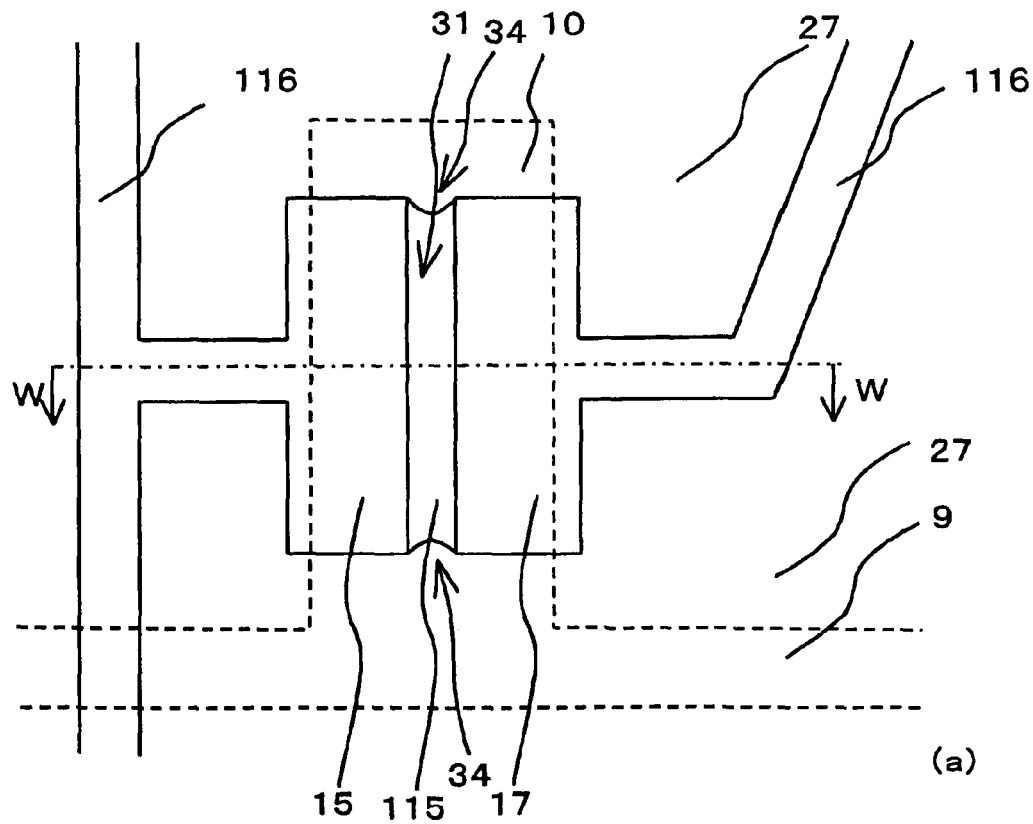
FIG. 31(a) is a planar view schematically showing a state where the resist pattern film 115 is formed inside the TFT gap 31.
FIG. 31(b) is a cross-sectional view schematically showing the configuration taken along line W-W in FIG. 31(a) (Embodiment 5).
Figure 31:
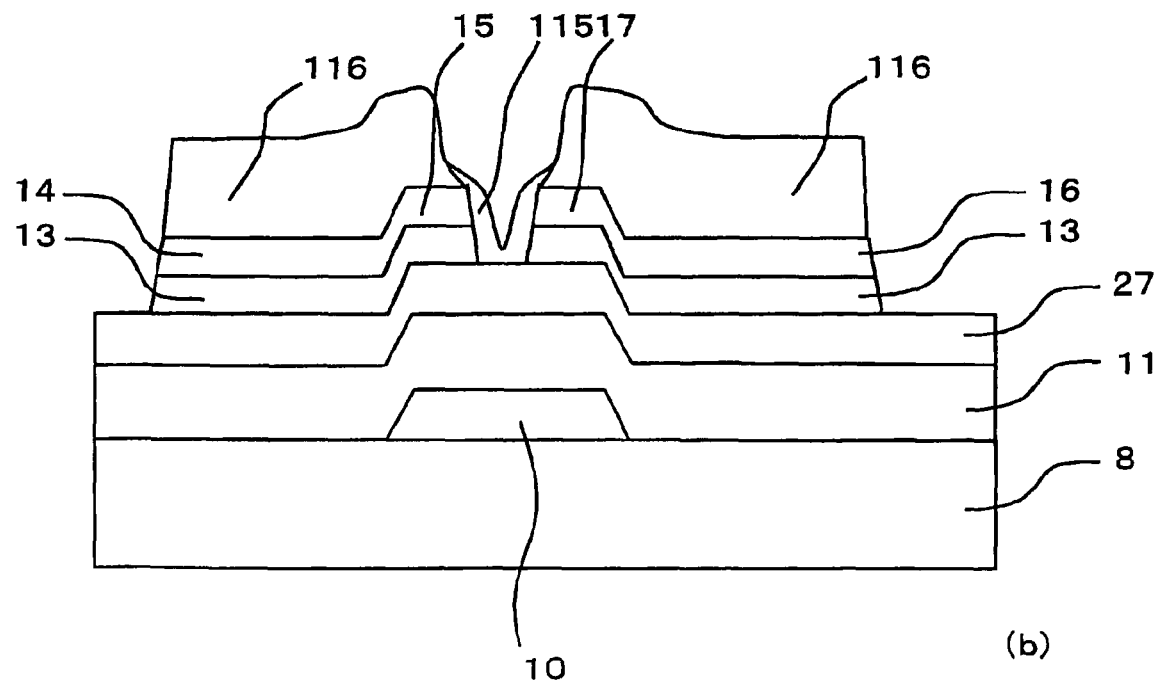
Figure 32:
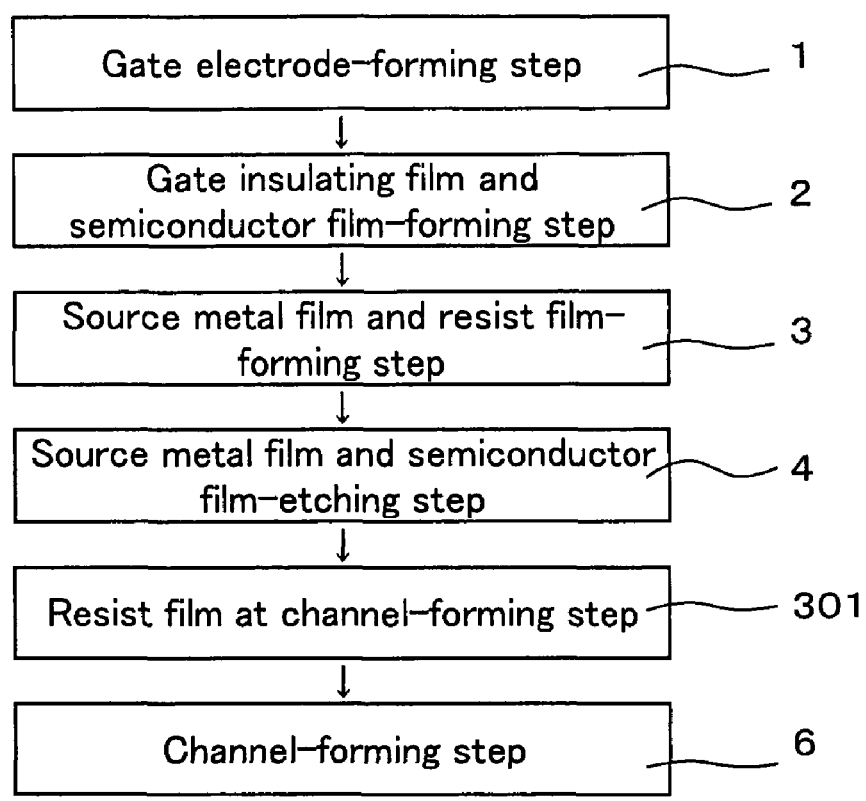
FIG. 32 is a flowchart showing order of the production steps of the TFT according to Embodiment 6 of the present invention.
Figure 33:
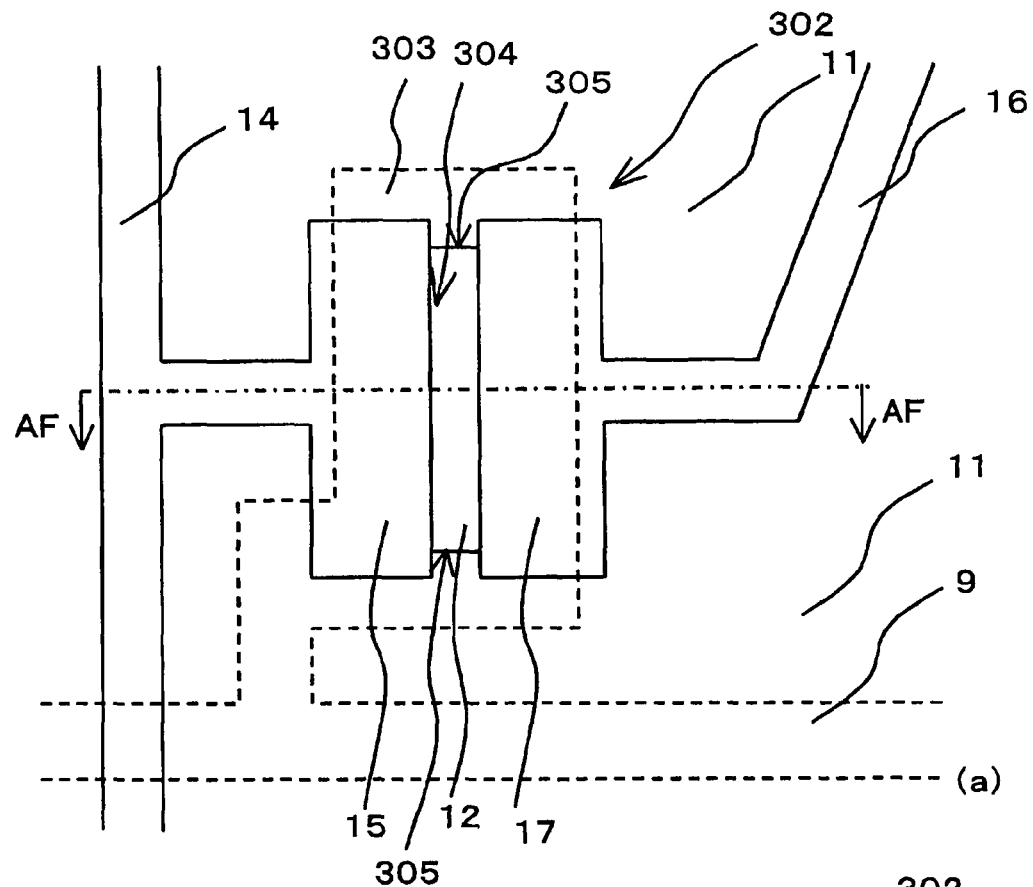
FIG. 33(a) is a planar view schematically showing a configuration of the TFT 302 produced in Embodiment 6.
FIG. 33(b) is a cross-sectional view schematically showing the configuration taken along line AF-AF in FIG. 33(a).
Figure 33:
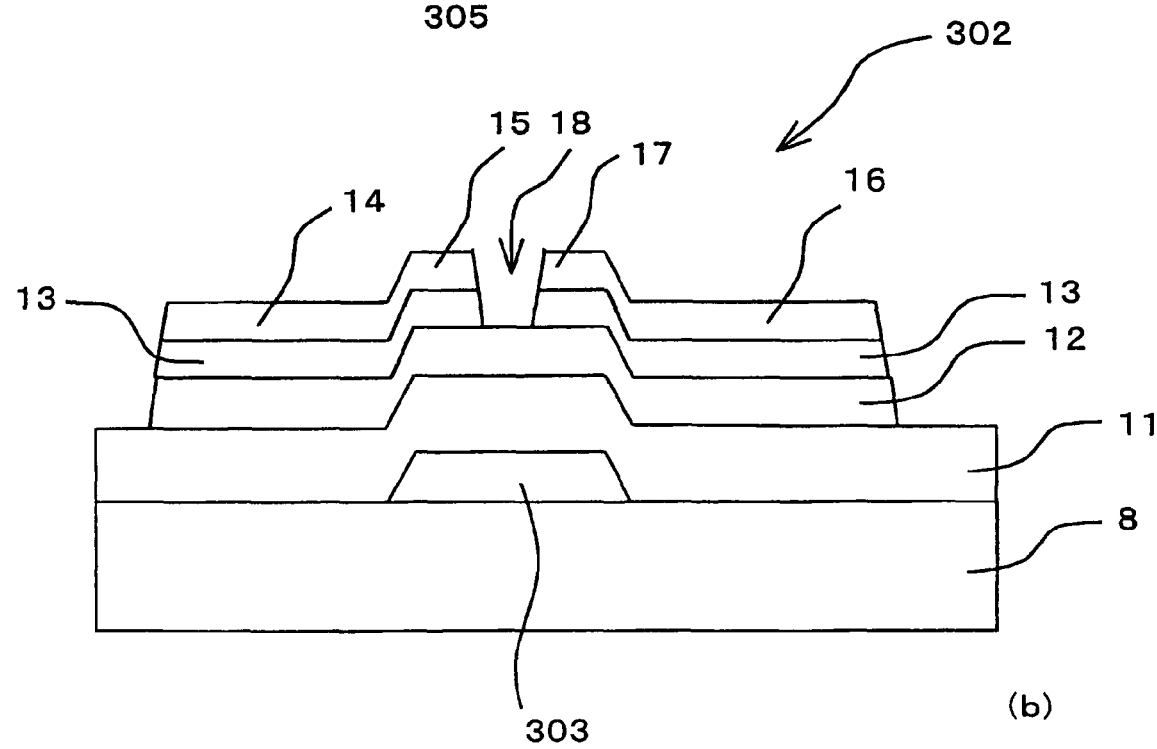
Figure 34:
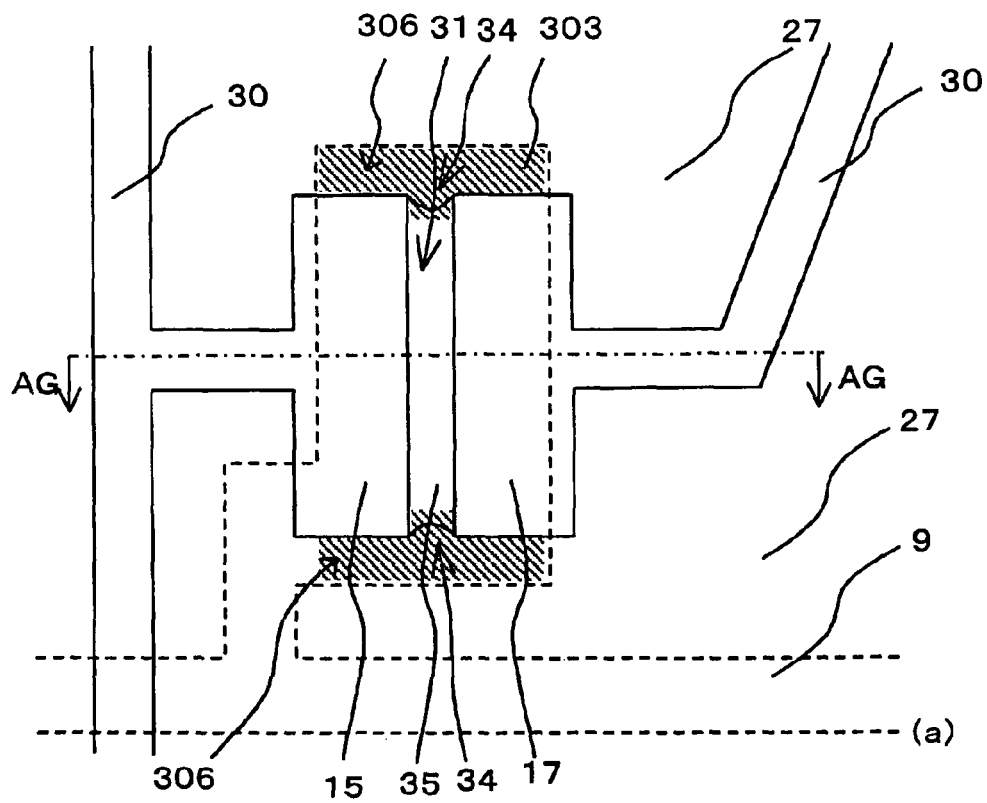
FIG. 34(a) is a planar view schematically showing a substrate immediately after the back surface exposure.
FIG. 34(b) is a cross-sectional view schematically showing the configuration taken along line AG-AG in FIG. 34(a) (Embodiment 6).
Figure 34:
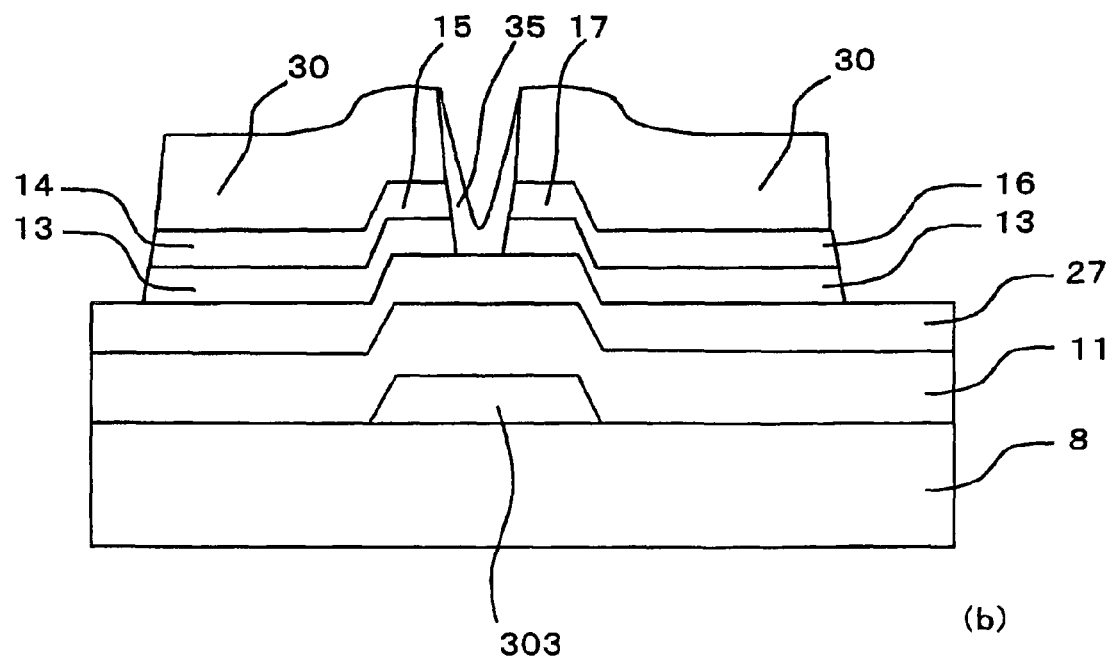
Figure 35:
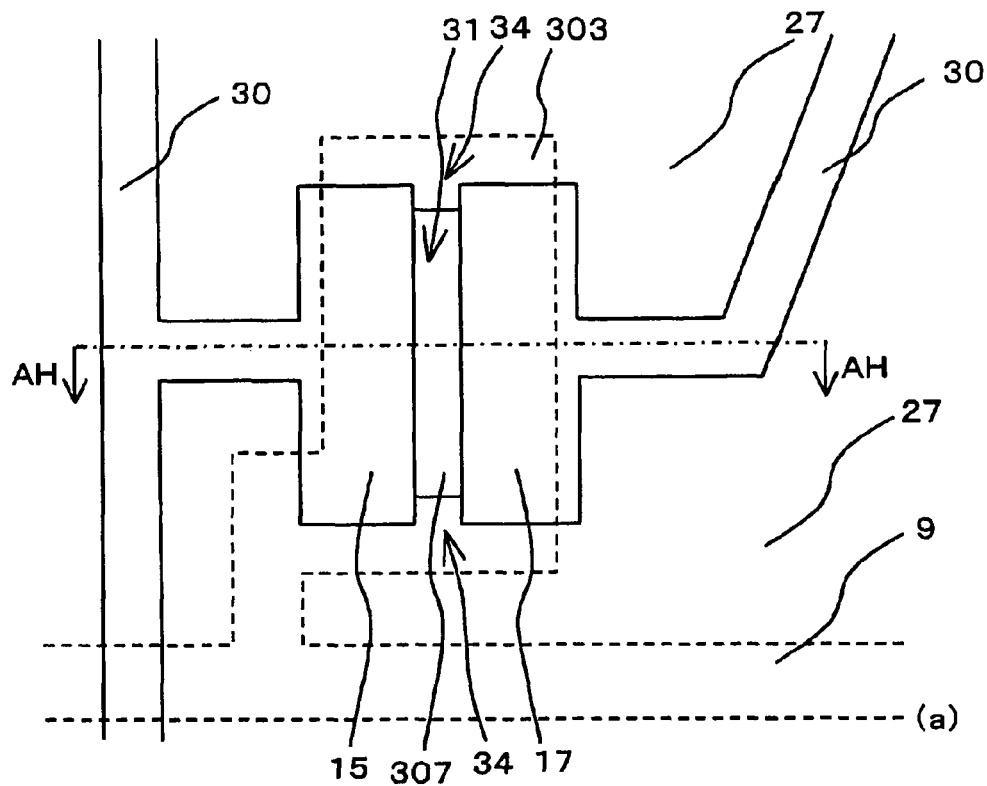
FIG. 35(a) is a planar view schematically showing a substrate after the development treatment.
FIG. 35(b) is a cross-sectional view schematically showing the substrate taken along line AH-AH in FIG. 35(a) (Embodiment 6).
Figure 35:
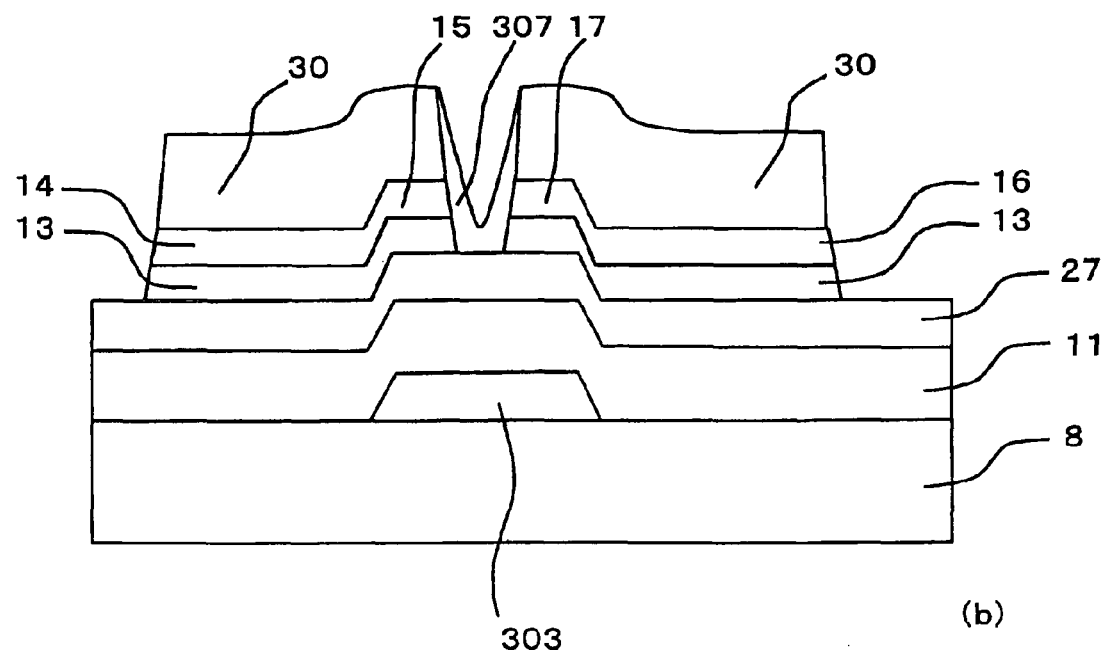
Figure 36:
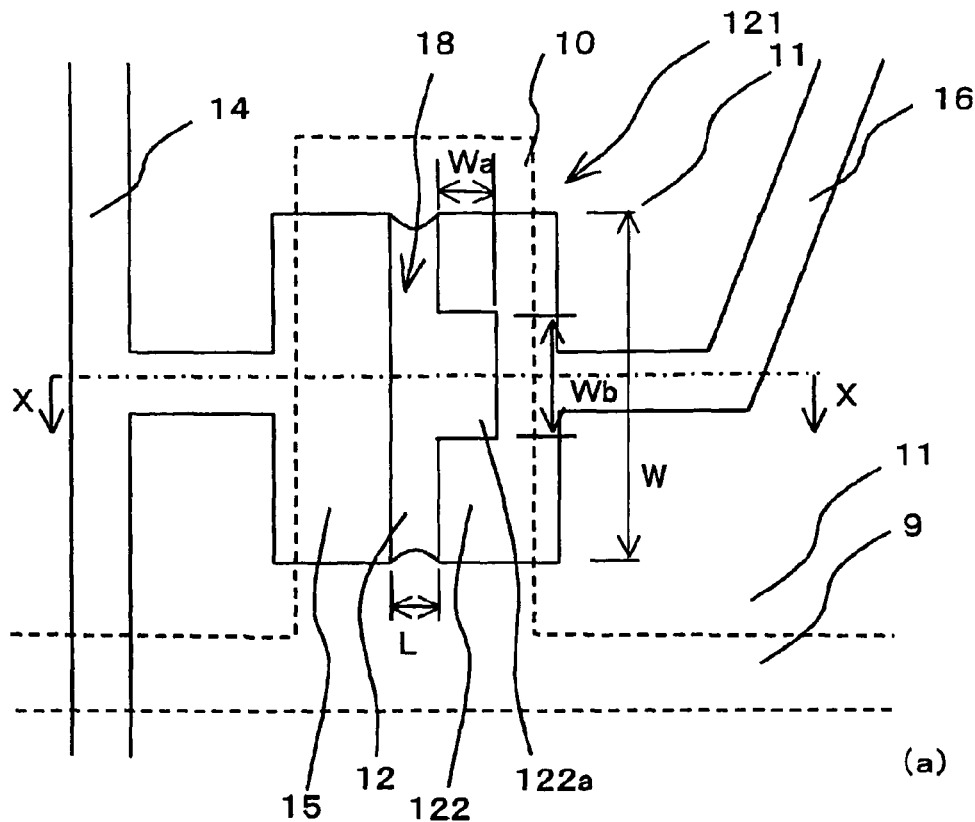
Figure 1:
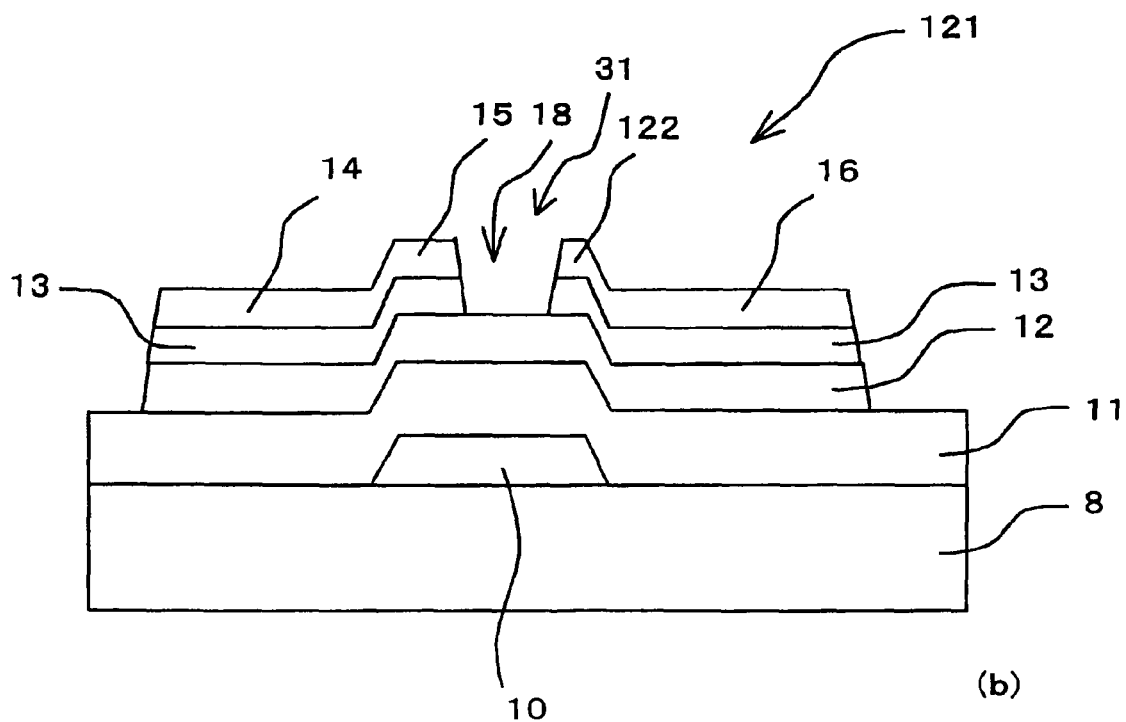
Figure 36:
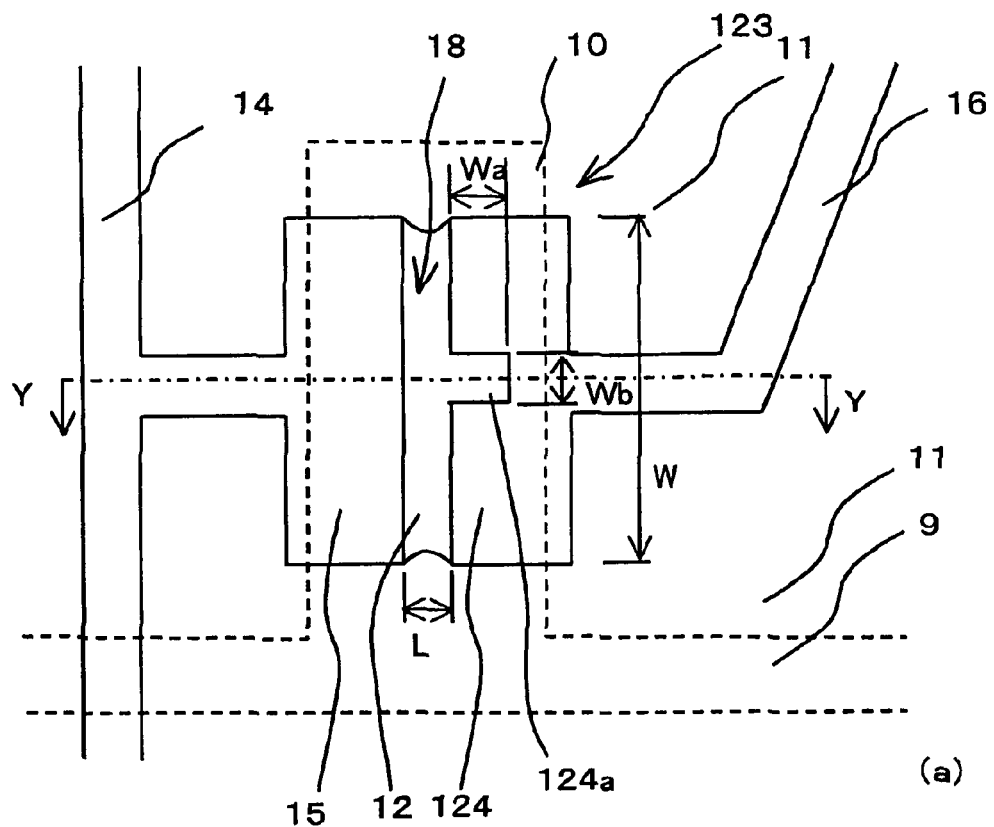
Figure 2:
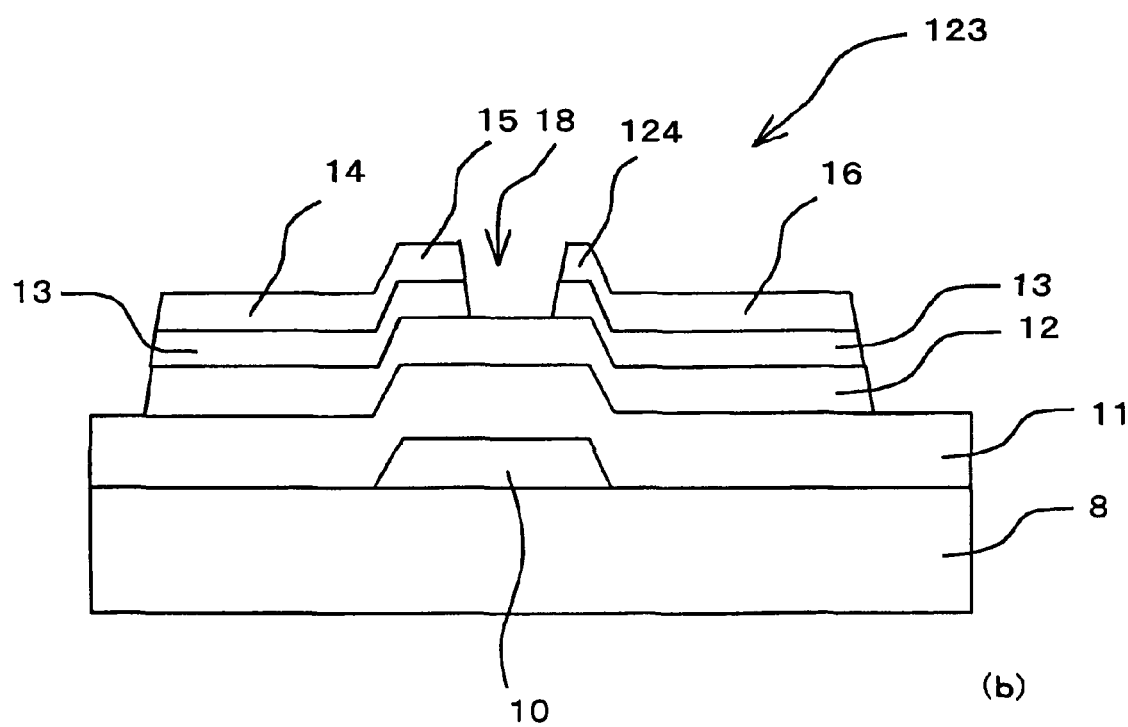
Figure 37:
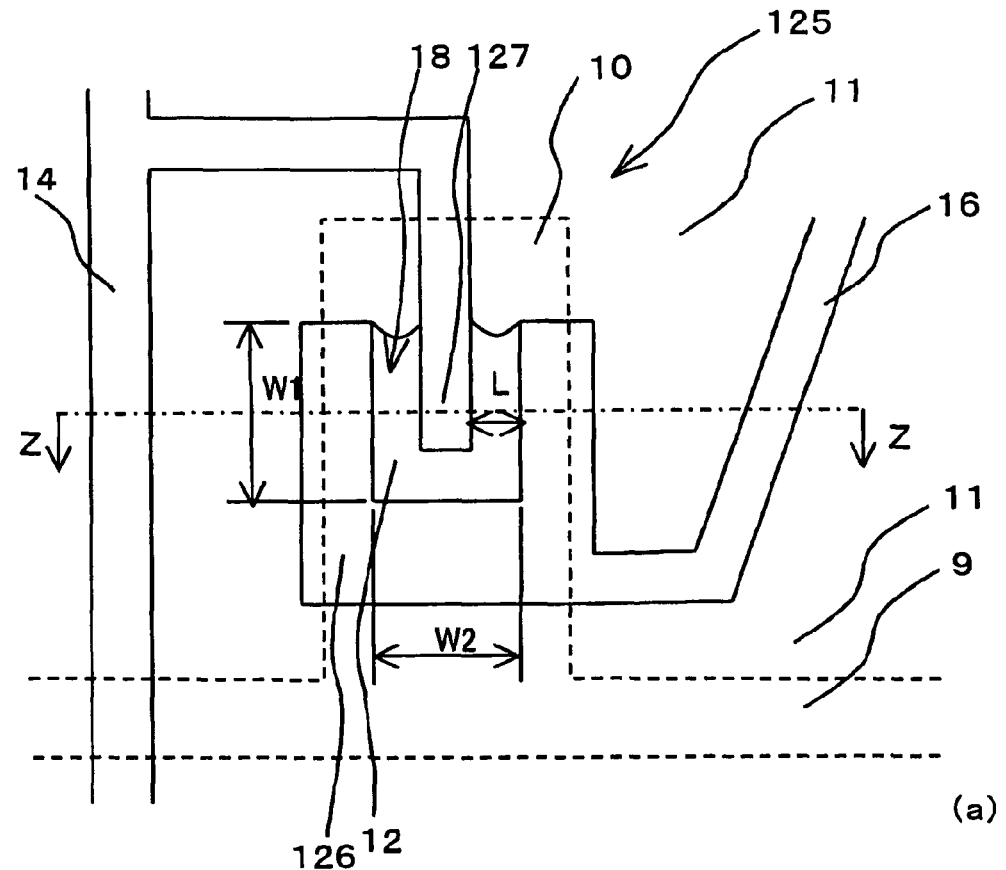
FIG. 37(a) is a planar view schematically showing a configuration of the TFT according to Embodiment 8.
FIG. 37(b) is a cross-sectional view schematically showing the TFT taken along line Z-Z in FIG. 37(a).
Figure 37:
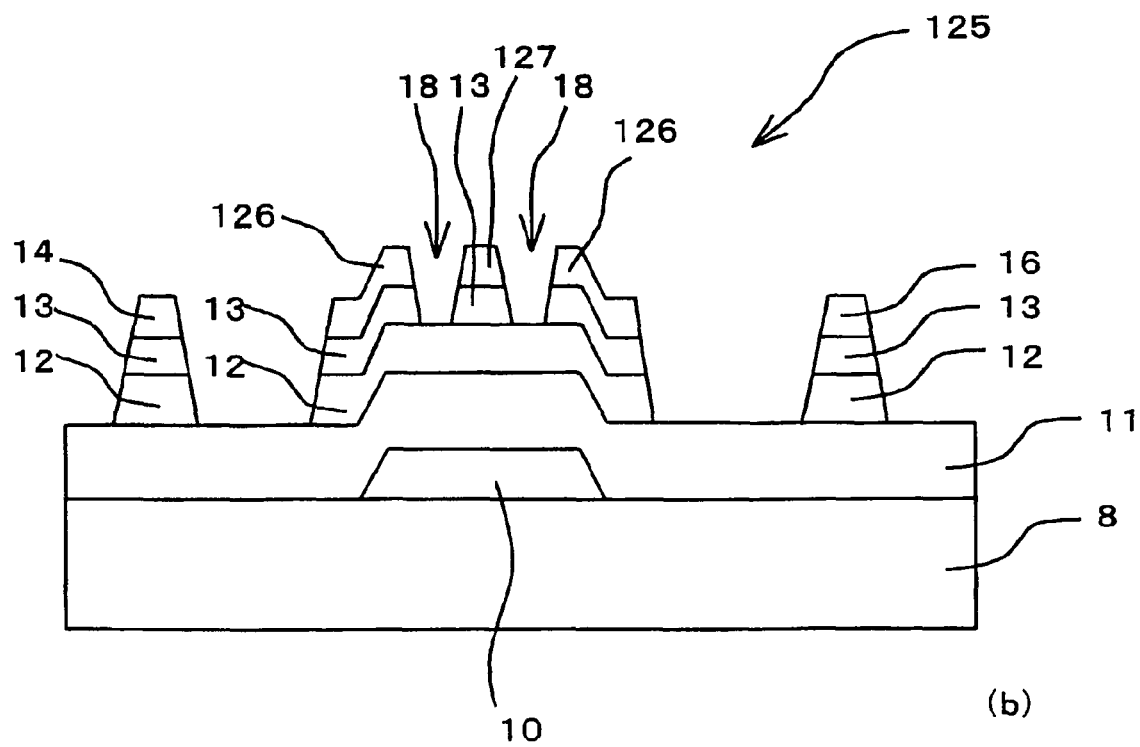
Figure 38:
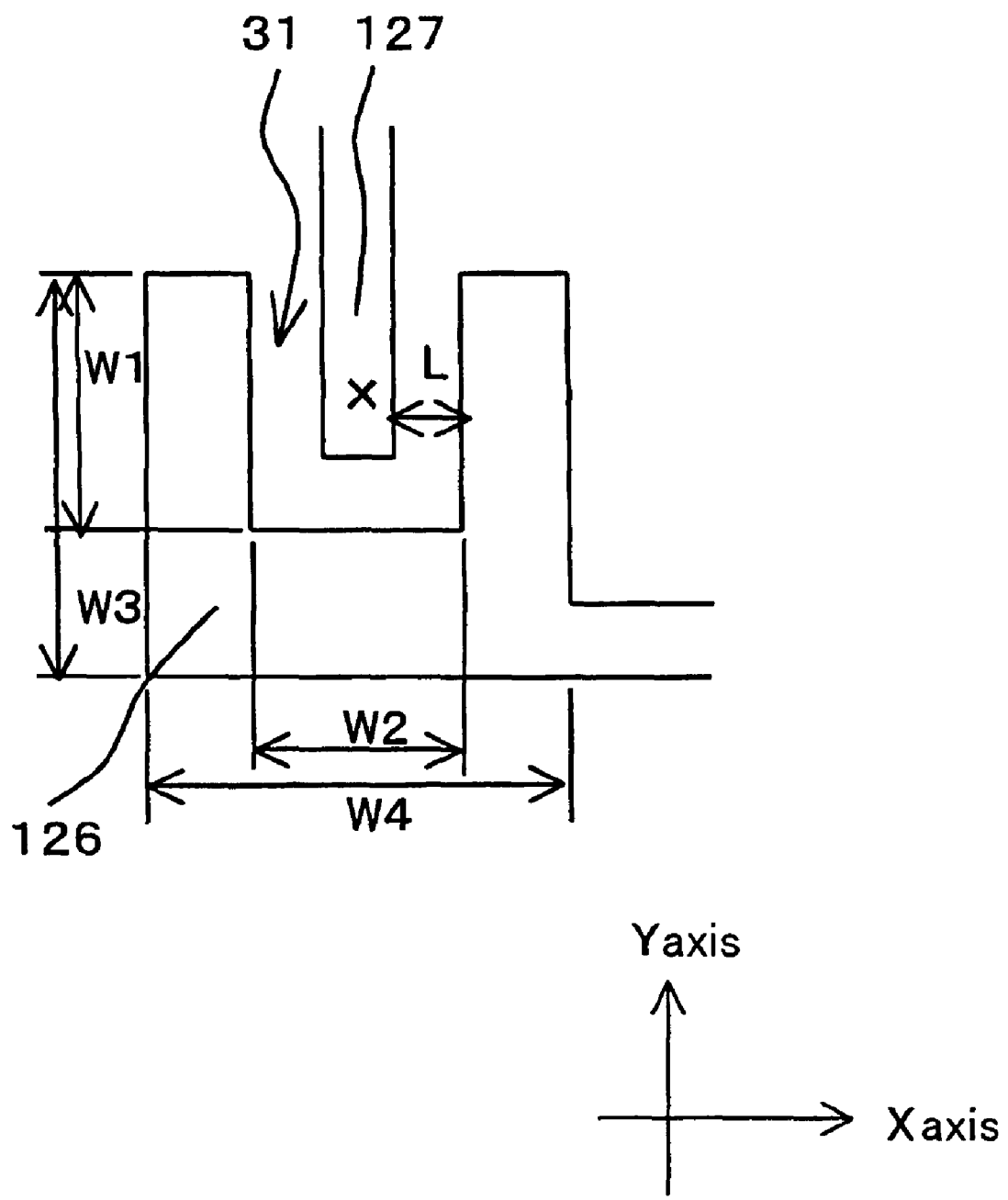
FIG. 38 is an enlarged view of the source electrode 127 and the drain electrode 126 in FIG. 37(a) (Embodiment 8).
Figure 39:
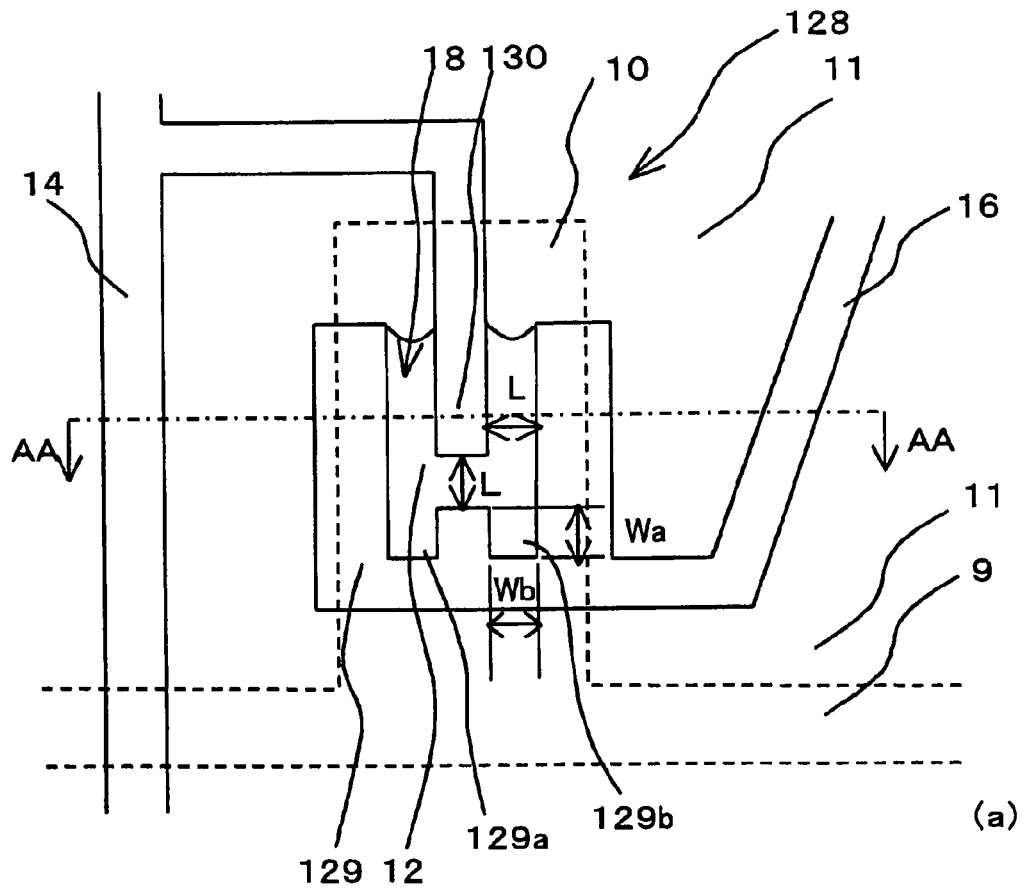
FIG. 39(a) is a planar view schematically showing a configuration of the TFT 128 according to an embodiment in which the configuration where at least one of the source electrode and the drain electrode has a notch in Embodiment 7 and the configuration where the channel has a squared U-shape or a U-shape in Embodiment 8 are combined.
FIG. 39(b) is a cross-sectional view schematically showing the TFT taken along line AA-AA in FIG. 39(a).
Figure 39:
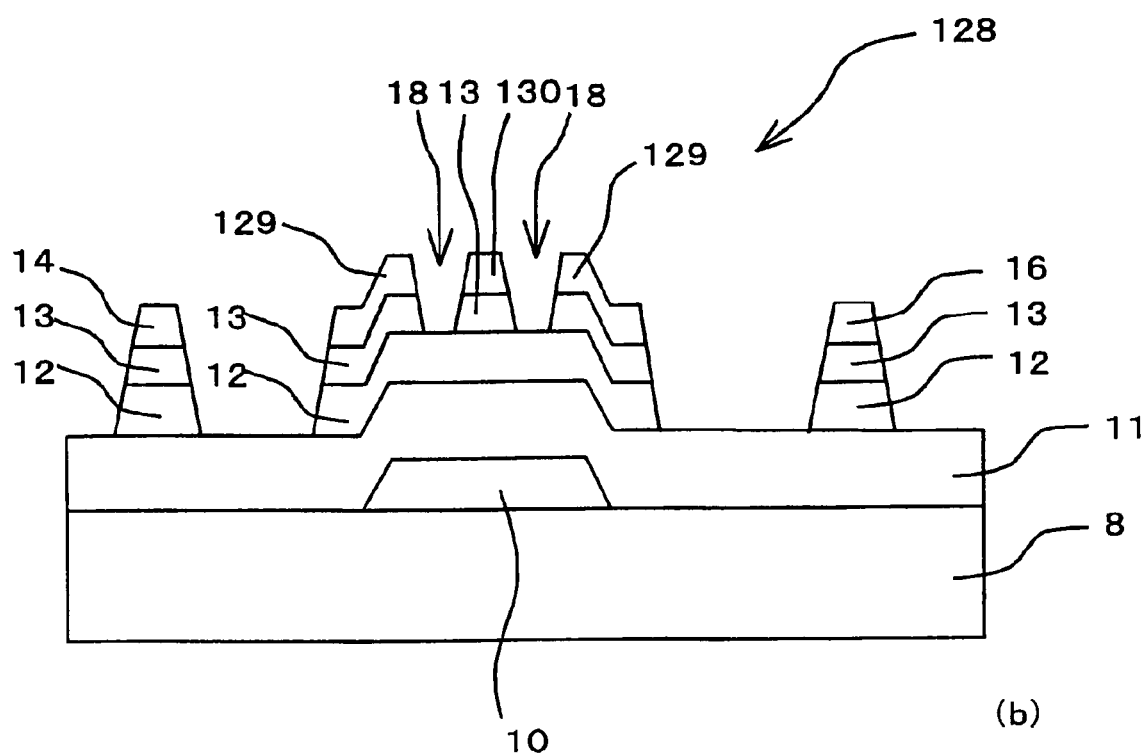
Figure 40:
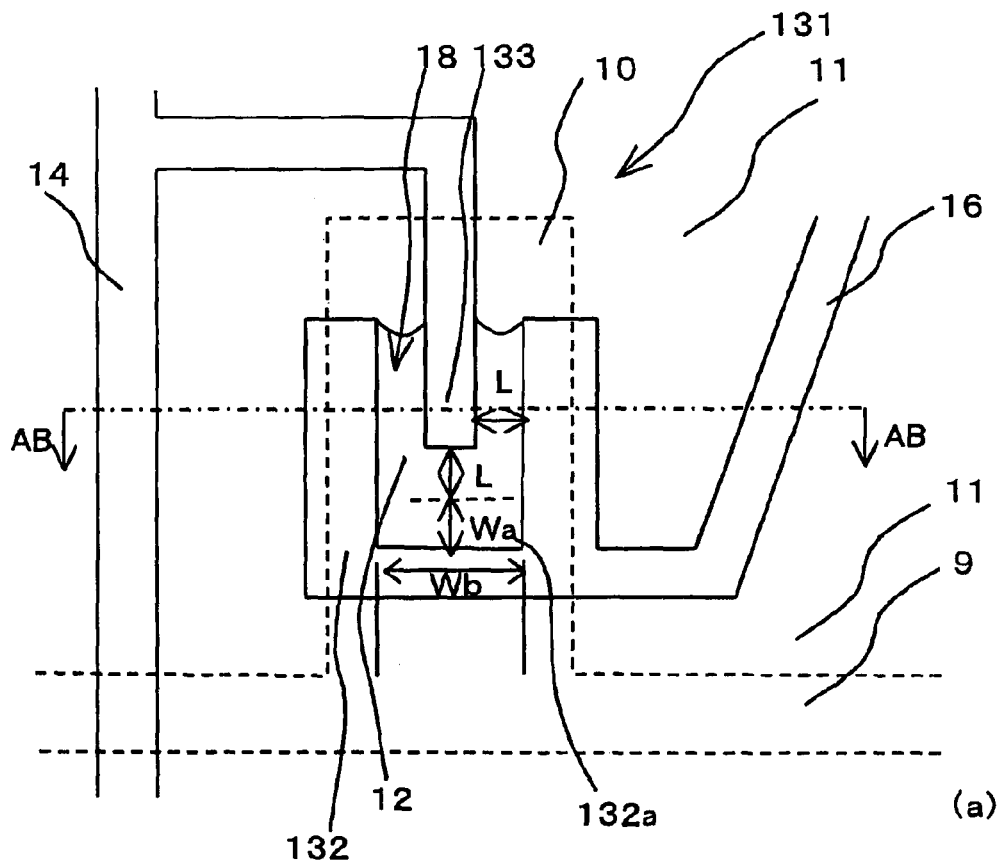
FIG. 40(a) is a planar view schematically showing a configuration of the TFT 131 according to an embodiment in which the configuration where at least one of the source electrode and the drain electrode in Embodiment 7 have a notch, and the configuration where the channel in Embodiment 8 has a squared U-shape or a U-shape are combined.
FIG. 40(b) is a cross-sectional view schematically showing the TFT taken along line AB-AB in FIG. 40(a).
Figure 40:
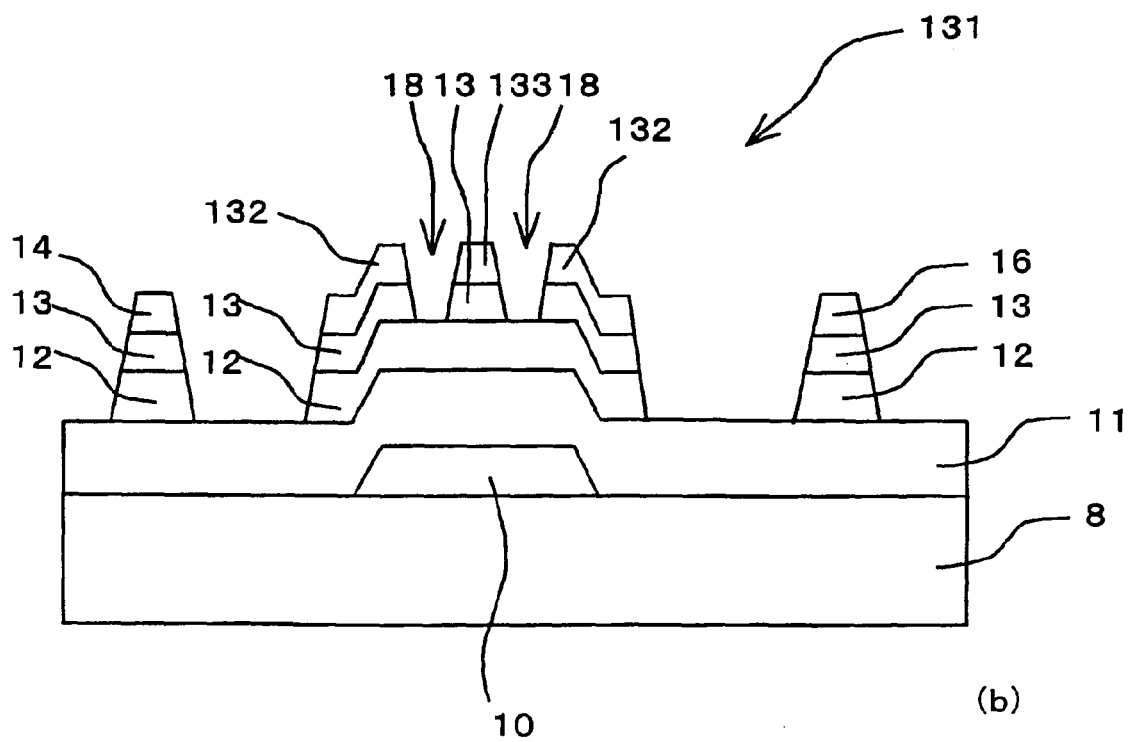
Figure 41:
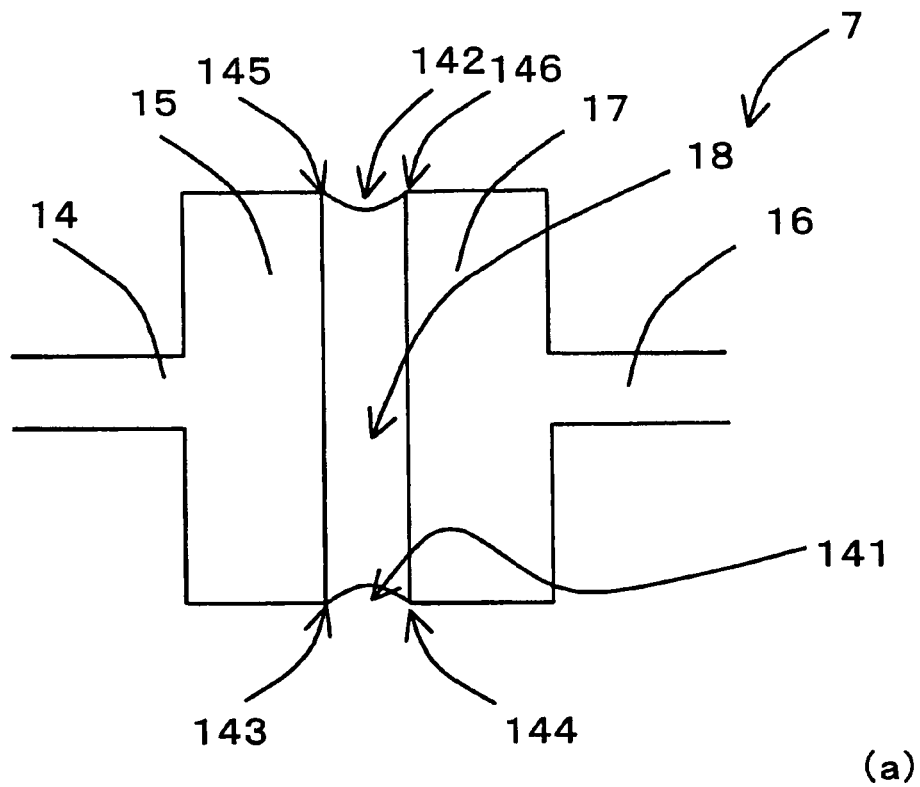
FIG. 41(a) is an enlarged view showing the source electrode 15 and the like in FIG. 2(a)
FIG. 41(b) is an enlarged view showing the source electrode 149 and the like of the TFT produced by the method in Embodiment 1, for comparison with FIG. 41(a) (Embodiment 9).
Figure 41:
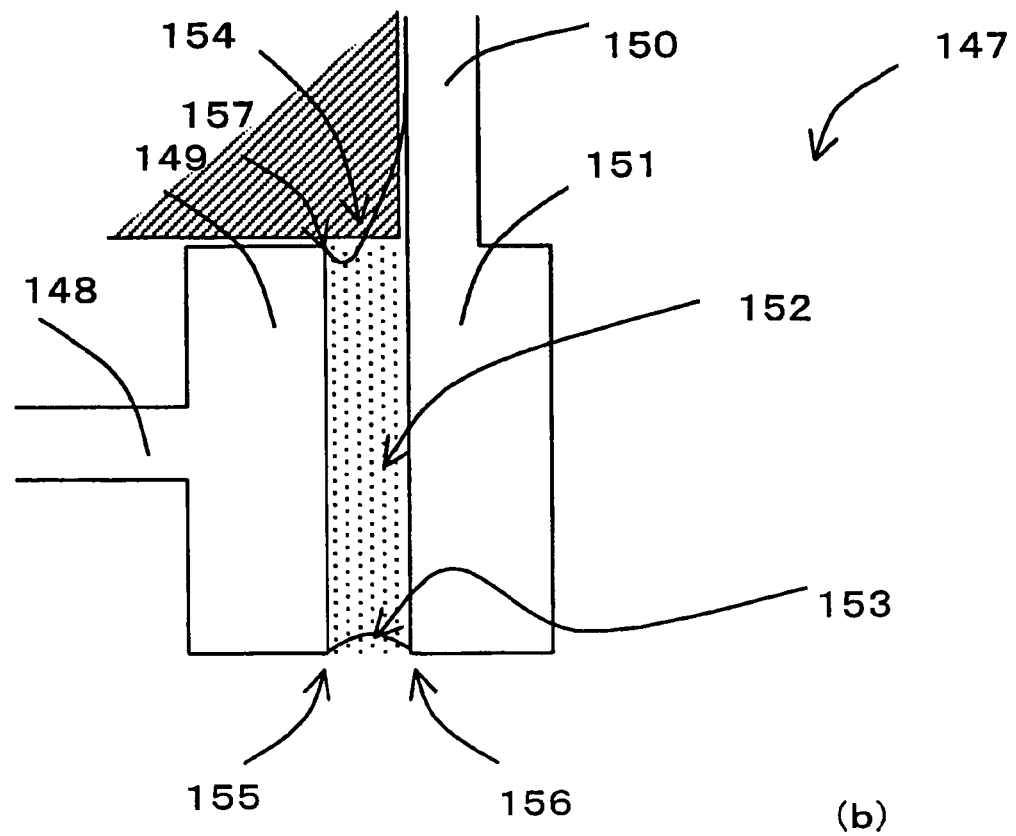
Figure 42:
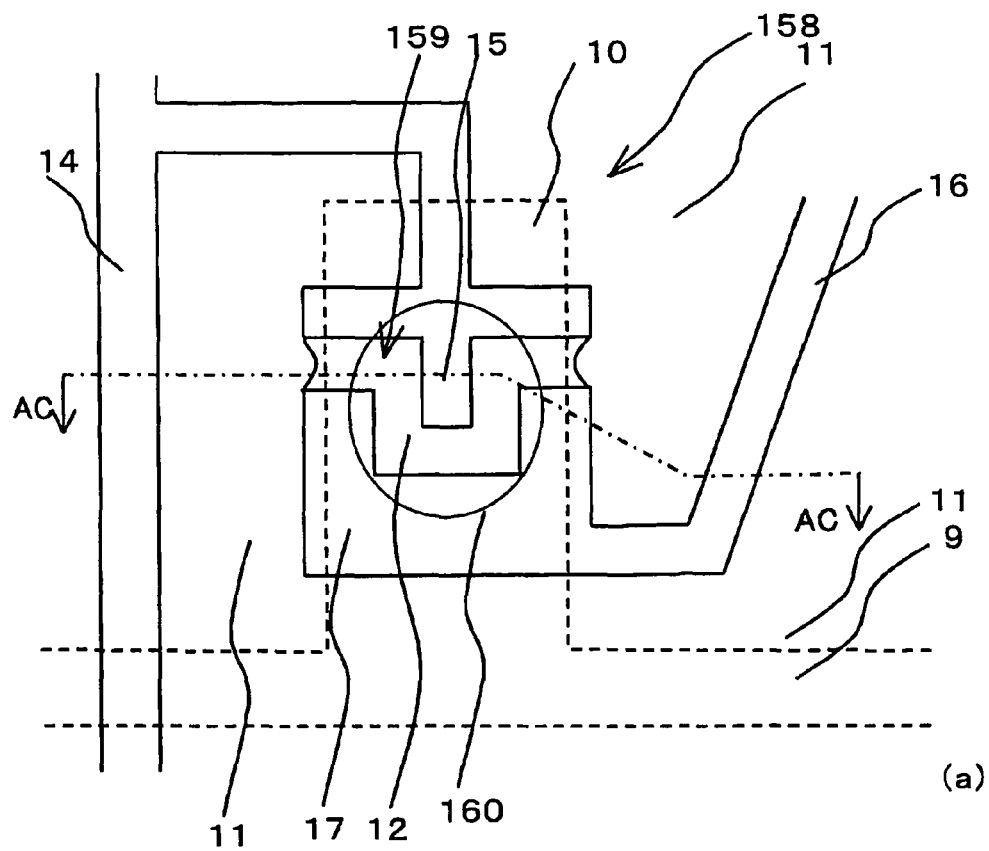
FIG. 42(a) is a planar view schematically showing a configuration of the TFT 158 according to an embodiment in which the configuration where the channel in Embodiment 8 has a squared U-shape or a U-shape and the configuration where the source electrode and the drain electrode have corners near every end of the TFT channel part are combined.
FIG. 42(b) is a cross-sectional view schematically showing the TFT taken along line AC-AC in FIG. 42(a).
Figure 42:
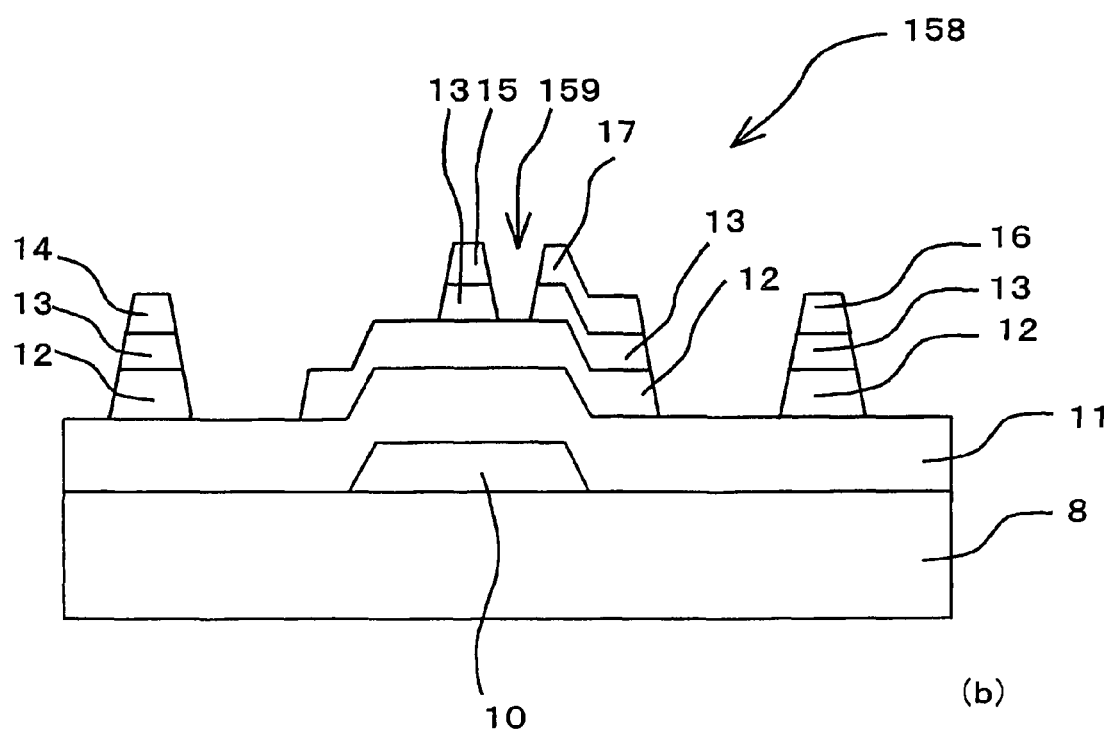
Figure 43:
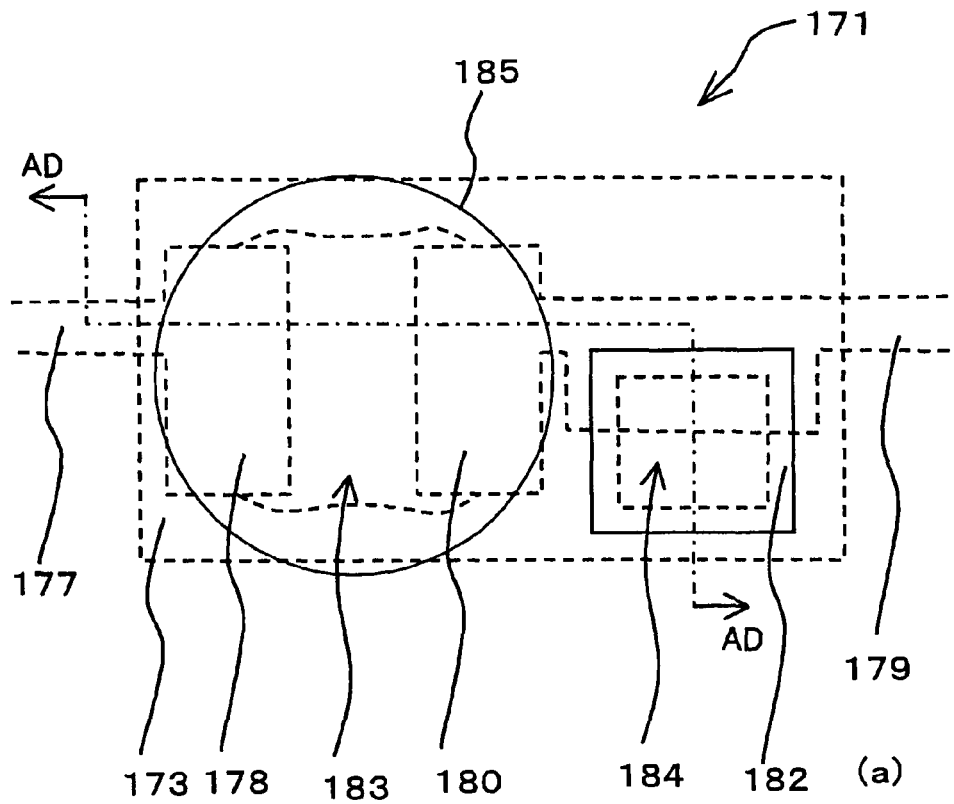
FIG. 43(a) is a planar view schematically showing the diode and a configuration near the diode according to Embodiment 10.
FIG. 43(b) is a cross-sectional view schematically showing the configuration taken along line AD-AD.
Figure 43:
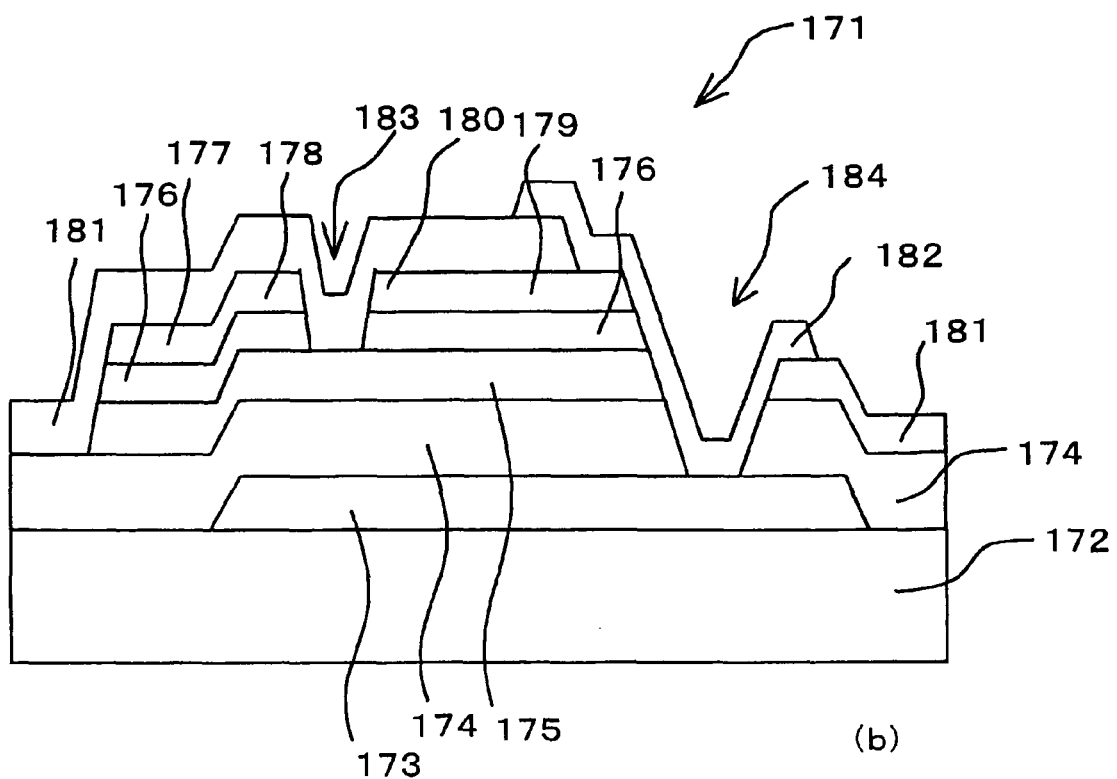
Figure 44:
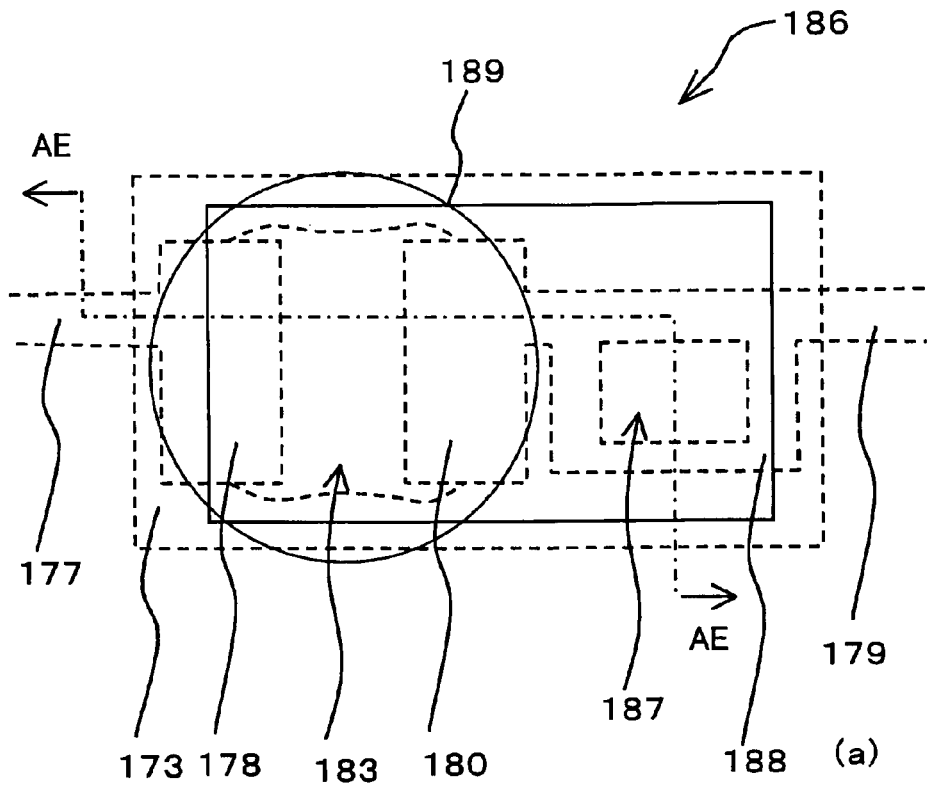
FIG. 44(a) is a planar view schematically showing the diode and a configuration near the diode according to Modified Embodiment of Embodiment 10.
FIG. 44(b) is a cross-sectional view schematically showing the configuration taken along line AE-AE.
Figure 44:
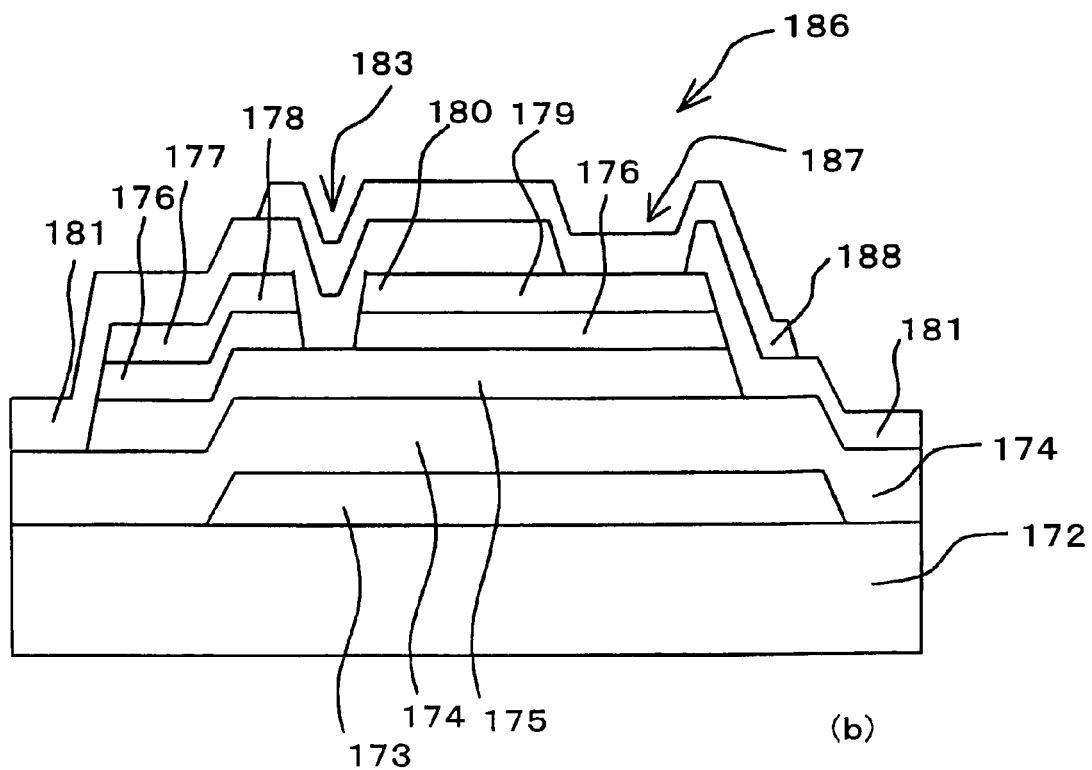
Figures 1, 45:
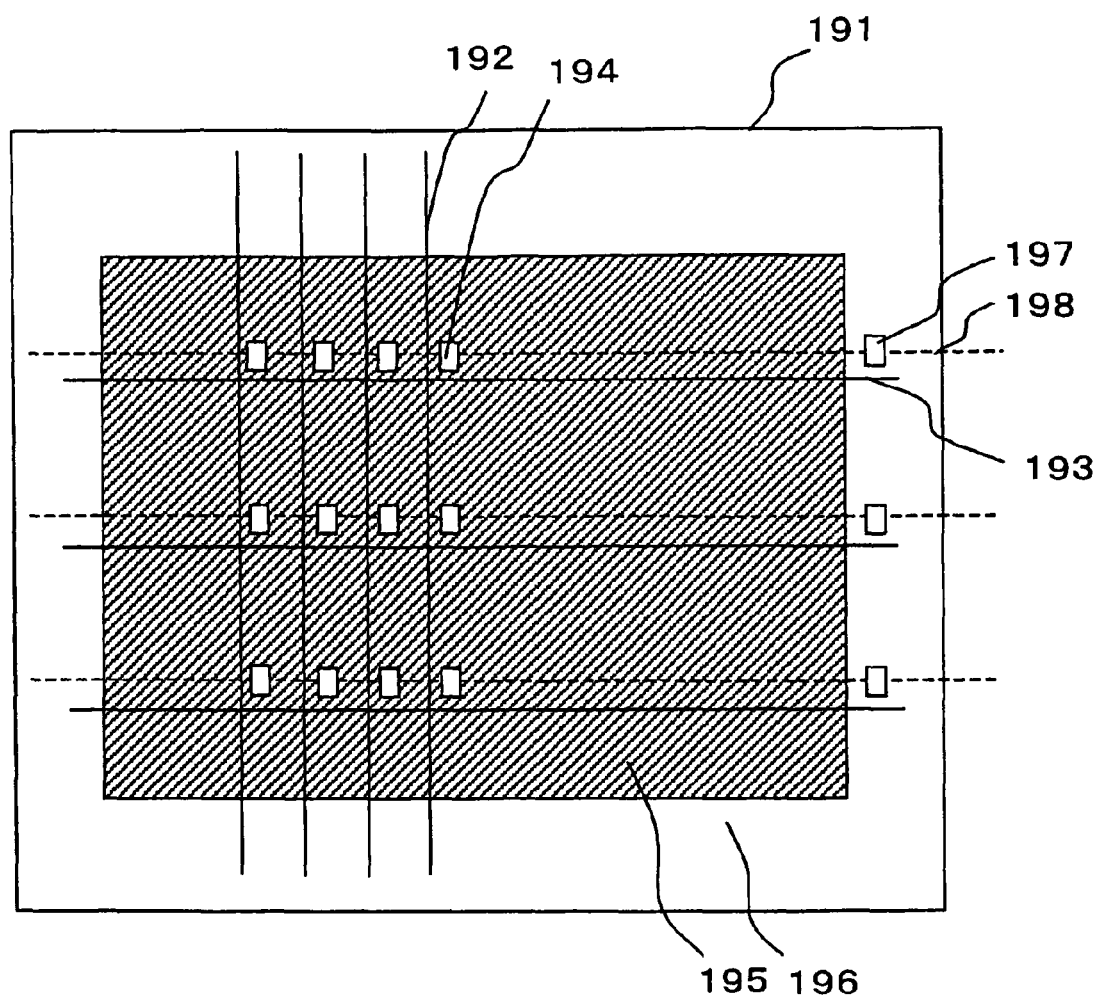
Figures 2, 45:
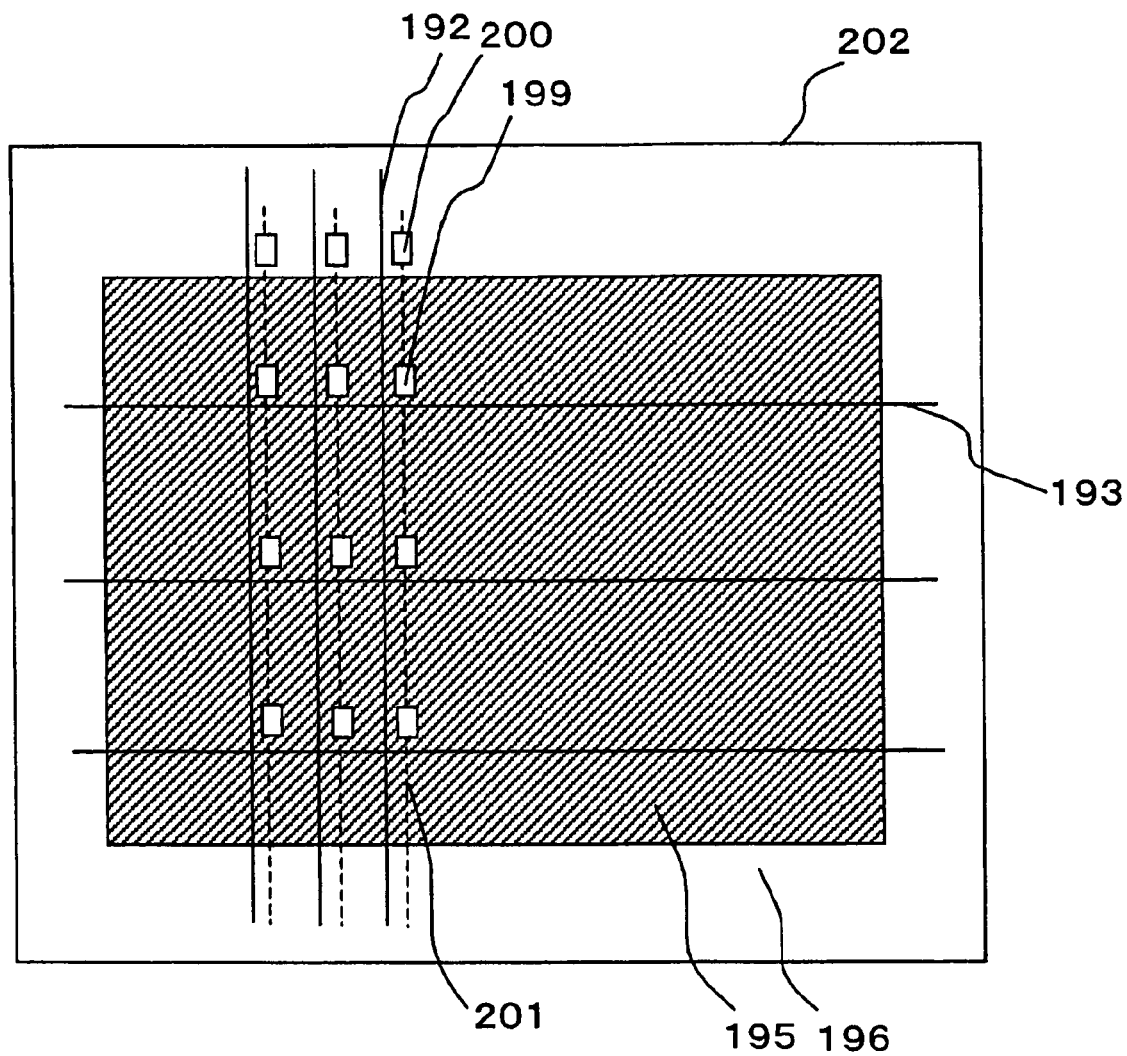
Figures 3, 45:
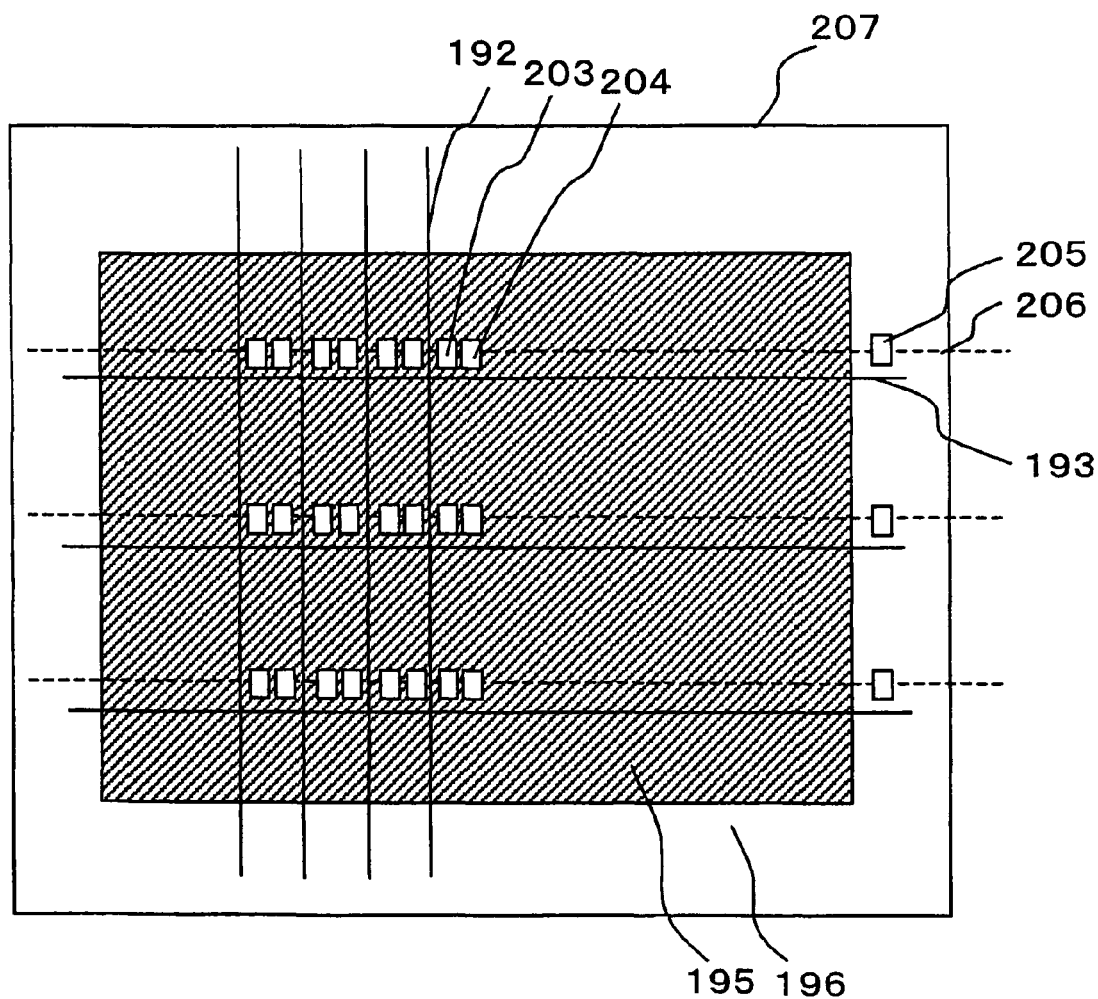
Figures 4, 45:
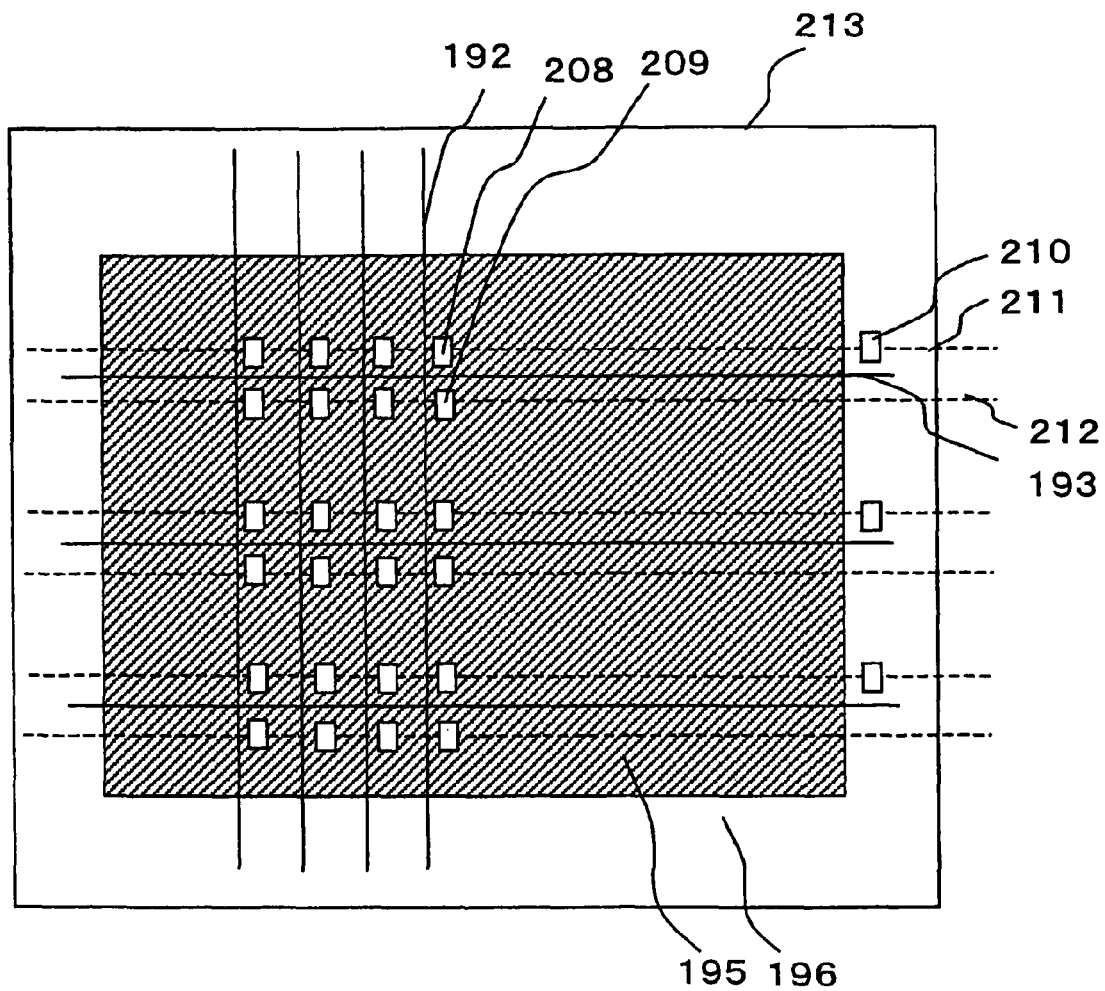
Figures 5, 45:
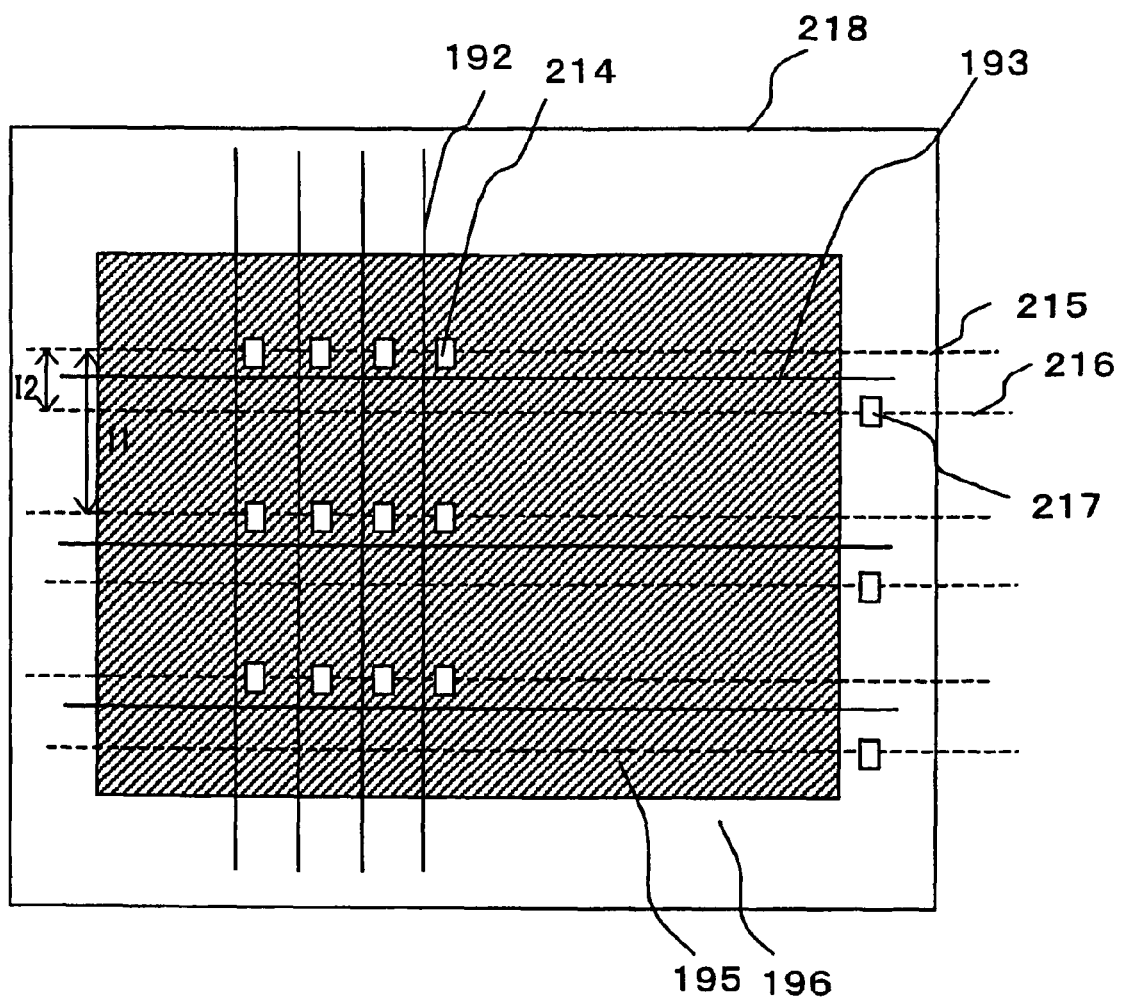
Figure 46:
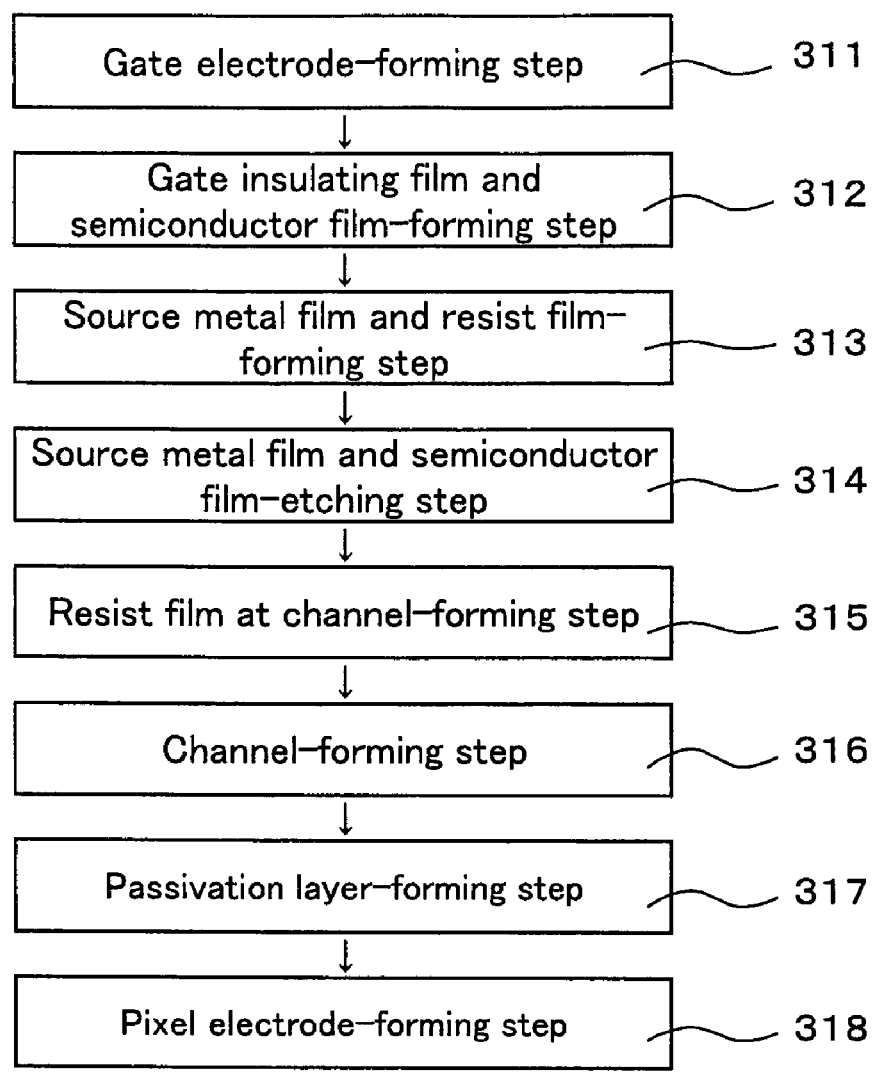
FIG. 46 is a flowchart showing order of the production step of the TFT array substrate (substrate for display device) according to Embodiment 12 of the present invention.

1: Gate electrode-forming step
2: Gate insulating film and semiconductor film-forming step
3: Source metal film and resist film-forming step
4: Source metal film and semiconductor film-etching step
5: Resist film at channel-forming step
6: Channel-forming step
7: TFT
8: Glass substrate
9: Gate wiring
10: Gate electrode
11: Gate insulating film
12: Amorphous silicon layer
13: N$^+$ type amorphous silicon layer
14: Source wiring
15: Source electrode
16: Drain connecting wiring
17: Drain electrode
18: TFT channel
19: Substrate
20: Mounting base
21: Ink-jet head
22: X direction driving part
23: Y direction driving part
24: Ink feed system
25: Control unit
27: Amorphous silicon film
28: N$^+$ type amorphous silicon film
29: Source metal film
30: Resist pattern film
31: TFT gap
32: Resist droplet
33: Resist droplet
34: Both ends of TFT gap
35: Resist pattern film
41: Gate electrode-forming step
42: Gate insulating film and semiconductor film-forming step
43: Resist film for semiconductor film process-forming step
44: Semiconductor island-forming step
45: Source metal film and resist film-forming step
46: Source metal film and semiconductor film-etching step
47: TFT
48: Glass substrate
49: Gate wiring
50: Gate electrode
51: Gate insulating film
52: Amorphous silicon layer
53: N$^+$ type amorphous silicon layer
54: Source wiring
55: Source electrode
56: Drain connecting wiring
57: Drain electrode
58: TFT channel
61: TFT
62: Glass substrate
63: Gate electrode
64: Gate insulating film
65: Amorphous silicon layer
66: Source electrode
67: Drain electrode
68: N$^+$ amorphous silicon layer
69: Shaded region
70: TFT
71: Amorphous silicon layer
72: Shaded region
73: N$^+$ type amorphous silicon layer
74: Resist pattern film
75: Resist pattern film
76: Lyophilic or lyophobic film
81: Source metal film and semiconductor film-etching step
82: Resist film at channel-forming step
83: Channel-forming step
84: Resist pattern film
91: Source metal film and semiconductor film-etching and passivation film-forming step
92: Resist film at channel-forming step
93: Channel-forming step
94: TFT
95: TFT channel
96: Passivation layer
97: Silicon nitride film (passivation film)
98: TFT gap
99: Resist pattern film
101: Resist film at channel-forming step
102: Source metal film and semiconductor film-etching step
103: Resist film at channel-removing step
104: Channel-processing step
105: TFT gap
106: Resist pattern film
111: Source metal film and semiconductor film-etching step
112: Resist film at channel-forming step
113: Channel-forming step
114: Solvent droplet
115: Resist pattern film
116: Resist pattern film
121: TFT
122: Drain electrode
123: TFT
124: Drain electrode
125: TFT
126: Drain electrode 127: Source electrode
128: TFT
129: Drain electrode
130: Source electrode
131: TFT
132: Drain electrode
133: Source electrode
141: End of TFT channel 18
142: End of TFT channel 18
143: Corner of source electrode 15
144: Corner of drain electrode 17
145: Corner of source electrode 15
146: Corner of drain electrode 17
147: TFT
148: Source wiring
149: Source electrode
150: Drain connecting wiring
151: Drain electrode
152: TFT channel
153: End of TFT channel 152
154: End of TFT channel 152
155: Corner of source electrode 149
156: Corner of drain electrode 151
157: Corner of source electrode 149
158: TFT
159: TFT channel
160: Region
171: Diode
172: Glass substrate
173: Gate electrode
174: Gate insulating film
175: Amorphous silicone layer
176: N$^+$ type amorphous silicone layer
177: Connecting wiring
178: Drain electrode
179: Connecting wiring
180: Source electrode
181: Passivation film
182: Conductive film for connection
183: Channel
184: Contact part
185: TFT
186: Diode
187: Contact
188: Conductive film for connection
189: TFT
191: Active matrix substrate
192: Source wiring
193: Gate wiring
194: TFT
195: Effective region (shaded portion)
196: Peripheral region
197: Diode
198: Group of straight lines
199: TFT
200: Diode
201: Group of straight lines
202: Active matrix substrate
203: TFT
204: TFT
205: Diode
206: Group of straight lines
207: Active matrix substrate
208: TFT
209: TFT
210: Diode
211: First group of equally spaced straight lines
212: Second group of equally spaced straight lines
213: Active matrix substrate
214: TFT
215: Third group of equally spaced straight lines
216: Fourth group of equally spaced straight lines
217: Diode
218: Active matrix substrate
301: Channel resist film-forming step
302: TFT
303: Gate electrode
304: TFT channel
305: Both ends of TFT channel
306: Region exposed to diffracted light due to back surface exposure
307: Resist pattern film
311: Gate electrode-forming step
312: Gate insulating film and semiconductor film-forming step
313: Source metal film and resist film-forming step
314: Source metal film and semiconductor film-etching step
315: Channel resist film-forming step
316: Channel-forming step
317: Passivation layer-forming step
318: Pixel electrode-forming step

The invention claimed is:

1. A production method of a pattern thin film, comprising the steps of:
    forming a first resist pattern film on a thin film formed on a substrate;
    removing a part of the thin film using the first resist pattern film;
    forming a second resist pattern film by applying a fluid resist material on a groove of a bank pattern in the first resist pattern film; and
    patterning the thin film using at least the second resist pattern film.

2. The production method of the pattern thin film according to claim 1,
    wherein the bank pattern has an open end.

3. The production method of the pattern thin film according to claim 1,
    wherein the thin film formed on the substrate includes two or more layers.

4. The production method of the pattern thin film according to claim 1,
    wherein in the step of forming the first resist pattern film, a resist material having photosensitivity is used and exposure is performed using a photomask.

5. The production method of the pattern thin film according to claim 1, comprising a plasma surface treatment step between the step of forming the first resist pattern film and the step of forming the second resist pattern film.

6. The production method of the pattern thin film according to claim 5,
    wherein the plasma surface treatment step is performed in fluorine gas plasma.

7. The production method of the pattern thin film according to claim 1, comprising a step of patterning the thin film using the first resist pattern film between the step of forming the first resist pattern film and the step of forming the second resist pattern film.

8. The production method of the pattern thin film according to claim 7,
    wherein the step of patterning the thin film using the first resist pattern film is performed by a dry-etching method.

9. The production method of the pattern thin film according to claim 7, comprising a step of removing the first resist pattern film between the step of patterning the thin film using the first resist pattern film and the step of forming the second resist pattern film.

10. The production method of the pattern thin film according to claim 1, further comprising the steps of
after the step of forming the first resist pattern film and the step of forming the second resist pattern film, patterning the thin film using the first resist pattern film and the second resist pattern film; and
removing the second resist pattern film.

11. The production method of the pattern thin film according to claim 1,
wherein in the step of forming the second resist pattern film, the fluid resist material is applied using an application device including a multi-nozzle injection head and a substrate stage.

12. The production method of the pattern thin film according to claim 11,
wherein the application device is an ink-jet device.

13. The production method of the pattern thin film according to claim 12,
wherein the fluid resist material contains at least one ether, ester, diester, and/or ether ester selected from the group consisting of an ethylene glycol, a diethylene glycol, a triethylene glycol, a polyethylene glycol, a propylene glycol, a dipropylene glycol, a tripropylene glycol, a polypropylene glycol, and a butylene glycol, or a hydrocarbon, having a boiling point of 180° C. or more at 1 atmosphere.

14. The production method of the pattern thin film according to claim 13,
wherein the fluid resist material contains novolak resin.

15. The production method of the pattern thin film according to claim 12,
wherein the fluid resist material contains novolak resin, and at least one ether, ester, diester, and/or ether ester selected from the group consisting of an ethylene glycol, a diethylene glycol, a triethylene glycol, a polyethylene glycol, a propylene glycol, a dipropylene glycol, a tripropylene glycol, a polypropylene glycol, and a butylene glycol, or a hydrocarbon.

16. The production method according to claim 1, wherein a semiconductor layer, a source electrode, and a drain electrode are formed by patterning a semiconductor film and a metal film formed on the substrate.

17. A production method of a pattern thin film, comprising:
forming a first resist pattern film on a thin film formed on a substrate wherein the first resist pattern film creates a bank pattern;
forming a second resist pattern film distinct from the first resist pattern film by applying a fluid resist material in a through of the bank pattern of the first resist pattern film;
reshaping the second resist pattern to form a substantially concave film surface within the trough; and
patterning the thin film using at least the reshaped second resist pattern film.

* * * * *